(12) United States Patent
Nishi et al.

(10) Patent No.: US 7,068,350 B2
(45) Date of Patent: Jun. 27, 2006

(54) EXPOSURE APPARATUS AND STAGE DEVICE, AND DEVICE MANUFACTURING METHOD

(75) Inventors: Kenji Nishi, Yokohama (JP); Masahiko Okumura, Tokyo-To (JP); Hiroki Okuno, Fukaya (JP)

(73) Assignee: Nikon Corporation, Tokyo (JP)

(*) Notice: Subject to any disclaimer, the term of this patent is extended or adjusted under 35 U.S.C. 154(b) by 0 days.

(21) Appl. No.: 10/456,485

(22) Filed: Jun. 9, 2003

(65) Prior Publication Data
US 2005/0024610 A1 Feb. 3, 2005

(30) Foreign Application Priority Data
Jun. 10, 2002 (JP) ............................. 2002-167998
Jun. 3, 2003 (JP) ............................. 2003-157410

(51) Int. Cl.
*G03B 27/42* (2006.01)
*G03B 27/62* (2006.01)

(52) U.S. Cl. .......................................... 355/53; 355/75
(58) Field of Classification Search .................. 355/53, 355/75, 77, 72; 318/569; 356/399, 400, 356/401
See application file for complete search history.

(56) References Cited

U.S. PATENT DOCUMENTS 6,285,438 B1 9/2001 Hazelton et al.
6,320,345 B1 11/2001 Yuan et al.
6,331,885 B1 12/2001 Nishi
2002/0001915 A1 1/2002 Akimoto
2002/0024646 A1* 2/2002 Hiura ........................ 355/53
2002/0051125 A1* 5/2002 Suzuki ....................... 355/53

FOREIGN PATENT DOCUMENTS

| EP | 0 785 571 B1 | 7/1997 |
| JP | 11-345764 | 12/1999 |
| JP | 2001-230183 | 8/2001 |
| WO | WO 01/40875 A1 | 6/2001 |

\* cited by examiner

*Primary Examiner*—Peter B. Kim
(74) *Attorney, Agent, or Firm*—Oblon, Spivak, McClelland, Maier & Neustadt, P.C.

(57) ABSTRACT

After exposure of a divided area on a wafer is completed, for exposure of the next divided area, a control unit sends configuration information on control parameters necessary to expose the next divided area to a stage control system, sometimes before the stage control system begins deceleration of a reticle stage and a wafer stage in a scanning direction. Therefore, both stages do not have to be suspended before acceleration for the stage control system to receive the configuration information on control parameters necessary to expose the next divided area, and since suspension time is not required, throughput can be improved. In this case, no serious problems occur, so the performance of other devices is not disturbed.

14 Claims, 16 Drawing Sheets

EXPOSURE APPARATUS AND STAGE DEVICE, AND DEVICE MANUFACTURING METHOD

BACKGROUND OF THE INVENTION

1. Field of the Invention

The present invention relates to an exposure apparatus and a stage device, and a device manufacturing method, and more particularly to an exposure apparatus that is used in a lithographic process when manufacturing electronic devices such as semiconductors and liquid crystal displays and a stage device comprising a stage that moves two dimensionally while holding an object subject to exposure by the exposure apparatus, and a device manufacturing method using the exposure apparatus.

2. Description of the Related Art

At semiconductor manufacturing sites, conventionally, reduction projection exposure apparatus, or the so-called steppers, which use an i-line of a mercury lamp having a wavelength of 365 nm as an illumination light, were used to mass produce circuit devices (such as a 64M(Mega)bit D-RAM) that have a minimum line width of around 0.3 to 0.35 µm. Then, to cope with higher integration of semiconductor devices, exposure apparatus that have a higher resolution have been developed and put to practice. At present, a scanning type exposure apparatus based on a step-and-scan method (referred to as a scanner, or a scanning stepper) that repeatedly performs scanning exposure operations and stepping operations is being widely used. Such a scanning type exposure apparatus uses an ultraviolet pulse laser light having a wavelength of 248 nm from a KrF excimer laser or an ultraviolet pulse laser light having a wavelength of 193 nm from an ArF excimer laser as the illumination light, and by linearly scanning a mask or a reticle on which a circuit pattern is formed (hereinafter generally referred to as a "reticle") and a wafer serving as a photosensitive object relatively with respect to a projection field of a reduction projection optical system, the exposure apparatus transfers the entire circuit pattern of the reticle onto a shot area on the wafer. With such a scanning stepper, circuit devices which degree of integration are in the 256 Mbit D-RAM class and have a minimum line width of 0.25 µm can be mass produced. Furthermore, exposure apparatus for mass producing circuit devices in the next generation that are 1G(Giga)bit and over are currently being developed.

With the scanning exposure apparatus based on the step-and-scan method, when a pattern of the reticle is sequentially transferred on a plurality of shot areas on the wafer (hereinafter referred to as "shot" as appropriate), in order to improve throughput, the reticle is normally alternately scanned (reciprocally scanned) so as to perform exposure of the following shot. Therefore, when the reticle pattern has been transferred onto a shot, the reticle has to be brought back to the starting position for scanning exposure of the following shot (overscan). In this operation, the reticle is moved further from the point where exposure has been completed by an amount equal to the moving length during prescan (acceleration time to reach a target velocity (scanning velocity during exposure)+settling time of the velocity focusing within a predetermined error range after acceleration is completed) before exposure begins, and corresponding to such an operation, the wafer has to be moved in the scanning direction in addition to the stepping operation for moving the wafer to the next shot (a different shot adjacent to the above shot in the non-scanning direction).

Such stepping operation between shots was conventionally performed in the following procedure, from (1) through (3):

(1) When exposure has been completed, a wafer stage (substrate stage) is temporarily moved to the same coordinate position in the scanning direction as the starting position for scanning exposure of the following shot.
(2) The wafer stage is stepped in the non-scanning direction to the starting position for exposure of the following shot.
(3) The wafer stage begins scanning for exposure of the following shot. Accordingly, the wafer was substantially moved along a path that resembled the letter U. One of the reasons for employing such a path was because in between the above operations (1) and (2), or (2) and (3), or during the above operation (2), control information (including information for setting control parameters) necessary for exposing the following shot was sent from an upper unit to a stage control unit (including a synchronous control unit) that controls the stage. The above control information includes, for example, information related to position control of the reticle stage and wafer stage such as set values of EGA parameters (offsets Ox and Oy of a wafer in an X-direction and a Y-direction, an orthogonality error w of a stage coordinate system that specifies the movement of a wafer, rotation error θ of a wafer, magnification (scaling) errors rx and ry of a wafer in the X and Y directions) obtained by wafer alignment based on an EGA method performed prior to exposure (such values will be data used when setting the position of the wafer on exposure), correction parameter related to the position of both stages during exposure (such as bend information of movable mirrors on the reticle stage side or the wafer stage side), data related to dose control such as data on pulse energy density of the excimer laser and the number of pulse emission, and furthermore, data related to the exposure sequence set. In addition, in some cases the information may include error information of each mechanism while the stage is being moved.

For an exposure apparatus, improving throughput is one of the most important issues, and in order to achieve such a goal, the acceleration-deceleration speed of the reticle as well as the maximum speed during scanning exposure is increasing, as in for example, 0.5 G to 4 G and 350 mm/s to 1500 mm/s, respectively. With this increase, the acceleration-deceleration speed and the maximum speed of the wafer stage during scanning exposure also becomes a value corresponding to the projection magnification. Therefore, the moving length during prescan and overscan required before and after exposure also has to be extended, according to such increase.

Therefore, although the acceleration-deceleration speed and the maximum speed were originally increased from the viewpoint of improving the throughput, there were concerns that the throughput would actually decrease in the long run.

Under such circumstances, requirements for developing a new exposure apparatus that can improve throughput while maintaining other performances of the apparatus are pressing.

Improving the throughput is considered possible, by achieving at least either performing the prescan and overscan operations and the stepping operation of the wafer stage in between shots in parallel, or reducing the moving length of the wafer stage.

However, when the sequence of the above parallel processing or a movement path that reduces the moving length is employed without careful consideration, synchronous accuracy of the reticle stage and wafer stage may decrease and exposure with sufficient accuracy may become difficult, or the time required for synchronous settling of both stages before exposure may increase, or transmitting the control information referred to earlier may prove to be difficult.

SUMMARY OF THE INVENTION

The present invention was made under such circumstances, and has as its first object to provide an exposure apparatus that can improve throughput without disturbing the performance of other devices.

Also, the second object of the present invention is to provide a stage device that can improve throughput and is capable of suppressing the power consumed by its drive system.

Furthermore, the third object of the present invention is to provide a device manufacturing method to improve the productivity of the devices.

According to the first aspect of the present invention, there is provided a first exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; a stage control system that controls both the mask and the object stages; and a control unit that sends configuration information of various types to the stage control system after exposure of a divided area is completed at the latest, sometime before said stage control system begins deceleration of both stages in the scanning direction for exposure of a next divided area, the configuration information being control parameters necessary for exposing at least the next divided area.

With this apparatus, when exposure of a divided area on an object is completed, in order to expose the next divided area, the control unit sends configuration information on control parameters necessary to expose at least the next divided area to the stage control unit sometime before the stage control unit begins deceleration of both stages (the mask stage and the object stage) in the scanning direction. Therefore, a control sequence of both stages by the stage control system that does not suspend the operation of both stages during the period after exposure of a divided area on the object is completed to the synchronous settling period of both stages for exposure of the next divided area can be employed. That is, since the stage control system receives the configuration information on control parameters necessary to expose the next divided area from an upper unit, both stages do not have to be suspended before acceleration, and because there is no suspension time, the throughput can be improved. In this case, no serious problems occur, so the performance of other devices is not disturbed. In addition, in this case, the stage control system can also start the synchronous control operation of both stages from the above acceleration in the scanning direction.

In this case, the control unit can send the configuration information to the stage control unit even when the divided area is being exposed.

In this case, when the control unit sends the configuration information from when the divided area is being exposed, the configuration information can be control parameters necessary for a plurality of divided areas that are next and from then onward.

With the first exposure apparatus in the present invention, the stage control system can completes position setting of both stages according to the configuration information before a synchronous settling period of both stages prior to exposure of the next divided area. In such a case, the above settling time of the synchronous settling of both stages prior to exposure can be reduced, which can allows further improvement in the throughput.

With the first exposure apparatus in the present invention, on movement in between divided areas in the same row in a non-scanning direction perpendicular to the scanning direction, the stage control system can secure a post-settling period where both stages are moved in uniform velocity in the scanning direction after exposure is completed on a divided area, before beginning deceleration after the exposure is completed, whereas on movement between different rows, the stage control system can begin deceleration operation of both stages as soon as exposure is completed on a divided area.

According to the second aspect of the present invention, there is provided a second exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; a stage control system that controls both the mask and the object stages; and a control unit that sends configuration information of various types to the stage control system after exposure of a last divided area in any row in a non-scanning direction perpendicular to the scanning direction on the object is completed in order to expose a first divided area in a different row, while the stage control system performs movement control of both stages, the configuration information being control parameters necessary for exposing a plurality of divided areas in the different row.

The term "movement control of both stages" is a concept that includes suspension control of at least one of the stages.

With this apparatus, after exposure of a last divided area in one of the rows in the non-scanning direction on the object is completed, in order to expose the first divided area on a different row the control unit sends configuration information to the stage control unit on control parameters necessary to expose the plurality of divided areas, while the stage control unit performs the movement control of both stages. Therefore, even when the time from completing exposure of a divided area on the object described above to beginning the deceleration of both stages is short and transmitting the configuration information on control parameters necessary to expose the next divided area is difficult, a control sequence of both stages by the stage control system that does not suspend the operation of both stages during the period after exposure of a divided area on the object is completed to the synchronous settling period of both stages for exposure of the next divided area can be employed. Accordingly, both stages do not have to be suspended before acceleration, and because there is no suspension time, the throughput can be improved. In this case, no serious problems occur, so the performance of other devices is not disturbed. Also, in this case, the stage control system can also start the synchronous control operation of both stages from the above acceleration in the scanning direction.

In this case, the stage control system can complete position setting of both stages according to the configuration information before a synchronous settling period of both stages prior to exposure on each divided area in the different row. In such a case, the settling time on synchronous settling of both stages prior to exposure in each divided area in the next row can be reduced, which allows further improvement in the throughput.

According to the third aspect of the present invention, there is provided a third exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; a stage control system that controls both the mask and the object stages; and a control unit that sends configuration information of various types to the stage control system after detection operation of arrangement information used for alignment with predetermined points in each divided area on the object is completed sometime before exposure of a first divided area begins, the configuration information being control parameters necessary for exposing all of the plurality of divided areas on the object.

With this apparatus, after the detection operation of the arrangement information used for alignment with predetermined points on each divided area on the object is completed, the control unit sends configuration information to the stage control unit on control parameters necessary to expose all of the plurality of divided areas on the object sometime before exposure of the first divided area begins. Therefore, during the exposure process after exposure of the first divided area begins, the transmission process of the configuration information on control parameters referred to earlier will not be required, a control sequence of both stages by the stage control system that that does not suspend the operation of both stages during the period after exposure of a first divided area on the object begins to the end of exposure of the last divided area can be employed. Accordingly, the throughput can be improved. In this case, no serious problems occur, so the performance of other devices is not disturbed.

In this case, the stage control system can complete position setting of both stages according to the configuration information before a synchronous settling period of both stages prior to exposure on each divided area on the object. In such a case, the settling time on synchronous settling of both stages prior to exposure in each divided area on the object can be reduced, which allows further improvement in the throughput.

In each of the above first to third exposure apparatus, the control parameters can include parameters related to an arrangement of the divided areas measured prior to exposure, and the configuration information can includes information that takes into account a correction value of a movement amount in between divided areas, which occurs due to an arrangement error of divided areas to a predetermined stage coordinate system.

In this case, the arrangement error of the divided areas can include at least one of a rotational error of the object, an orthogonality error of a stage coordinate system that specifies the movement of the object, an offset of the object in the stage coordinate system, and a scaling error of the object.

Furthermore, in each of the above first to third exposure apparatus in the present invention, the stage control system can control both stages based on instruction values according to a jerk curve, which is an inverse curve of polarized symbols, when a preliminary operation where both stages are accelerated after deceleration in the scanning direction is performed in between divided areas in the same row in a non-scanning direction perpendicular to the scanning direction.

In this case, the stage control system can control the object stage based on instruction values according to a jerk curve, which is a quadrupoled jerk curve, when a movement operation of both stages in the scanning direction is performed in between divided areas of different rows in the non-scanning direction, or the stage control system can perform a movement operation in between divided areas where the object stage is moved in the non-scanning direction based on instruction values according to a jerk curve, which is quadrupoled jerk having at least two poles that are shaped differently, in parallel with the preliminary operation of both stages in the scanning direction in between the divided areas.

According to the fourth aspect of the present invention, there is provided a fourth exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; and a stage control system that controls both the mask and the object stages, and begins synchronous control of both stages for exposure of a next divided area when both stages are decelerated in the scanning direction, after exposure of a divided area on the object is completed.

With this apparatus, when the stage control system controlling both stages decelerates both stages in the scanning direction after exposure of a divided area on the object is completed, it also begins synchronous control of both stages in order to expose the next divided area. Therefore, the synchronous settling of both stages prior to exposure is completed at an earlier timing than, for example, when synchronous control begins immediately after the deceleration of both stages is completed, and the throughput can be improved due to the reduction in synchronous settling time. In this case, no serious problems occur, so the performance of other devices is not disturbed.

According to the fifth aspect of the present invention, there is provided a fifth exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; and a stage control system that controls both the mask and the object stages, the stage control system controlling both stages based on instruction values according to a jerk curve, which is an inverse curve of polarized symbols, when a preliminary operation where both stages are accelerated after deceleration in the scanning direction is performed in between divided areas in the same row in a non-scanning direction perpendicular to the scanning direction.

With this apparatus, when a preliminary operation where both stages are accelerated after deceleration in the scanning direction is performed in between divided areas in the same row in a non-scanning direction perpendicular to the scanning direction, the stage control system controls both stages based on instruction values according to a jerk curve, which is an inverse curve of polarized symbols. More particularly, the acceleration curve of the object stage (and the mask stage) in this case is in a trapezoidal shape, therefore, the change in velocity becomes constant with no intervals of zero velocity, and furthermore, the so-called alternate scanning becomes possible, which makes it possible to reduce the time required for the preliminary operation described earlier. In addition, in this case, because the peak of the jerk curve (the maximum value of the absolute value of a jerk, which is the temporal change rate of acceleration) can be suppressed, the ratio of the maximum acceleration to the average value of acceleration of the object stage can be reduced, as well as the sudden change in acceleration and its frequency being suppressed. Accordingly, throughput can be improved, and the power consumed by the drive system of the object stage (and the mask stage) such as the linear motor can be suppressed. In this case, no serious problems occur, so the performance of other devices is not disturbed.

In this case, the jerk curve can be an inverse curve of polarized symbols having different shapes.

In this case, the stage control system can set a post-settling period where both stages are moved in uniform velocity in the scanning direction after exposure is completed on a divided area until the deceleration begins, longer than a synchronous settling period of both stages prior to exposure, and can also set a peak of the jerk curve after completing exposure of a divided area larger than a peak of the jerk curve prior to exposure. In such a case, the acceleration completing position of both stages can be made to coincide with a predetermined target position, and control delay at the acceleration completing position and the synchronous error of both stages due to such control delay can be suppressed, allowing the synchronous settling time prior to exposure to be reduced.

With the fifth exposure apparatus in the present invention, the jerk curve, which is an inverse curve of polarized symbols, can have the same shape.

With the fifth exposure apparatus in the present invention, the stage control system can control the object stage based on instruction values according to a jerk curve, which is a quadrupoled jerk curve, when a movement operation of both stages in the scanning direction is performed in between divided areas of different rows in the non-scanning direction.

In this case, the quadrupoled jerk curve can have at least two poles that are shaped differently.

With the fifth exposure apparatus in the present invention, the stage control system can perform a movement operation in between divided areas where the object stage is moved in the non-scanning direction based on instruction values according to a jerk curve, which is a quadrupoled jerk having at least two poles that are shaped differently, in parallel with the preliminary operation of both stages in the scanning direction in between the divided areas.

According to the sixth aspect of the present invention, there is provided a sixth exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; and a stage control system that controls both the mask and the object stages, and on movement in between divided areas in the same row in a non-scanning direction perpendicular to the scanning direction, the stage control system secures a post-settling period where both stages are moved in uniform velocity in the scanning direction after exposure is completed on a divided area, before beginning deceleration after the exposure is completed, whereas on movement between different rows, the stage control system begins deceleration operation of both stages as soon as exposure is completed on a divided area.

With this apparatus, in between divided areas in the same row in a non-scanning direction perpendicular to the scanning direction, the stage control system secures a post-settling period where both stages are moved in uniform velocity in the scanning direction after exposure is completed on a divided area, before beginning deceleration after the exposure is completed, whereas on movement between different rows, the stage control system begins deceleration operation of both stages as soon as exposure is completed on a divided area. Therefore, since there is no post-settling period on movement between different rows, the throughput can be improved. In this case, no serious problems occur, so the performance of other devices is not disturbed.

In each of the above first to sixth exposure apparatus in the present invention, the stage control system can control both stages so that after exposure of a divided area on the object is completed, a preliminary operation where both stages are accelerated in the scanning direction after deceleration and a movement operation in between divided areas where the object stage is moved in a non-scanning direction perpendicular to the scanning direction are simultaneously performed in parallel for exposure of the next divided area, and the movement operation of the object stage in the non-scanning direction is completed before a synchronous settling period of both stages prior to exposure of the next divided area. In such a case, after exposure is completed on a divided area on the object, in order to expose the next divided area, at least a part of the preliminary operation where both stages are accelerated in the scanning direction after deceleration and the movement operation in between divided areas where the object stage is moved in the non-scanning direction can be overlapped. Therefore, the throughput can be improved when compared with the case when the acceleration operation of both stages begins after the movement operation in between divided areas of the object stage in the non-scanning direction is completed. Also, at the point when the preliminary operation of both stages in the scanning direction is completed, the above movement operation in between divided areas of the object stage in the non-scanning direction is already completed, which allows the stage control system to concentrate on the synchronous settling of both stages in the synchronous settling period, which consequently makes it possible to reduce the settling time.

According to the seventh aspect of the present invention, there is provided a seventh exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; two object stages that each hold the object and are movable independently in a two-dimensional plane; and a stage control system that controls the mask stage and the object stages when a predetermined operation is performed on one object stage of the object stages and exposure is performed in parallel on a plurality of divided areas on an object held on the other object stage, the stage control system controlling the mask stage and the other object stage based on instruction values according to a jerk curve, which is an inverse curve of polarized symbols, when a preliminary operation where the mask stage and the other object stage are accelerated after deceleration in the scanning direction is performed in between divided areas in the same row in a non-scanning direction perpendicular to the scanning direction.

With this apparatus, when a predetermined process is performed on one of the object stages while exposure is performed on a plurality of divided areas on the object held on the other object stage, and a preliminary operation is performed by the stage control system where the mask stage and the other object stage are accelerated after deceleration in the scanning direction in between divided areas in the same row in a non-scanning direction perpendicular to the scanning direction, the stage control system controls the stages (the mask stage and the other object stage) based on instruction values according to a jerk curve, which is an inverse curve of polarized symbols. More particularly, the acceleration curve of the other object stage (and the mask stage) in this case is in a trapezoidal shape, therefore, the change in velocity becomes constant with no intervals of zero velocity, and furthermore, the so-called alternate scanning becomes possible, which makes it possible to reduce the time required for the preliminary operation described earlier. In addition, in this case, because the peak of the jerk curve (the maximum value of the absolute value of a jerk, which is the temporal change rate of acceleration) referred to earlier can be suppressed, the ratio of the maximum acceleration to the average value of acceleration of the other object stage can be reduced, as well as the sudden change in acceleration and its frequency being suppressed. In this case, the above one of the object stages and the other object stage can be either of the object stages. Accordingly, by switching the object stages, a similar parallel processing can be performed.

Accordingly, in addition to improving the throughput, and the power consumed by the drive system of each object stage (and the mask stage) such as the linear motor can be suppressed. In this case, no serious problems occur, so the performance of other devices is not disturbed.

In this case, the stage control system can control the other object stage based on instruction values according to a jerk curve, which is a quadrupoled jerk curve, when a movement operation of the mask stage and the other object stage in the scanning direction is performed in between divided areas of different rows in the non-scanning direction.

With the seventh exposure apparatus in the present invention, the stage control system can performs movement operation in between divided areas where the other object stage is moved in the non-scanning direction based on instruction values according to a jerk curve, which is qua-drupoled jerk having at least two poles that are shaped differently, in parallel with the preliminary operation of the mask stage and the other object stage in the scanning direction in between the divided areas.

With the seventh exposure apparatus in the present invention, various types of processing can be considered for the above predetermined process performed on one of the stages in parallel with the exposure operation on the other stage described above. For example, when the exposure apparatus further comprises a mark detection system that detects marks formed on the object, the predetermined process can include a mark detection process of detecting marks formed on an object mounted on the one object stage with the mark detection system.

According to the eighth aspect of the present invention, there is provided an eighth exposure apparatus that sequentially transfers a pattern of a mask onto a plurality of divided areas on an object by synchronously moving the mask and the object in a predetermined scanning direction, the exposure apparatus comprising:

a mask stage that holds the mask and is movable in at least the scanning direction; an object stage that holds the object and is movable in a two-dimensional plane; and a stage control system that controls the object stages, whereby on movement in between divided areas in the same row in a non-scanning direction perpendicular to the scanning direction, the control system makes the object stage begin a simultaneous parallel movement operation of movement operation in the scanning direction and movement operation in the non-scanning direction, during a post-settling period where both stages are moved in uniform velocity in the scanning direction after exposure is completed on a divided area.

With this apparatus, in between divided areas in the same row in the non-scanning direction, the stage control system controls the object stage so that it begins a simultaneous parallel movement operation of movement operation in the scanning direction and movement operation in the non-scanning direction during a post-settling period (uniform velocity overscan) where both stages are moved in uniform velocity in the scanning direction after exposure is completed on a divided area, which allows the stage control system to complete the acceleration/deceleration control in the non-scanning ahead of time by just the post-settling period (uniform velocity overscan). This allows the stepping in the non-scanning direction to be completed prior to the beginning of synchronous control in the scanning direction for exposure of the next divided area, which in turn allows the stage control system to concentrate on the synchronous control in the scanning direction during the synchronous settling time (pre-settling time) for exposure on the next divided area. In addition, because there is hardly any influence of deceleration in the non-scanning direction on the synchronous control, the uniform velocity overscan (post-settling time) can also be reduced, according to the reduction in the synchronous settling time. Accordingly, throughput can be improved. In this case, no serious problems occur, so the performance of other devices is not disturbed.

In this case, the stage control system can make the object stage perform the simultaneous parallel movement operation until a synchronous settling period of both stages begins prior to exposure of the next divided area.

In this case, the stage control system can control the object stage so as to complete the movement operation in the non-scanning operation before a synchronous settling period begins.

In this case, the stage control system can make the object stage start the simultaneous parallel movement operation as soon as exposure is completed on the divided area.

According to the ninth aspect of the present invention, there is provided a stage device, comprising: a stage that holds an object and is movable within a two-dimensional plane; and a stage control system which controls the stage so that a first axis direction movement operation where the stage is accelerated after deceleration in a predetermined first axis direction and a second axis direction movement operation where the stage is moved in a second axis direction perpendicular to the first axis direction are simultaneously performed in parallel, and also controls the stage based on instruction values according to a jerk curve, which is an inverse curve of polarized symbols, on the first axis direction movement operation.

With this stage device, the stage control system simultaneously performs in parallel the first axis direction movement operation where the stage is accelerated after deceleration in the first axis direction and the second axis direction movement operation where the stage is moved in a second axis direction perpendicular to the first axis direction, and the stage moves along a U-shaped or a V-shaped locus. On the first axis direction movement operation, the stage is controlled based on instruction values according to a jerk curve, which is an inverse curve of polarized symbols. The acceleration curve of the stage in this case, is in a trapezoidal shape; therefore, the change in velocity becomes constant with no intervals of zero velocity, which makes it possible to reduce the time required for the first axis direction movement operation. In addition, in this case, because the peak of the jerk curve can be suppressed, the ratio of the maximum acceleration to the average value of acceleration of the stage can be reduced, as well as the sudden change in acceleration and its frequency being suppressed. Accordingly, throughput can be improved, and the power consumed by the drive system of the stage such as the linear motor can be suppressed.

In this case, the stage control system can control the stage based on instruction values according to a jerk curve, which is a quadrupoled jerk having at least two poles that are shaped differently.

In addition, in a lithographic process, by performing exposure using any one of the first to eighth exposure apparatus in the present invention, a pattern of a mask can be transferred to each divided area on wafer W with high throughput. As a consequence, the productivity of high integration devices can be improved. Accordingly, further from another aspect, there is provided a device manufacturing method using any one of the first to eighth exposure apparatus in the present invention.

BRIEF DESCRIPTION OF THE DRAWINGS

In the accompanying drawings.

DETAILED DESCRIPTION OF THE PREFERRED EMBODIMENTS

First Embodiment

Following is a description of a first embodiment related to the present invention, referring to FIGS. 1 to 10(D).

Figure 1:
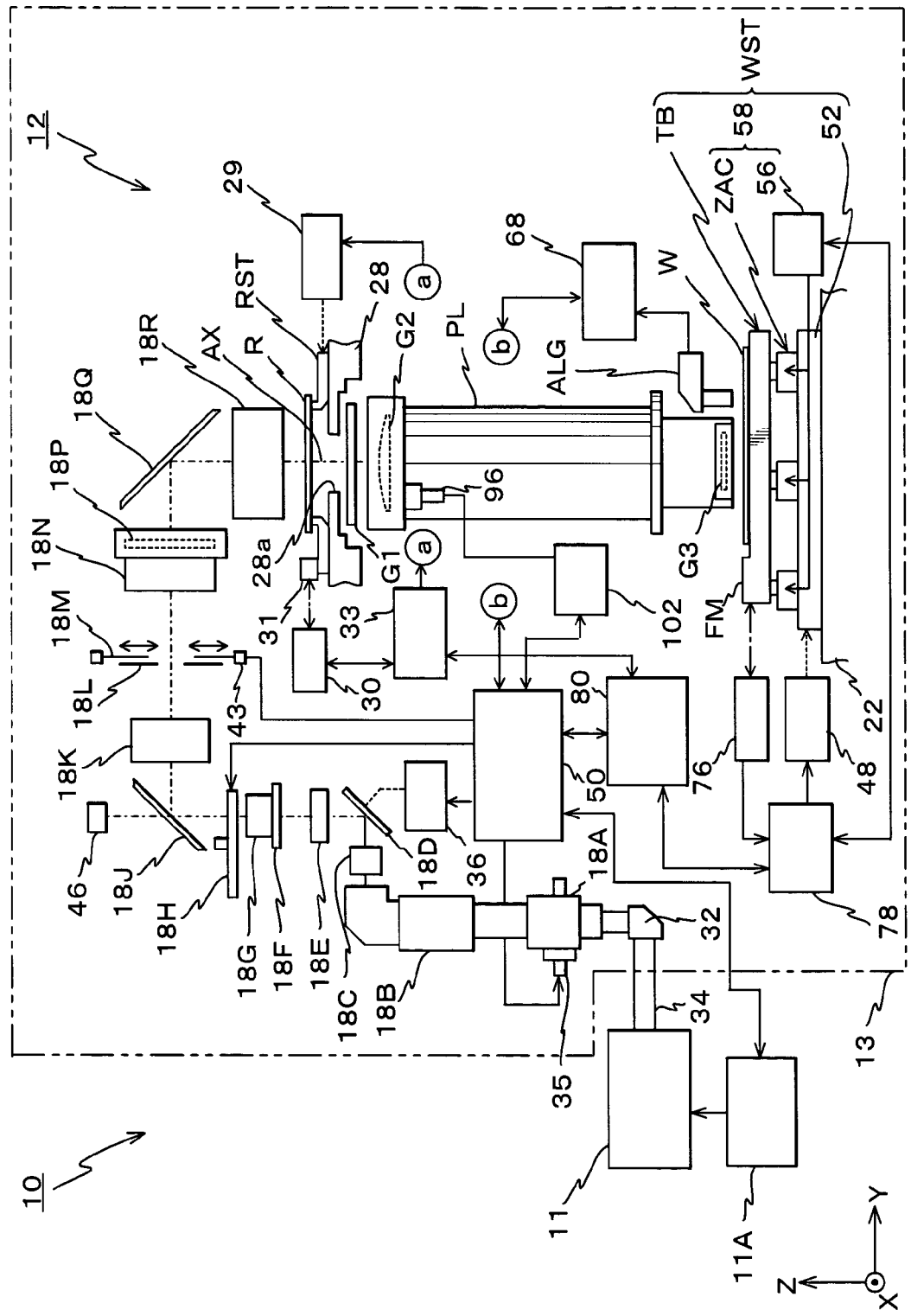
FIG. 1 is a view showing an entire structure of an exposure apparatus in a first embodiment of the present invention.

FIG. 1 shows an entire structure of an exposure apparatus 10 related to the first embodiment of the present invention. Exposure apparatus 10 is a projection exposure apparatus that performs exposure operation based on a step-and-scan method, which is now becoming widely used. In exposure apparatus 10, when a reticle R serving as a mask on which a circuit pattern is formed and a wafer W serving as an object are relatively scanned in a linear direction (in this case, a Y-axis direction which is the lateral direction of the page surface in FIG. 1) with respect to a field of a projection optical system PL, while an image of a part of the circuit pattern formed on reticle R is being projected on wafer W via projection optical system PL, the entire pattern on reticle R is transferred onto each of a plurality of shot areas (hereinafter shortened to "shot" as appropriate) on wafer W, based on a step-and-scan method.

Exposure apparatus 10 comprises a light source 11, an exposure apparatus main body 12, and a control system for these parts.

Light source 11 is an exposure light source, and for example, a pulse laser light source such as a KrF excimer laser that has a wavelength of 248 nm or an ArF excimer laser that has a wavelength of 193 nm is used. The reason for using such a pulse laser beam in the ultraviolet region (hereinafter referred to as an "excimer laser beam", "pulse illumination light", or "pulse ultraviolet light" as appropriate) emitted from light source 11 as the exposure illumination light is because a pattern resolution of around minimum line width 0.25 to 0.10 μm has to be obtained, which is necessary for mass producing microcircuit devices that have a degree of integration and fineness corresponding to semiconductor memory devices (D-RAMs) in the 256M to 4 Gbit class and up. Accordingly, a laser light source that emits a pulse laser beam in the vacuum ultraviolet region such as an $F_2$ laser can also be used as light source 11.

Light source 11 is normally arranged in a different room (a service room having a low degree of cleanliness), isolated from a super clean room where exposure apparatus main body 12 is arranged. In addition, exposure apparatus main body 12 is housed inside an environmental chamber 13 where the dust-proof level is high and the temperature control highly accurate, inside the super clean room.

Light source 11 comprises an operation panel (not shown) and a control computer 11A interfaced with the operation panel. During normal exposure operation, control computer 11A controls the pulse emission of light source 11 according to instructions from a main controller 50, which will be described later in the description.

The wavelength width (spectral line half width) of the pulse laser beam (excimer laser beam) from light source 11 is narrowbanded so that chromatic aberration resulting from various types of refractive optical elements making up an illumination optical system and a projection optical system (to be described later) is within a permissible range. The absolute value of the center wavelength to be narrowbanded and the value of the narrowbanded width (from 0.2 pm to 300 pm) is displayed on the panel, and can be finely adjusted from the operation panel when necessary. In addition, modes of pulse emission (three representative modes: self oscillation, external trigger oscillation, and maintenance oscillation) can be set from the operation panel.

Examples of an exposure apparatus based on a step-and-scan method using an excimer laser light source are disclosed in, for example, Japanese Patent Application Laid-open No. 02-229423 and Japanese Patent Application Laid-open No. 06-132195 and the corresponding U.S. Pat. No. 5,477,304, and Japanese Patent Application Laid-open No. 07-142354 and the corresponding U.S. Pat. No. 5,534,970. Accordingly, the basic technology disclosed in each of the above publications can be applied to exposure apparatus 10 in FIG. 1, with or without any modification. The disclosures of each of the above U.S. Patents are fully incorporated herein by reference.

Exposure apparatus main body 12 comprises the following parts: illumination optical system 18 (18A to 18R), a reticle stage RST, a projection optical system PL, an image forming characteristics correction unit, a stage device, a wafer carriage system, an alignment system, and the like.

Illumination optical system 18 is connected to light source 11 via a light transmitting system, which has an optical system called a BMU (Beam Matching Unit) for optical axis adjustment in a part of its system. As is shown in FIG. 1, the light transmitting system comprises a light-shielding pipe 34 and a beam photodetection system 32. One end of pipe 34 is connected to light source 11, while the other end is arranged entering inside chamber 13 with beam photodetection system 32 connected to its end. Inside beam photodetection system 32, a plurality of movable reflection mirrors (not shown) are provided so as to optimally adjust the incident position and incident angle of the excimer laser beam to the illumination optical system (to be described later), so that the excimer laser beam from light source 11 guided by pipe 34 enters the illumination optical system in a predetermined positional relationship with the optical axis of the illumination optical system at all times.

As is shown in FIG. 1, illumination optical system 18 comprises the following parts: variable attenuator 18A; beam shaping optical system 18B; a first fly-eye lens system 18C; a vibration mirror 18D; a condensing lens system 18E; an illumination NA correction plate 18F; a second fly-eye lens system 18G; an illumination system aperture stop plate 18H; a beam splitter 18J; a first relay lens 18K; a fixed reticle blind 18L; a movable reticle blind 18M; a second relay lens 18N; an illumination telecentric correction plate (an inclinable parallel plate made of quartz) 18P; a mirror 18Q; a main condenser lens system 18R, and the like. Each of the above parts making up illumination optical system 18 will now be described.

Variable attenuator 18A adjusts the average energy of the excimer laser beam per pulse, and as the variable attenuator, for example, a plurality of optical filters having different attenuation ratios can be made switchable to change the attenuation ratio step by step, or the overlapping of two optical filters whose transmittance changes continuously can be adjusted to change the attenuation ratio continuously. The optical filters making up variable attenuator 18A are driven by a drive mechanism 35, which is under the control of main controller 50.

Beam shaping optical system 18B shapes the sectional shape of the excimer laser beam so that it effectively enters the first fly-eye lens system 18C. The excimer laser beam entering the first fly-eye lens system 18C has been adjusted to a predetermined peak-intensity by variable attenuator 18A, and is shaped similar to the entire shape of the entering end of the first fly-eye lens system 18C, which structures the entering end of a double fly-eye lens system (to be described later) provided on the latter end of the optical path of the excimer laser beam. Beam shaping optical system 18B is made up of, for example, parts such as a cylinder lens or a beam expander (none of which are shown).

The double fly-eye lens system makes the intensity distribution of the illumination light uniform, and is made up of the first fly-eye lens system 18C, condenser lens 18E, and the second fly-eye lens system 18G that are sequentially disposed on the optical path of the excimer laser beam after beam shaping optical system 18B. In this case, in between the first fly-eye lens 18C and condenser lens 18E, vibration mirror 18D is disposed in order to smooth the interference fringe or faint speckles occurring on the irradiated surface (the reticle surface or the wafer surface). The vibration (deflection angle) of vibration mirror 18D is under the control of main controller 50, via a drive system 36.

On the entering end side of the second fly-eye lens system 18G, illumination NA correction plate 18F is disposed, which adjusts the direction of numerical apertures (illumination NA difference) on the irradiation surface of the illumination light.

Besides the above Japanese Patent Application Laid-open No. 07-142354 and the corresponding U.S. Pat. No. 5,534,970, details on a structure of the double fly-eye lens system and vibration mirror 18D combined as is described in the embodiment are also disclosed in, for example, Japanese Patent Application Laid-open No. 01-259533 and the corresponding U.S. Pat. No. 5,307,207, and Japanese Patent Application Laid-open No. 01-235289 and the corresponding U.S. Pat. No. 5,307,207. The disclosures of each of the above U.S. Patents are fully incorporated herein by reference.

In the vicinity of the focal point plane on the outgoing side of the second fly-eye lens system 18G, illumination system aperture stop plate 18H made of a circular plate shaped member is disposed. In illumination system aperture stop plate 18H, for example, the following aperture stops are formed spaced substantially apart at an equal angle: a conventional aperture stop made up of a circular aperture; an aperture stop made up of small circular apertures to reduce a σ value, which is a coherence factor; a ring shaped aperture stop for annular illumination; and a modified aperture stop made up of, for example, four apertures arranged eccentrically, for a modified light source method. Illumination system aperture stop plate 18H is rotated by a motor or the like (not shown), which is under the control of main controller 50, so that an aperture stop is selectively set on the optical path of the pulse illumination light and the shape of the light source surface in Koehler illumination is limited to shapes such as annular, small circles, large circle, or quadrupole.

On the optical path of the pulse illumination light after illumination system aperture stop plate 18H, beam splitter 18J that has high reflectance and low transmittance is disposed. And further down the optical path, a relay optical system made up of the first relay lens 18K and the second relay lens 18N is disposed, with fixed reticle blind 18L and movable reticle blind 18M arranged in between.

Fixed reticle blind 18L is disposed on a surface slightly defocused from a conjugate surface with respect to the pattern surface of reticle R, and has an aperture portion of a predetermined shape formed that sets the illumination area on reticle R. In the embodiment, the aperture portion is to be formed in a slit or rectangular shape extending linearly in an X-axis direction, which is perpendicular to the moving direction of reticle R during scanning exposure (a Y-axis direction).

In addition, movable reticle blind 18M, which has an aperture portion whose position in the direction corresponding to the scanning direction and width are variable, is disposed in the vicinity of fixed reticle blind 18L. And, by further limiting the illumination area via movable reticle blind 18M at the beginning and the end of scanning exposure, exposure on unnecessary portions can be prevented. Movable reticle blind 18M operates under the control of main controller 50, via a drive system 43.

On the exit portion of the second relay lens 18N structuring the relay optical system, illumination telecentric correction plate 18P is disposed. And further down the optical path of the pulse illumination light, mirror 18Q is disposed for reflecting the pulse illumination light that has passed through the second relay lens 18N and illumination telecentric correction plate 18P toward reticle R. And further down mirror 18Q on the optical path of the pulse illumination light, main condenser lens system 18R is disposed.

The operation of illumination optical system 18 that has the arrangement described above will be briefly described. When the excimer laser beam from light source 11 enters the illumination optical system via pipe 34 and beam photodetection system 32, the excimer laser beam is adjusted to a predetermined peak-intensity by variable attenuator 18A, and then enters beam shaping optical system 18B. Then, the sectional shape of the excimer laser beam is shaped at beam shaping optical system 18B so that it efficiently enters the first fly-eye lens system 18C. Then, when the excimer laser beam enters the first fly-eye lens system 18C, a surface light source made up of multiple point light sources (light source images), that is, a secondary light source, is formed on the focal point plane on the outgoing side of the first fly-eye lens system 18C. The pulse ultraviolet light emitted from the secondary light source (each of the multiple point light sources) enters the second fly-eye lens system 18G, via vibration mirror 18D, condensing lens system 18E, and illumination NA correction plate 18F. This produces a ternary light source on the focal point plane on the outgoing side of the second fly-eye lens 18G, made up of individual light source images of multiple fine light source images distributed in uniform within an area of a predetermined shape. The pulse ultraviolet light emitted from the ternary light source reaches beam splitter 18J having high reflectance and low transmittance, after passing through one of the aperture stops formed on illumination system aperture stop plate 18H.

The pulse ultraviolet light reflected off beam splitter 18J, which serves as the exposure light, illuminates the aperture portion of fixed reticle blind 18L with uniform intensity distribution by the first relay lens 18K. In the intensity distribution, however, interference fringes dependent on the coherency of the pulse ultraviolet light from light source 11 or fine speckles may be overlaid at a contrast of around several percent. Therefore, on the wafer surface, dose variation occurs due to the interference fringes and fine speckles, however, such dose variation can be smoothed by vibrating vibration mirror 18D in sync with the movement of reticle R and wafer W during scanning exposure and the oscillation of the pulse ultraviolet light, as is disclosed in, Japanese Patent Application Laid-open No. 07-142354 and the corresponding U.S. Pat. No. 5,534,970, referred to earlier.

The pulse ultraviolet light that has passed through the aperture portion of fixed reticle blind 18L in the manner described above, then passes through the aperture of movable reticle blind 18M, the second relay lens 18N, and illumination telecentric correction plate 18P, and then the optical path of the pulse ultraviolet light is bent downward by mirror 18Q. The pulse ultraviolet light then reaches main condenser lens system 18R, and then proceeds to illuminate the predetermined illumination area on reticle R (a slit or rectangular shaped illumination area extending linearly in the X-axis direction) held on reticle stage RST with uniform illuminance distribution. The rectangular shaped illumination light irradiated on reticle R is set to extend narrowly in the X-axis direction (non-scanning direction) at the center of a circular projection field of projection optical system PL in FIG. 1, and the width of the illumination light in the Y-axis direction (scanning direction) is set substantially constant.

Meanwhile, the pulse illumination light that has passed through beam splitter 18J enters an integrator sensor 46 made of a photoelectric conversion element via a condenser lens (not shown) where it is photoelectrically converted. And, photoelectric conversion signals of integrator sensor 46 are sent to main controller 50 via a peak-hold circuit and an A/D converter. As integrator sensor 46, for example, a PIN type photodiode or the like that has sensitivity in the far ultraviolet region and also has a high response frequency in order to detect the pulse emission from light source 11 can be used. The relative coefficient of the output of integrator sensor 46 and the illuminance (dose) of the pulse ultraviolet light on the surface of wafer W is obtained in advance, and is stored in the memory of main controller 50.

As is shown in FIG. 1, reticle stage RST is disposed above a reticle base supporting bed 28, which is disposed below main condenser lens system 18R. On the upper surface of reticle base supporting bed 28, a guide (not shown) is arranged expanding along the scanning direction (the Y-axis direction). In addition, in the center of reticle base supporting bed 28, an aperture 28a is formed.

On reticle base supporting bed 28, reticle stage RST, which holds reticle R by suction and moves in the Y direction along the guide (not shown), is disposed. In actual, reticle stage RST is driven by parts such as linear motors that make up a reticle drive system 29, and is structured including a reticle coarse movement stage, which linearly moves in large strokes in the Y-axis direction on reticle base supporting bed 28, and a reticle fine movement stage, which is finely drivable in the X-axis direction (a second axis direction), the Y-axis direction, and a θz direction (a rotational direction around a Z-axis) by devices such as voice coil motors (VCM) and piezo elements. Reticle R is held by suction on the reticle fine movement stage. As is described, reticle stage RST is made including the two stages, however, hereinafter, reticle stage RST will be described as a single stage which is driven largely along the Y-axis direction by reticle drive system 29, as well as driven finely in the X, Y, and θz directions.

On reticle stage RST, a movable mirror 31 that reflects a laser beam from a reticle laser interferometer (hereinafter referred to as "reticle interferometer") is fixed, and the position of reticle stage RST in the movement plane is detected with reticle interferometer 30 at all times at a resolution of, for example, around 0.5 to 1 nm. In actual, on reticle stage RST, a movable mirror that has a reflection surface perpendicular to the Y-axis direction and a movable mirror that has a reflection surface perpendicular to the X-axis direction are provided, and corresponding to these movable mirrors, a reticle Y interferometer and a reticle X interferometer are provided. However, in FIG. 1, these are representatively shown as movable mirror 31 and reticle interferometer 30. Incidentally, for example, the edge surface of reticle stage RST may be polished to make a reflection surface (equivalent to the reflection surface of movable mirror 31). In addition, instead of the reflection surface extending in the X-axis direction used for detection the position of reticle stage RST in the scanning direction (in the embodiment, the Y-axis direction), at least one corner cube type mirror (such as a retroreflector) may be used. One of the reticle Y interferometer and reticle X interferometer, for example, reticle Y interferometer, is a dual-axis interferometer that has two length measuring axes, and based on the measurement values of the reticle Y interferometer, rotation of reticle stage RST in the θz direction can be measured, in addition to the Y position.

Positional information (or velocity information) of reticle stage RST (that is, reticle R) measured by reticle interferometer 30 is sent to a reticle stage controller 33. Reticle stage controller 33 basically controls reticle drive system 29, which controls reticle RST, so that the positional information (or velocity information) output from reticle interferometer 30 coincides with instruction values (target position and target velocity)

As projection optical system PL, in the embodiment, a dioptric system is used that has a circular projection field telecentric on both the object side (reticle R) and the image plane side (wafer W), consists only of dioptric elements (lens elements) made of quartz or fluorite, and has a reduction magnification of ¼ (or ⅕). The direction of an optical axis AX of projection optical system PL serves as the Z-axis direction. In this case, image forming beams from the circuit pattern area on reticle R where the pulse ultraviolet light illuminates are reduced to ¼ or ⅕ and projected on a resist layer on wafer W held by electrostatic chucking with a wafer holder placed on a wafer stage WST (to be described later), via projection optical system PL.

As a matter of course, projection optical system PL may be a so-called catadioptric system, which is a combination of dioptric elements and catoptric elements (such as a concave mirror or a beam splitter) as is disclosed in, Japanese Patent Application Laid-open No. 03-282527 and the corresponding U.S. Pat. No. 5,220,454. The disclosure of the above U.S. Patent is fully incorporated herein by reference.

The image forming characteristics correction unit is used to finely adjust various optical properties (image forming performance) of projection optical system PL, and in the embodiment, it comprises the following parts: a MAC, which is made up of a telecentric portion lens system G2 provided at a position close to the object plane within projection optical system PL that can be finely driven in the direction of optical axis AX, as well as be finely inclined with respect to a surface perpendicular to the optical axis AX, and a drive mechanism 96, which finely drives lens system G2 in the direction of the optical axis AX (including inclination); and an image forming characteristics correction controller 102 which controls MAC (more particularly, drive unit 96). With the image forming characteristics correction unit, magnification and/or distortion (homogeneous distortion aberration, inhomogeneous distortion aberration such as a barrel, pincushion, or trapezoidal distortion, or the like) of the projection image can be adjusted. Image forming characteristics correction controller 102 also operates under the control of main controller 50. Incidentally, the image forming characteristics of projection optical system PL may also be adjusted by either main controller 50 or image forming characteristics correction controller 102 controlling a shift amount of the wavelength of excimer laser beam emitted from light source 11.

In addition, at a position close to the image plane within projection optical system PL, an aberration correction plate G3 is disposed, in order to reduce astigmatism and coma that are likely to occur in the projected image especially where the image height is large (in the area near the periphery of the projection field).

Furthermore, in the embodiment, an image distortion correction plate G1 is disposed in between lens system G2 of projection optical system PL and reticle R, in order to effectively reduce random distortion components included in the projection image formed in an effective image projection area (set by the aperture portion of fixed reticle blind 18L) within the circular field of view. Correction plate G1 is a parallel quartz plate around several millimeters thick whose surface is locally polished, and the image forming beams that pass through such polished parts are slightly deflected. An example of how to make such a correction plate G1 is disclosed in detail in, for example, Japanese Patent Application Laid-open 08-203805 and the corresponding U.S. Pat. Nos. 6,268,903 and 6,377,333, and the technique shown in the above publication is basically applied to the embodiment. The disclosures of each of the above U.S. Patents are fully incorporated herein by reference.

Next, the stage device will be described. As is shown in FIG. 1, the stage device comprises the following parts: a supporting bed 22 that make up a frame portion (not shown); and a wafer stage WST disposed above supporting bed 22, serving as an object stage movable within an XY plane.

Wafer stage WST is supported by levitation with respect to the upper surface of supporting bed 22 via a clearance of, for example, around several µm, by a gas hydrostatic pressure bearing (not shown) provided on the bottom surface of wafer stage WST, and can be driven freely within an XY two-dimensional plane by an X linear motor and a Y linear motor, or a planar motor. In FIG. 1, for the sake of convenience in the drawing, actuators such as the above linear motors are indicated as a drive system 48. Drive system 48 (more particularly, parts such as the above X linear motor and Y linear motor) operates under the control of a wafer stage controller 78.

As is shown in FIG. 1, wafer stage WST comprises the following parts: a moving stage 52 that moves freely within the XY plane on supporting bed 22; a leveling drive mechanism 58 mounted on moving stage 52, serving as a drive mechanism; and a wafer table TB, which is supported by leveling drive mechanism 58 and holds wafer W. Moving stage 52 is formed in a rectangular shape in a planar view (when viewed from above).

Wafer table TB is supported by three actuators ZAC, which make up leveling drive mechanism 58 mounted on moving stage 52. On wafer table TB, a wafer holder of a substantially circular shape is provided (not shown), and wafer W is held on the wafer holder by electrostatic chucking with the flatness corrected. The temperature of the wafer holder is controlled in order to suppress expansion/deformation due to heat accumulation when wafer W is exposed.

Leveling drive mechanism 58 supports wafer table TB in the vicinity of the three tips of an equilateral triangle. Leveling drive mechanism 58 is made up of three actuators (such as piezoelectric elements or voice coil motors) ZAC that can be independently driven in the Z-axis direction, which is perpendicular to the XY plane at each of the supporting points, and an actuator controller 56 that independently controls these three actuators ZAC so as to finely move wafer table TB in the direction of the optical axis AX (the Z-axis direction) as well as incline wafer table TB with respect to the XY plane. Drive instructions to actuator controller 56 are sent from wafer stage controller 78.

Although it is omitted in FIG. 1, a focus leveling detection system, which detects the deviation (focus error) and inclination (leveling error) between the image forming plane of projection optical system PL and the surface of wafer W, is provided in the vicinity of projection optical system PL, and wafer stage controller 78 sends drive instructions to actuator controller 56 in response to focus error signals and leveling error signals from the focus leveling detection system. An example of such a focus leveling detection system is disclosed in detail in, Japanese Patent Application Laid-open No. 07-201699 and the corresponding U.S. Pat. No. 5,473,424. The output of the focus leveling detection system is also sent to a synchronous control system 80 via wafer stage controller 78, and to main controller 50 via synchronous control system 80. The disclosure of the above U.S. Patent is fully incorporated herein by reference.

The position of wafer table TB is sequentially measured by a laser interferometer system 76. More particularly, the edge surfaces of wafer table TB are polished on the −Y side and +X side to make reflection surfaces. And on these reflection surfaces, laser beams from a Y laser interferometer and an X laser interferometer that make up laser interferometer system 76 are irradiated. The beams reflected off the reflection surfaces are individually received by the interferometers, and the position of wafer table TB is measured in both the Y-axis direction and in the X-axis direction. As is described above, a plurality of laser interferometers are provided, however, in FIG. 1, these are representatively shown as laser interferometer system 76. Incidentally, instead of the reflection surfaces formed on wafer table TB described above, movable mirrors made of planar mirrors may be provided.

In addition, the above X laser interferometer and Y laser interferometer are a multiple axis interferometer, which has a plurality of length measuring axes, and other than the X and Y positions of wafer table TB, rotation (yawing (θz rotation, which is rotation around the Z-axis), pitching (θx rotation, which is rotation around the X-axis), and rolling (θy rotation, which is rotation around the Y-axis) can also be measured. Accordingly, in the following description, laser interferometer system 76 measures the position of wafer table TB in directions of five degrees of freedom, in the X, Y, θz, θy, and θx directions. In addition, the multiple axis interferometer may detect relative information related to the position in the optical axis direction (the Z-axis direction) of projection optical system PL, by irradiating a laser beam on a reflection surface provided on the frame on which projection optical system PL is mounted (not shown) via a reflection surface arranged on wafer table TB at an inclination of 45°.

In actual, leveling drive mechanism 58, which drives wafer table TB finely in the Z-axis direction and performs inclination of wafer table TB, is located below the reflection surface previously described, therefore, the drive amount when inclination of wafer table TB is controlled can all be monitored by laser interferometer system 76.

Positional information on wafer table TB (or in other words, wafer stage WST) measured by laser interferometer system 76 is sent to wafer stage controller 78. Wafer stage controller 78 obtains the XY coordinate positions by a predetermined calculation, and based on the obtained coordinate positions and information on the target position to be controlled, sends instruction signals to drive system 48 for driving wafer stage WST.

On wafer table TB, a fiducial mark plate FM is provided so that its surface is substantially at the same height position as the surface of wafer W. On the surface of fiducial mark plate FM, fiducial marks are formed that can be detected by various types of alignment detection systems (to be described later), and such fiducial marks are used in cases such as when checking the detection center point of each of the alignment detection systems (calibration), measuring the distance between the above detection center points and the projection center of the projection optical system (baseline), checking the position of reticle R with respect to the wafer coordinate system, and checking the position of the best image forming plane conjugate with the pattern surface of reticle R in the Z direction.

The wafer carriage system carries wafer W between a wafer housing portion (not shown) and wafer stage WST. The wafer carriage system comprises a robot arm (a wafer load/unload arm) that delivers and receives wafer W between the wafer holder on wafer stage WST, which has been moved to a predetermined loading position.

In exposure apparatus 10 in the embodiment, as the alignment system, an off-axis alignment detection system ALG is used, which optically detects alignment marks formed on each of the shot areas on wafer W without going through projection optical system PL and fiducial marks on fiducial mark plate FM. As is shown in FIG. 1, alignment detection system ALG is disposed beside projection optical system PL. Alignment detection system ALG irradiates a non-exposing illumination light (uniform illumination or spot illumination) to the resist layer on wafer W via an objective lens, and photoelectrically detects the reflection beams from the alignment marks and fiducial marks via the objection lens. The photoelectrically detected mark detection signals are input to a signal processing circuit 68 where measurement values of wafer stage controller 78, synchronous control system 80, and main controller 50 have been input. Signal processing circuit 68 performs waveform processing on the above photoelectrically detected mark detection signals under a predetermined algorithm. Then, based on the processed results and the measurement values of laser interferometer system 76, signal processing circuit 68 obtains coordinate positions (shot alignment positions) of wafer stage WST where the center of the marks coincide with the detection center (such as an index mark, a reference pixel on an imaging surface, a photodetection slit, or a spot light) in alignment detection system ALG, or the positional deviation amount of the wafer marks and fiducial marks to the detection center. The information on the shot alignment position or the positional deviation amount obtained above is sent to main controller 50, and is used for example, when position setting wafer stage WST during alignment, or when setting the scanning starting position (or acceleration starting position) for exposure on each of the shot areas on wafer W.

Furthermore, in exposure apparatus 10 in the embodiment, synchronous control system 80 is provided in the control system for synchronously moving reticle stage RST and wafer stage WST. Synchronous control system 80 monitors the state of the position and velocity of reticle R and wafer W measured by reticle interferometer 30 and laser interferometer system 76 realtime, in order to link the control of drive system 39 by reticle stage controller 33 and the control of drive system 48 by the wafer stage controller 78 especially during scanning exposure, and controls these parts so as to make the correlation predetermined. Synchronous control system 80 operates under the control of main controller 50, which sends out various types of commands and configuration information on parameters. As is described, in the embodiment, synchronous control system 80, reticle stage controller 33, and wafer stage controller 78 make up a stage control system that controls both stages, RST and WST.

In exposure apparatus 10 in the embodiment, the control system is actually designed as a distributed system, comprising a plurality of unit side computers (such as microprocessors) that individually control the above light source 11 and each of the units in exposure apparatus main body 12 (such as illumination optical system, reticle stage RST, wafer stage WST, and wafer carriage system), and a main controller 50, which serves as a control unit, made up of a workstation or the like that has total control over the unit side computers.

In the embodiment, by the above plurality of unit side computers operating linked with main controller 50, a series of exposure operations are performed on a plurality of wafers. Main controller 50 totally controls the whole sequence of such exposure operations, according to a predetermined configuration file on exposure conditions called a process program stored in the memory (not shown).

A process program is a program of parameter group packages saved under an exposure processing file name made by an operator. The program includes the following packages: information related to the wafer to be exposed (such as the number of wafers to be processed, shot size, shot arrangement data, alignment mark arrangement data, and alignment conditions); information related to the reticle to be used (such as, data by pattern type, arrangement of each mark, and size of circuit pattern area); and information related to exposure conditions (such as, dose, focus offset, scanning velocity offset, projection magnification offset, correction amount of various aberrations and image distortions, set values like numerical aperture and coherence factor σ value in the illumination optical system, and set values of numerical aperture in the projection optical system).

Main controller 50 decodes the process program instructed for execution, and successively gives instructions as commands to each of the unit side computers corresponding to the component that performs the operations necessary to expose the wafer. In this case, when a unit side computer completes a command normally, the status of the unit side computer is sent to main controller 50. Then, after receiving the status report, main controller 50 then sends the next command to the unit side computer.

Figure 2A:
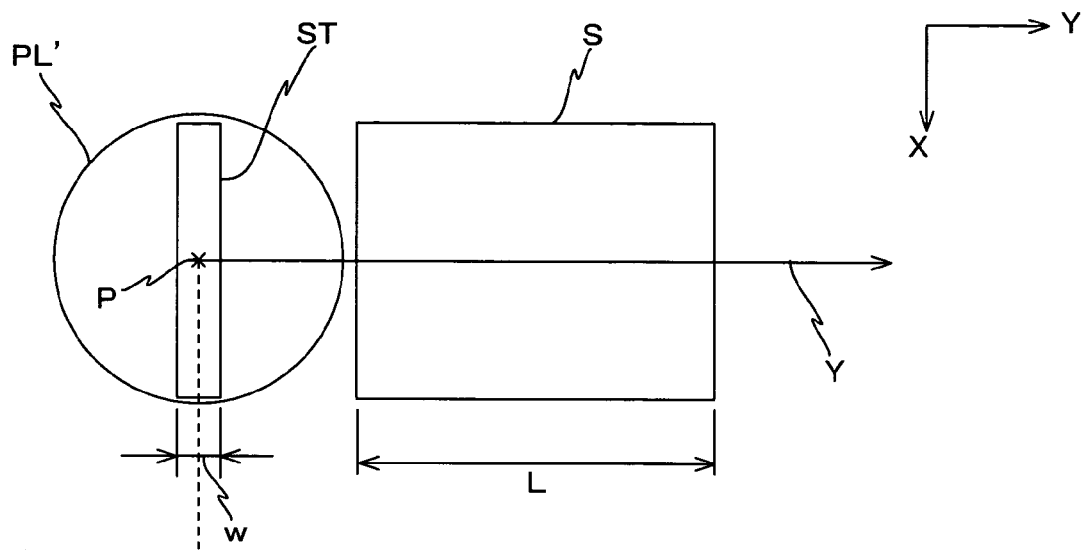
FIG. 2A is a planar view showing a relation between a slit shaped illumination area on a wafer W inscribed in an effective field of a projection optical system and a shot S.
Figure 2B:
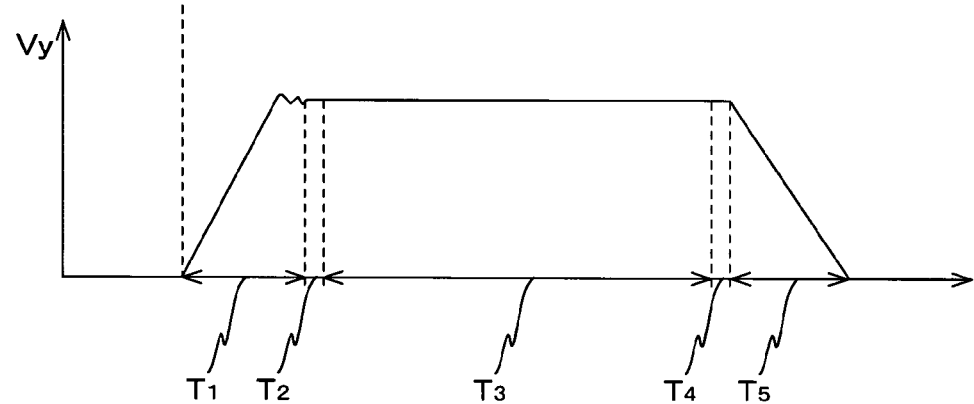
FIG. 2B is a diagram showing a relation between stage movement time and stage speed.

Next, the basic scanning procedures of the wafer stage when exposure of a shot area is performed by the stage control system (wafer stage controller 78, reticle stage controller 33, and synchronous control system 80), which relatively moves reticle stage RST and wafer stage WST in the scanning direction (the Y-axis direction), is briefly described, referring to FIGS. 2A and 2B.

FIG. 2A shows a relation in a planar view between a slit-shaped illumination area (an area conjugate with the illumination area on reticle R; hereinafter referred to as "illumination slit") ST inscribed in an effective field PL' of projection optical system PL and a shot area S serving as a divided area, while FIG. 2B shows a relation between stage movement time and stage speed. In actual exposure, shot area S moves in the opposite direction of an arrow Y in FIG. 2A with respect to illumination slit ST, however, in FIG. 2A, illumination slit ST on the wafer is drawn moving with respect to shot area S, in order to make a connection between FIG. 2A and the relation chart of stage movement time and stage speed in FIG. 2B.

First of all, in a basic (general) scanning procedure, a center P of illumination slit ST is positioned at a point a predetermined amount away from an edge portion of shot area S, and acceleration of wafer stage WST begins. At the same time, reticle stage RST begins to be accelerated in the direction opposite to wafer stage WST, at an acceleration multiplied by a reciprocal to the projection magnification of the acceleration of wafer stage WST. Then, as wafer stage WST and reticle stage RST approach their predetermined speeds, synchronous control of reticle R and wafer W begins. Acceleration time, in this case, refers to time $T_1$, which is the time from the point where acceleration of both stages WST and RST begins until the point where synchronous control on both stages begins. Then, after synchronous control begins, follow-up control is performed by reticle stage RST to wafer stage WST until the displacement error between the wafer and the reticle falls into a predetermined relation, and then exposure begins. The time after the beginning of synchronous control until the beginning of exposure, or time $T_2$, is referred to as the settling time.

The time from the above beginning of acceleration up to the beginning of exposure ($T_1+T_2$) is called the prescan time. When the average acceleration in acceleration time $T_1$ is expressed as a, and the settling time is $T_2$, then the moving length during prescan is expressed as follows: $(\frac{1}{2})*a*T_1^2 + a*T_1*T_2$.

In addition, when shot length is expressed as L and the width of illumination slit ST in the scanning direction is expressed as w, then $T_3$, which is the exposure time when exposure is being performed in a constant speed movement, can be expressed as $T_3=(L+w)/(a*T_1)$ and the moving length is L+w.

At the point where exposure time $T_3$ ends, the transfer of the reticle pattern onto shot area S has been completed. However, in the step-and-scan method, in order to improve throughput, reticle R is normally alternately scanned (reciprocally scanned) to sequentially perform exposure of the next shot area. Therefore, reticle R needs to be moved further from the point where exposure ends by the same length as the moving length during prescan, so that reticle R is brought back to the starting position for scanning exposure of the following shot. In this case, the wafer (that is, the wafer stage) is moved in the scanning direction, corresponding to the reticle (that is, the reticle stage). The time required for such movement is uniform velocity overscan time (post-settling time) $T_4$ and deceleration overscan time $T_5$, and overscan time is in general, $(T_4+T_5)$. The moving length during the overscan time, when the deceleration velocity in deceleration overscan time $T_5$ is expressed as b, is expressed as $-(\frac{1}{2})*b*T_5^2 - b*T_5*T_4$, and $T_4$, $T_5$, and acceleration b are set so that the moving length matches the following equation, $(\frac{1}{2})*a*T_1^2 + a*T_1*T_2$.

In a typical control system, a=−b, therefore, the most simple control method is the following setting: $T_1=T_5$ and $T_2=T_4$.

Figure 3:
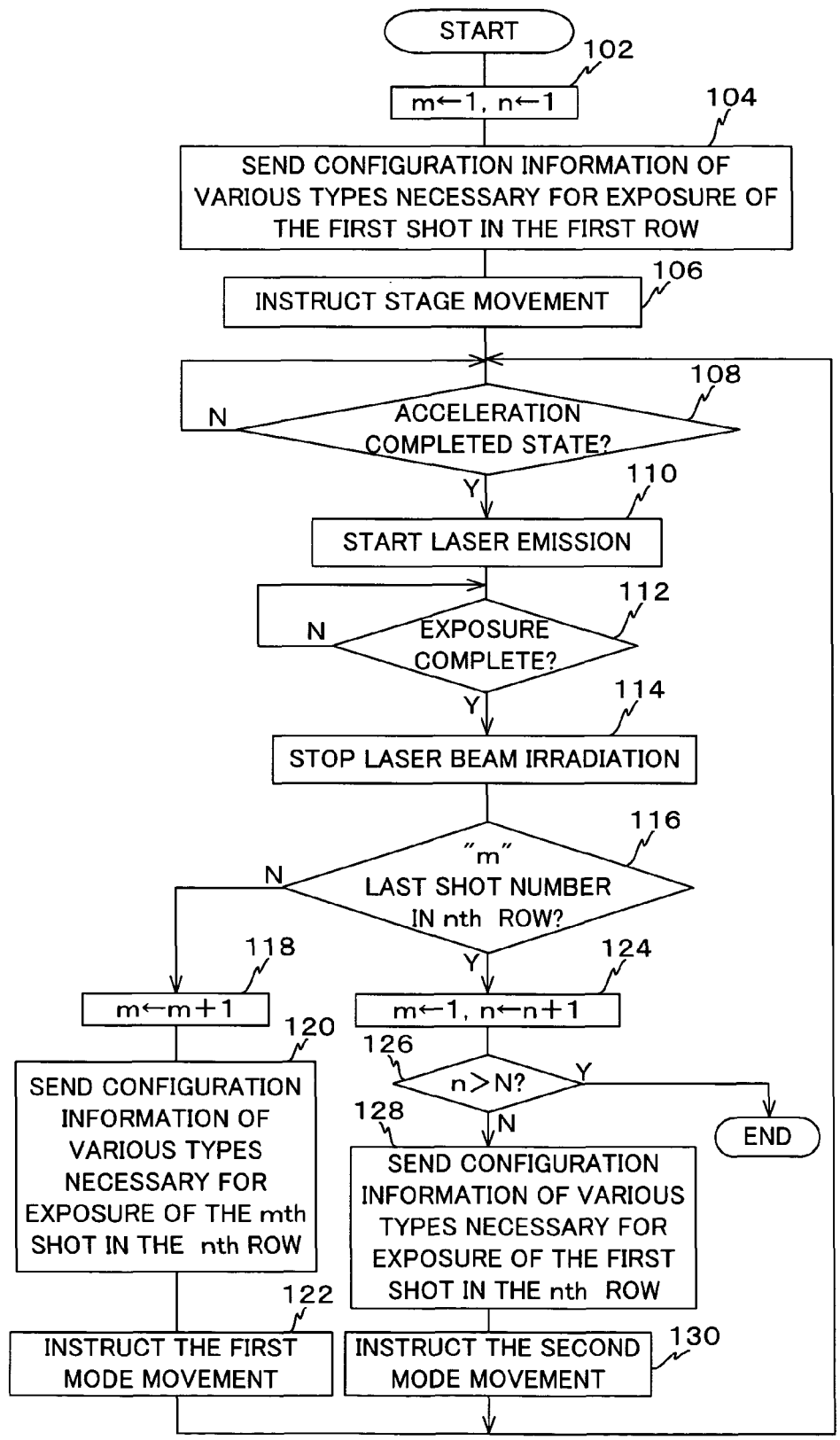
FIG. 3 is a flowchart showing a process algorithm of a main controller 50 in FIG. 1.
Figure 4:
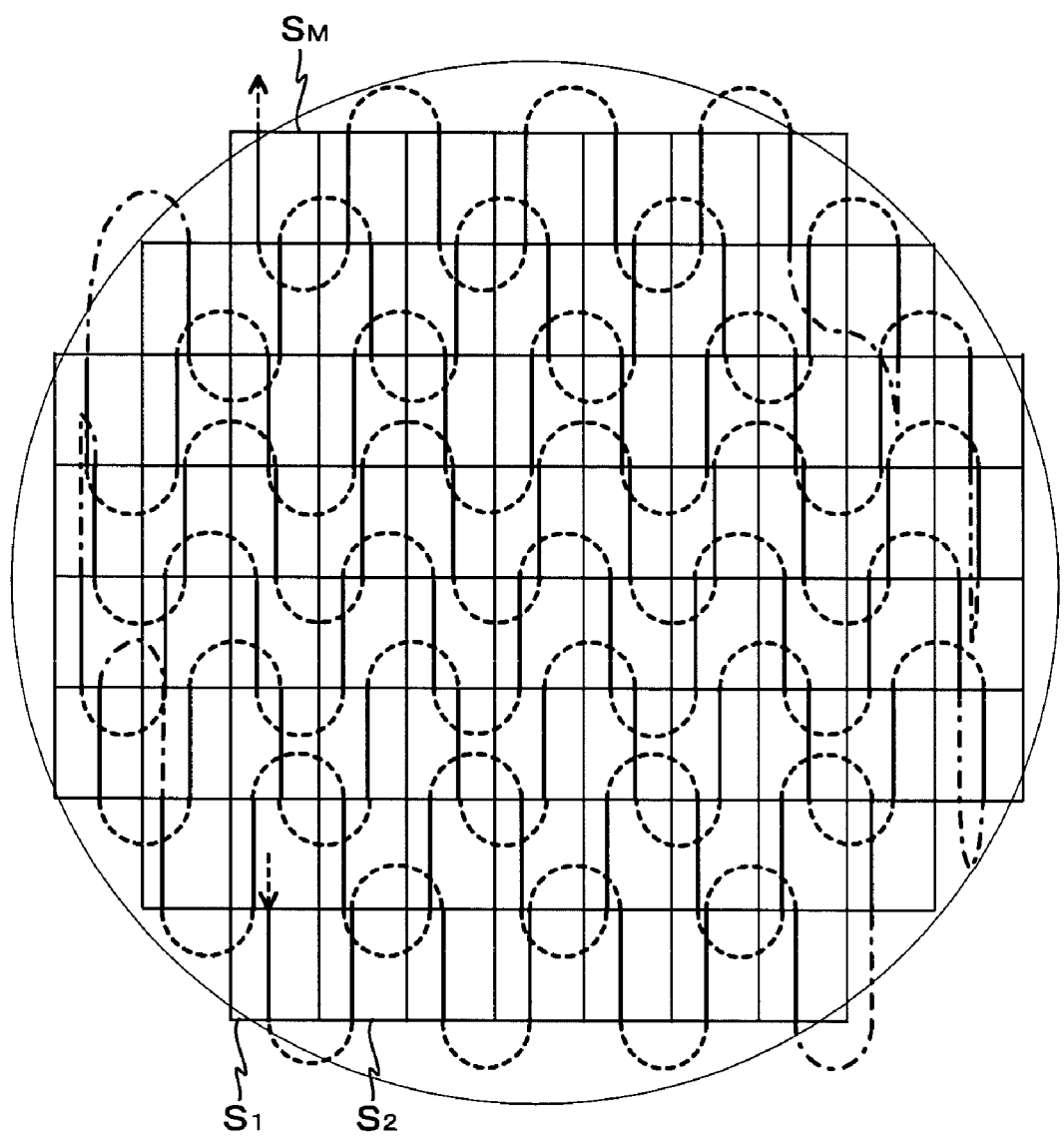
FIG. 4 is a view showing a movement locus of an illumination slit center when exposure is performed on a plurality of shot areas on a wafer W with the exposure apparatus in the first embodiment.

Next, operations when sequentially transferring the pattern of reticle R onto a plurality of shot areas on wafer W with exposure apparatus 10 in the embodiment are described, focusing on a flow chart in FIG. 3, which shows a process algorithm of main controller 50 (or to be more precise, the CPU in main controller 50), and referring to other drawings as appropriate. The case will be described when exposure is performed on a plurality of shot areas (such as 76) as is shown in FIG. 4, following a path also shown in FIG. 4. The path in FIG. 4 indicates the locus of center P of illumination slit ST when center P moves above each shot area. In the path, the solid line portion shows the path of center P (hereinafter also referred to as "point P") of illumination slit ST when each shot is exposed, the dotted line portion shows the locus of the movement of point P when it moves in between adjacent shots in the same row in the non-scanning direction, and the dashed line portion shows the locus of the movement of point P when it moves in between different rows. In actual, point P is fixed while wafer W moves, however, in FIG. 4, for the sake of simplicity, point P (the center of illumination slit ST) is drawn as if it moves above wafer W.

First of all, prior to the process in the flow chart in FIG. 3, main controller 50 performs preparatory operations such as reticle alignment, baseline measurement of alignment detection system ALG, and wafer alignment (such as EGA), using a reticle alignment system (not shown, such as a reticle microscope), fiducial mark plate FM on wafer table TB, and alignment detection system ALG, via each unit computer.

Details on preparatory operations such as the above reticle alignment and baseline measurement are disclosed in, for example, Japanese Patent Application Laid-open No. 07-176468 and the corresponding U.S. Pat. No. 5,646,413, and as for EGA, details are disclosed in, for example, Japanese Patent Application Laid-open No. 61-44429 and the corresponding U.S. Pat. No. 4,780,617. The disclosures of each of the above U.S. Patents are fully incorporated herein by reference.

When the above preparatory operations are completed, then the procedure in the flow chart in FIG. 3 begins.

First of all, in step 102, the counters n and m that indicate the row number to which the shot subject to exposure belongs and the shot number within the row are initially set to 1, respectively (1←m, 1←n).

In the next step, step 104, configuration information of various types is necessary to expose the first shot on wafer W, that is, the first shot in the first row, is transmitted to synchronous control system 80. Such configuration information includes information related to position control of the reticle stage and wafer stage as is previously described, such as set values of EGA parameters (offsets Ox and Oy of the wafer in an X-direction and a Y-direction, orthogonality error w of a stage coordinate system that specifies the movement of the wafer, rotation error θ of the wafer, magnifications (scaling) error rx and ry of the wafer in the X and Y directions) obtained by wafer alignment based on an EGA method performed prior to exposure (such values will be data used when setting the position of the wafer on exposure), correction parameter related to the position of both stages during exposure (such as bend information of movable mirrors on the reticle stage side or the wafer stage side), data related to dose control such as data on pulse energy density of the excimer laser and the number of pulse emission, and furthermore, data related to the exposure sequence set. In addition, in some cases the information may include error information of each mechanism while the stage is being moved.

In the next step, step 106, main controller 50 gives instructions to synchronous control system 80 to move reticle stage RST and wafer stage WST.

Based on the instructions from main controller 50, synchronous control system 80 gives instructions to wafer stage controller 78 to move wafer W to the scanning starting position (or acceleration starting position) for exposure of the first shot. With this operation, wafer stage WST is moved to the above acceleration starting position by wafer stage controller 78, via wafer drive system 48. Then, synchronous control system 80 controls reticle drive system 29 and wafer drive system 48 described earlier via wafer stage controller 78 and reticle stage controller 33, respectively, while monitoring the measurement values of interferometer system 76 and reticle interferometer 30, and begins to relatively scan reticle stage RST and wafer stage WST in the Y-axis direction.

Meanwhile, in step 108, main controller 50 waits for both stages RST and WST to complete the acceleration, and to reach their target scanning velocity. And, when both stages RST and WST complete their acceleration, main controller 50 starts emission of light source 11.

Almost at the same time as the emission of light source 11, synchronous control system 80 begins synchronous settling operations of both stages RST and WST, prior to exposure.

As is described, when synchronous settling of both stages RST and WST has been completed and exposure is about to begin, light source 11 has already begun emission. However, main controller 50 controls the movement of a predetermined blade of movable reticle blind 18M in sync with reticle stage RST based on the measurement values of reticle interferometer 30, so as to prevent unnecessary areas other than the pattern area of reticle R from being exposed, as in an ordinary scanning stepper.

Then, when both stages RST and WST reach a state where both stages are synchronously moving at a constant speed, the pattern area of reticle R begins to be illuminated by the ultraviolet pulse light emitted from illumination optical system 18, and scanning exposure described above begins.

Synchronous control system 80 performs synchronous control, especially during the above scanning exposure, so that the movement velocity Vr of reticle stage RST in the Y-axis direction and the movement velocity Vw(=Vy) of wafer stage WST in the Y-axis direction are maintained at a velocity ratio corresponding to the projection magnification (¼ or ⅕) of projection optical system PL.

Then, different areas in the pattern area of reticle R are sequentially illuminated with the ultraviolet pulse light, and when illumination on the entire pattern surface has been completed, scanning exposure of the first shot on wafer W is completed. And, with this operation, the pattern of reticle R is reduced and transferred onto the first shot via projection optical system PL.

During the above scanning exposure, main controller 50 waits for the exposure to end in step 112.

Then, when scanning exposure of the first shot is completed in the manner described above, the decision in step 112 is affirmed, and the step proceeds to step 114, where the irradiation of the laser beam is stopped. On stopping the irradiation, the emission of light source 11 may be stopped, or a shutter (not shown) in light source 11 may be closed.

In the next step, step 116, a decision is made referring to counter m, whether or not counter value m is the last shot number in the $n^{th}$ row (in this case, the $1^{st}$ row), based on, for example, a shot map. In this case, because m=1, the decision here is denied, therefore, the step proceeds to step 118, where counter m is incremented by one. The step then proceeds to step 120, where configuration information of various types necessary for exposure of the $m^{th}$ shot in the $n^{th}$ row (in this case, the second shot in the first row, that is, the second shot) is transmitted to synchronous control unit 80. Such information is transmitted, while synchronous control system 80 is performing uniform velocity overscan (postsettling) operations of wafer stage WST and reticle stage RST in the scanning direction after the exposure operation. Therefore, synchronous control system 80 can receive the configuration information of various types without any difficulty, and store the information in the internal memory.

After the above configuration information is transmitted, in step 122, main controller 50 instructs synchronous control system 80 to move both stages RST and WST in a first mode (hereinafter simply referred to as "the first mode movement"), and then returns to step 108 to wait for both stages RST and WST to complete the acceleration and to reach their target scanning velocity.

While main controller 50 is waiting in step 108, synchronous control system 80 performs the first mode movement operation. Following is a detailed description on the first mode movement operation.

The First Mode Movement Operation

Figure 5:
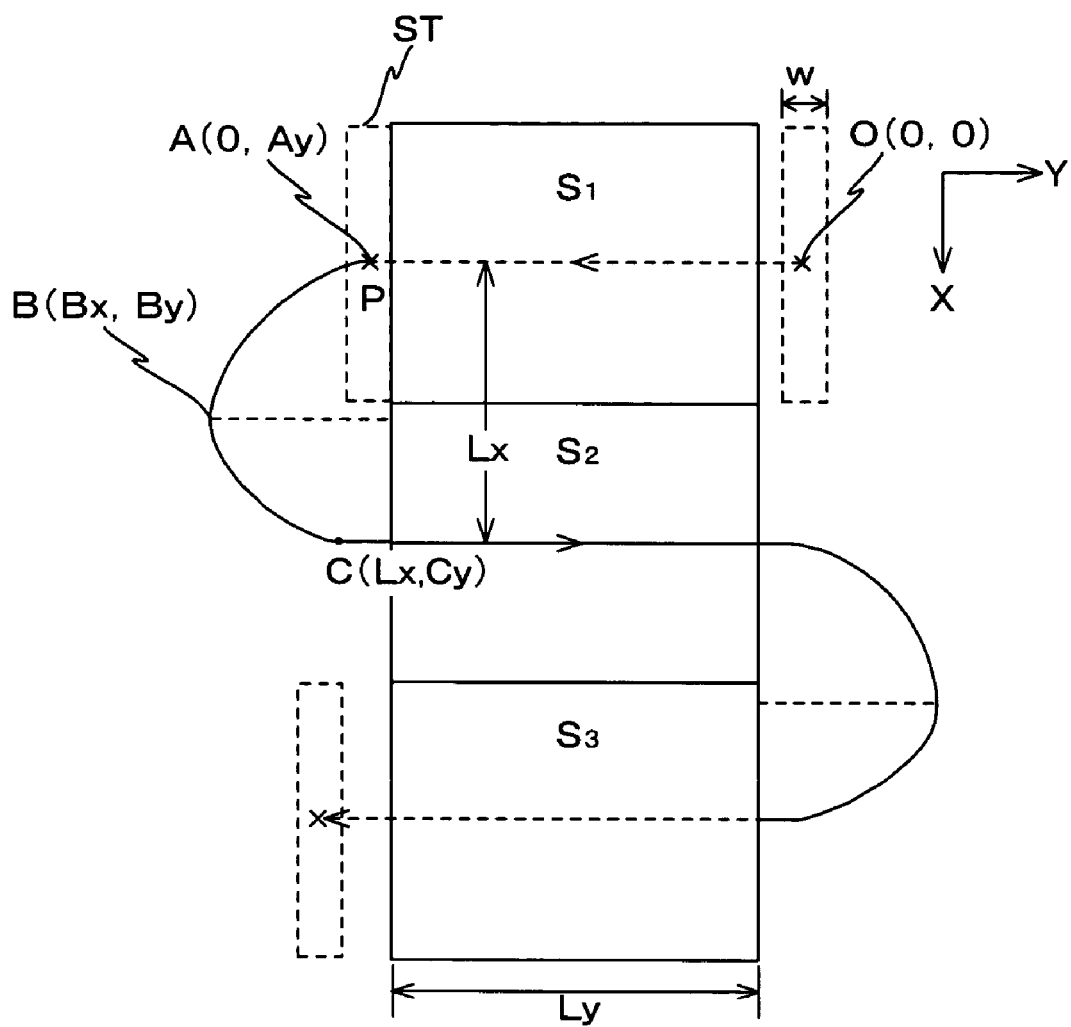
FIG. 5 is a view showing a locus of a center P of an illumination slit ST on wafer W when shot areas $S_1$, $S_2$, and $S_3$ are sequentially exposed.

As an example, the movement operation of both stages in between shots will be described, when exposure is to be sequentially performed on adjacent shots, first shot $S_1$ and second shot $S_2$ that are positioned in the same row, as is shown in FIG. 5.

Figure 6A:
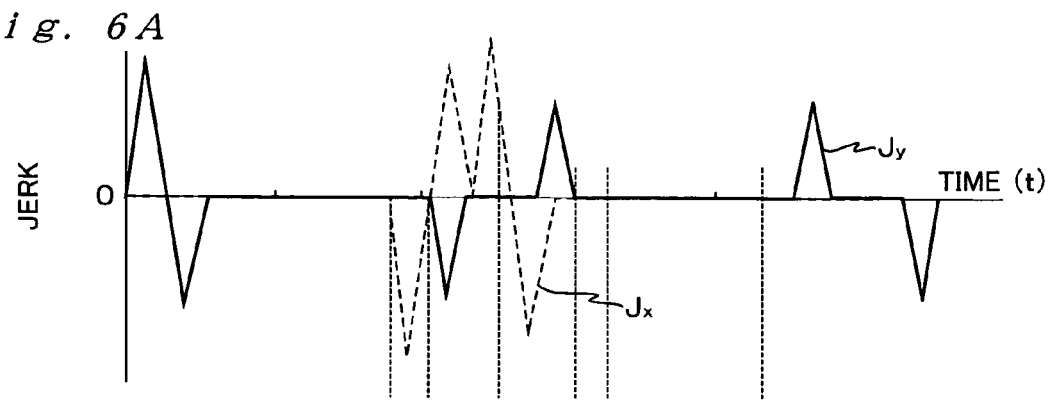
FIG. 6A is a view showing a jerk curve of a wafer stage during a first mode movement operation.

In FIG. 6A, a jerk curve $J_y(t)$ of wafer stage WST related to the scanning direction (the Y-axis direction) in the first mode movement operation is shown in a solid line, whereas a jerk curve $J_x(t)$ related to the non-scanning direction (the X-axis direction) is shown in a dotted line. Jerk, in this case, is the rate of change of acceleration, that is, a third-order derivative of position by time.

Figure 6B:
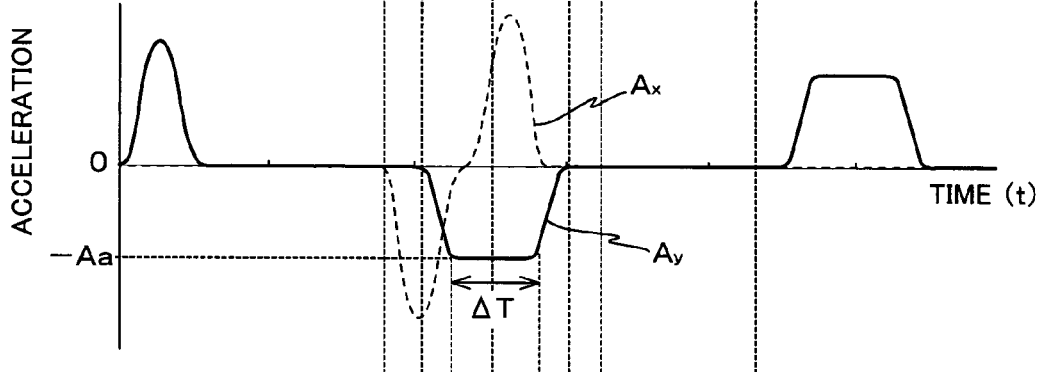
FIG. 6B is a view showing an acceleration curve of the wafer stage during the first mode movement operation.
Figure 6C:
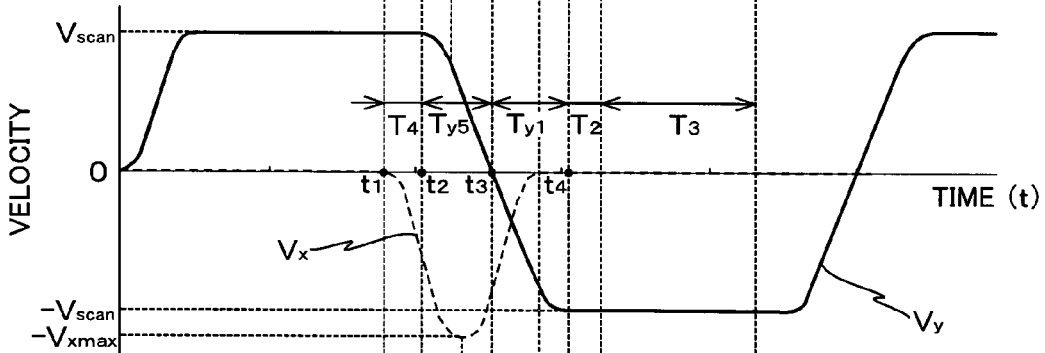
FIG. 6C is a view showing a velocity curve of the wafer stage during the first mode movement operation.
Figure 6D:
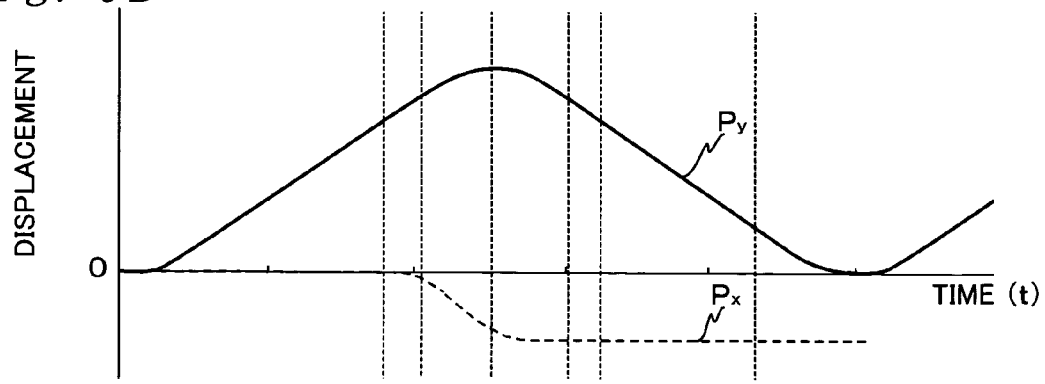
FIG. 6D is a view showing a displacement curve of the wafer stage during the first mode movement operation.
Figure 7A:
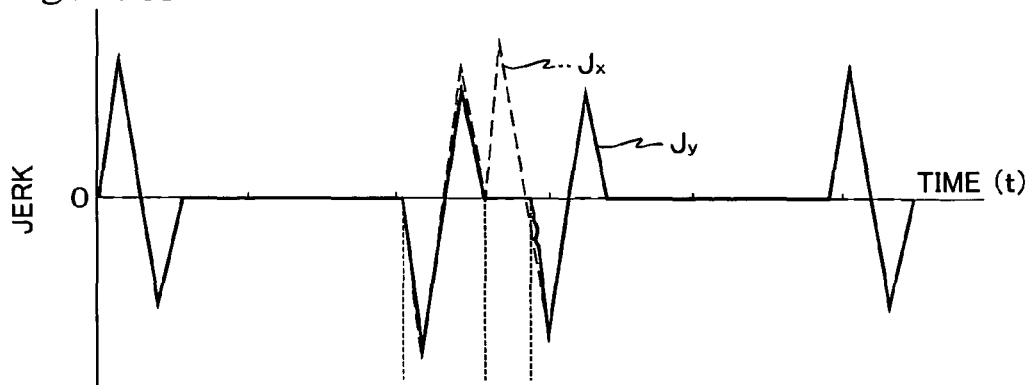
FIG. 7A is a view showing a jerk curve of a wafer stage in a conventional exposure apparatus (conventional apparatus)
Figure 7B:
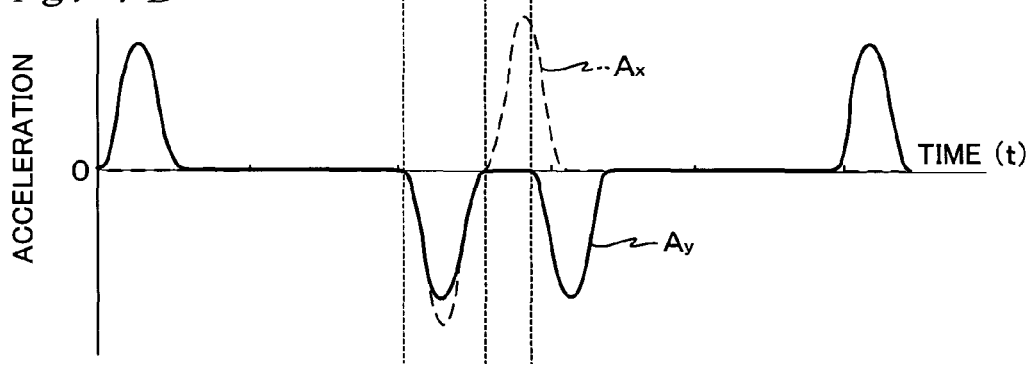
FIG. 7B is a view showing an acceleration curve of the wafer stage in a conventional apparatus.
Figure 7C:
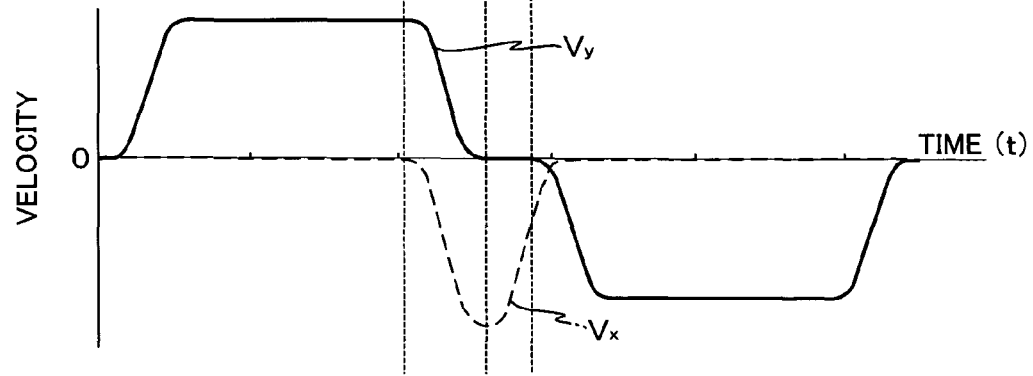
FIG. 7C is a view showing a velocity curve of the wafer stage in a conventional apparatus.
Figure 7D:
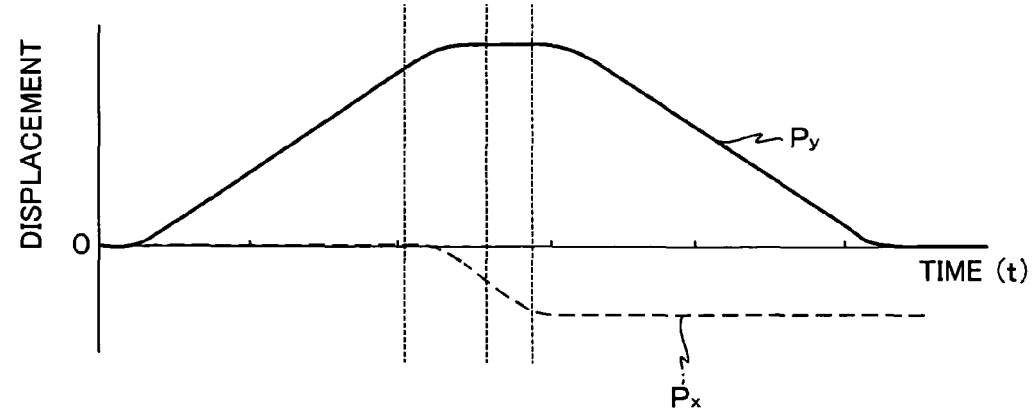
FIG. 7D is a view showing a displacement curve of the wafer stage in a conventional apparatus.

In addition, in FIG. 6B, an acceleration curve $A_y(t)$ of wafer stage WST related to the scanning direction that corresponds to FIG. 6A is shown in a solid line, whereas an acceleration curve $A_x(t)$ related to the non-scanning direction is shown in a dotted line. Also, in FIG. 6C, a velocity curve $V_y(t)$ of wafer stage WST related to the scanning direction that corresponds to FIGS. 6A and 6B is shown in a solid line, whereas a velocity curve $V_x(t)$ related to the non-scanning direction is shown in a dotted line. And, in FIG. 6B, a displacement curve $P_y(t)$ of wafer stage WST related to the scanning direction that corresponds to FIGS. 6A, 6B and 6C is shown in a solid line, whereas a displacement curve $P_x(t)$ related to the non-scanning direction is shown in a dotted line. Furthermore, in FIGS. 6A to 6D, the horizontal axis shows the time (t).

In the first mode movement operation, reticle stage RST moves according to each temporal response curve multiplied by a reciprocal to the projection magnification of the above jerk curve $J_y(t)$, acceleration curve $A_y(t)$, velocity curve $V_y(t)$, and displacement curve $P_y(t)$, therefore, a detailed description is omitted.

In the embodiment, in actual, synchronous control system 80 generates instruction values on velocity and position based the jerk curve in FIG. 6A, and wafer stage controller 78 controls wafer stage WST via wafer drive system 48 according to such instruction values, however, for the sake of simplicity, the description below will focus on the velocity curve in FIG. 6C, and refer to other drawings as appropriate.

First, the movement operation in the scanning direction is examined. When exposure on shot $S_1$ has been completed at a point $t_1$ as is described earlier (at this point, point P is located at point A in FIG. 5), and uniform velocity overscan time $T_4$ has elapsed from point $t_1$, wafer stage WST begins deceleration (acceleration in the −Y direction when the velocity is in the +Y direction in FIG. 5) at this point, $t_2$ (=$t_1$+$T_4$). After wafer stage WST begins deceleration, the deceleration gradually increases (the absolute value of acceleration in the −Y direction increases) and reaches a predetermined constant value (−Aa), then the predetermined constant value is maintained for a given period of time ΔT (refer to FIG. 6B). However, the deceleration time in this case is from the deceleration starting point $t_2$ to time $T_{y5}$.

At this point, as is shown in FIG. 6C, wafer stage WST proceeds in the +Y direction at a constant velocity Vscan between exposure end point $t_1$ and time $T_4$ with point A (0, Ay) in FIG. 5 as a reference point, and then with point $t_2$ where time $T_4$ has elapsed as a reference point for time, wafer stage WST proceeds further in the +Y direction for time $T_{y5}$ in a velocity according to velocity curve $V_y(t)$ in FIG. 6C. At a point $t_3$ where time $T_{y5}$ has elapsed, wafer stage WST arrives at a diverging point B(Bx, By) where prescan of shot $S_2$ serving as a different divided area begins (refer to FIG. 5).

Then, wafer stage WST is accelerated in the −Y direction for time $T_{y1}$ in a velocity according to velocity curve $V_y(t)$, with acceleration starting point $t_3$ as a reference point for time.

As is shown in FIG. 6A, during the above time ($T_{y5}$+$T_{y1}$), jerk curve $J_y(t)$ is a curve that has a reversed curve convex upward mountain (a valley-shaped curve) and a curve convex upward mountain on the upper and lower sides of an interval serving as a center where jerk is zero, or in other words, an inverse curve of polarized symbols.

More particularly, in the first mode movement operation, because jerk curve $J_y(t)$ is the base of instruction values for a preliminary operation of wafer stage WST related to the scanning direction, from the point where exposure of a shot area has been completed to before synchronous settling period ($T_2$) for exposing the next shot, acceleration curve $A_y(t)$ has a trapezoidal shape during the corresponding period, as is shown in a solid line in FIG. 6B. Therefore, during the preliminary operation, in between the absolute value of the maximum deceleration (maximum momentary deceleration) or the maximum acceleration (maximum momentary acceleration) $Ay_{max}=Aa$ and the absolute value of the average acceleration $Ay_{ave}$, the following relation is valid:

$$Ay_{ave} < Ay_{max} = Aa < 2Ay_{ave}.$$

Meanwhile, in FIGS. 7A to 7D, a jerk curve, an acceleration curve, a velocity curve, and a displacement curve of a wafer stage in a conventional exposure apparatus are shown (in these drawings, the horizontal axis indicates time) in comparison, corresponding to FIGS. 6A to 6D. When viewing FIG. 7A, during the above period when preliminary operation of wafer stage WST related to the scanning direction is performed, a quadrupoled jerk curve is obviously used as the jerk curve. Therefore, the acceleration curve during the corresponding period is substantially shaped in a triangle as is shown in a solid line in FIG. 7B. Thus, during the period of preliminary operation, the following relation was valid in between the absolute value of the maximum deceleration (maximum momentary deceleration) or the maximum acceleration (maximum momentary acceleration) $Ay_{max}$ and the absolute value of the average acceleration $Ay_{ave}$:

$$Ay_{max} \approx 2Ay_{ave}.$$

As is described, in exposure apparatus 10 in the embodiment, the rate of the absolute value of the average acceleration improves with respect to the absolute value of the maximum acceleration (or the maximum deceleration), or in other words, the maximum acceleration (or maximum deceleration) can be suppressed. This reduces the size of actuators, such as linear motors that drive wafer stage WST on acceleration (or deceleration), or its drive amps, as well as suppresses the heat generation due to a reduction in power consumption. On the reticle RST side, in addition to obtaining an effect similar to the effect described above, the change of jerk (sudden change or the frequency of the change) is suppressed, which in turn effectively keeps the shift of reticle R from occurring.

Thus, acceleration is performed as is described above, and when the operation reaches a point $t_4$ shown in FIG. 6C, wafer stage WST reaches a target scanning velocity $-V_{scan}$ (the minus here means that the velocity is in the $-Y$ direction). Then, after the elapse of time $T_2$, which is the synchronous control period of reticle R and wafer W, exposure begins. In this case, exposure time $T_3$ is expressed as follows:

$$T_3 = (\text{shot length } Ly + \text{illumination slit width } w)/V_{scan}.$$

Next, the movement operation in the non-scanning direction is examined. As is shown in FIG. 6C, as soon as exposure on shot $S_1$ has been completed at point $t_1$, wafer stage RST begins acceleration in the $-X$ direction according to velocity curve $V_x(t)$. Then, wafer stage WST reaches the maximum velocity $-V_{xmax}$ (the minus here means that the velocity is in the $-X$ direction) at a point where time $T_{x5}$ has elapsed from the beginning of acceleration. At this point, the X coordinate of wafer stage WST is $-Bx$, and point P is located at point B (Bx,By) in FIG. 5. Then, from this point, wafer stage WST begins deceleration (acceleration in the +X direction when the velocity is in the $-X$ direction) according to velocity curve $V_x(t)$. And, when time $T_{x1}$ has elapsed from the beginning of deceleration (end of acceleration), the deceleration ends and the velocity becomes zero (that is, the movement related to the non-scanning direction is suspended). At this point, the X coordinate of wafer stage WST is $-Lx$ (Lx is the stepping length), and point P has arrived at point C (Lx, Cy) in FIG. 5.

That is, as for the scanning direction, as is shown in FIG. 6C, at point $t_4$ where time $(T_4+T_{y5}+T_{y1})$ has elapsed from point $t_1$, which is the exposure end point of the previous shot area, the acceleration for exposure of the next shot is completed, whereas, as for the non-scanning direction, at the point where time $(T_{x5}+T_{x1})$ has elapsed from the exposure end point of the previous shot area, the acceleration/deceleration is completed, as is shown in FIG. 6C. And, when both expressions $T_{y1}=T_{x1}$ and $T_{y5}=T_{x5}$ are valid, the stepping operation is obviously completed earlier by $T_4$ than the beginning of synchronous control in settling time $T_2$ in the scanning direction. The locus of wafer stage WST at this point, is in a parabolic shape, as is shown in FIG. 5.

When the stepping operation in the non-scanning direction is completed earlier than the beginning of synchronous control in the settling time in the scanning direction as is described above, this means that wafer stage controller 78 and synchronous control system 80 are controlling the movement of wafer stage WST in both X and Y directions so that the movement operation (stepping operation) of wafer stage WST in the non-scanning direction is performed in parallel with the overscan and prescan operations in the scanning direction, so as to set the point where the velocity in the scanning direction becomes zero, more particularly, the X coordinate Bx of point B (Bx,By), which is where the deceleration ends and acceleration for exposing the next shot begins, to the $S_2$ side of the boarder of shots $S_1$ and $S_2$.

When the above stepping in the non-scanning direction is performed, jerk curve $J_x(t)$ is a quadrupoled jerk curve including two sets of jerk curves that have different shapes and are reversed, however, this jerk curve does not include an interval where the jerk is zero, as is shown by the dotted line in FIG. 6A. That is, in this case, as is also obvious from FIGS. 6B and 6C, acceleration $A_x(t)$ and velocity $V_x(t)$ are changing at all times in the non-scanning direction, which means that wafer stage WST is always moving. In other words, wafer stage WST performs the stepping operation without stopping, in parallel with the preliminary operation in the scanning direction.

Accordingly, wafer stage WST can perform the movement operation in between shots almost in minimal time, thus throughput can be improved.

As is previously described, prescan time includes settling time $T_2$ where reticle R is made to completely follow up wafer W. Therefore, acceleration/deceleration control in the non-scanning direction is preferably completed earlier than the starting point of settling time $T_2$. In order to make this possible, in the embodiment, as is obvious from FIG. 6C, wafer stage controller 78 and synchronous control system 80 start the movement operation of wafer stage WST in the non-axis direction during uniform velocity overscan time $T_4$ of wafer stage WST in the scanning direction, which comes after the end of exposure, so that the time to complete acceleration/deceleration control in the non-scanning direction can be reduced by uniform velocity overscan time $T_4$. That is, since the stepping operation in the non-scanning direction is completed prior to the start of synchronous control in the scanning direction, synchronous control system 80 can concentrate on synchronous control in the scanning direction during settling time $T_2$. In addition, because there is hardly any influence of deceleration in the non-scanning direction on synchronous control, synchronous settling time $T_2$ and the corresponding uniform velocity overscan time (post-settling time) $T_4$ can be reduced, thus also from this aspect, throughput can be improved.

Referring back to FIG. 3, while the above first mode movement operation is being performed, in step 108, main controller 50 waits for the acceleration of both stages RST and WST to be completed, as is previously described. And, when the above first mode movement operation has been completed, the decision in step 108 is affirmed, and hereinafter the process (including making decisions) in a loop consisting of steps 110→112→114→116→118→120→100→108 is repeated until the decision in step 116 is affirmed. With this operation, scanning exposure by alternate scanning is performed on each of the shots from the second shot in the $n^{th}$ row (in this case, the second shot in the first row) to the last shot in the $n^{th}$ row (in this case, the first row), and the pattern on reticle R is sequentially transferred onto the shots.

When the scanning exposure of the last shot in the first row is completed in the above manner, the decision made in step 116 turns affirmative, and the step proceeds to step 124.

In step 124, counter m is initialized to 1, whereas counter n is incremented by one (m→1, n→n+1).

In the next step, step 126, the decision is made whether the counter value n is larger than a final row number N or not, referring to counter n. In this case, n=2, therefore, the decision made in this step is negative, and the step proceeds to step 128, and after the configuration information of various types required to expose the first shot in the nth row (in this case, the second row) is transmitted to synchronous control system 80. Then, the step proceeds to step 130, where main controller 50 instructs synchronous control system 80 to perform movement of both stages RST and WST in a second mode (hereinafter also shortened as "the second mode movement"), and the step returns to step 108 where main controller 50 waits for both stages RST and WST to complete the acceleration and reach their target scanning velocity. While main controller 50 is waiting as above in step 108, synchronous control system 80 performs the second mode movement operation, which will now be described below.

The Second Mode Movement Operation

The second mode movement operation is the movement operation of both stages corresponding to the movement locus of point P between different rows, as is shown in the dashed line in FIG. 4. This movement operation is performed after the last shot in the rows excluding the last row (referred to as "shot A" for the sake of convenience) has been exposed until the first shot on a different (next) row (referred to as "shot B" for the sake of convenience) is to be exposed.

In this movement operation between different rows, the acceleration condition of the wafer before scanning exposure has to be matched with the acceleration condition of the reticle before scanning, therefore, the operation of the wafer stage has to be temporarily suspended, not only in the non-scanning direction but also in the scanning direction.

Therefore, as the sequence of the movement operation of wafer stage WST between shots A and B in the scanning direction, the following procedure is normally employed: uniform velocity overscan (post-settling) after completing exposure on shot A→movement to a position corresponding to the scanning starting position for exposure on shot A (a deceleration end position after exposure)→movement to a scanning starting position (acceleration starting position) for exposure on shot B→stop at the acceleration starting positions→acceleration→position settling before exposure. In this case, the jerk curve is a quadrupoled jerk curve, as in the conventional preliminary operation in between divided areas in the scanning direction described earlier in the description.

However, in the second mode movement operation in the embodiment, the above post-settling period after exposure on shot A is omitted, for the following reasons.

FIGS. 8A to 8D show a jerk curve $J_y(t)$, an acceleration curve $A_y(t)$, a velocity curve $V_y(t)$, and a displacement curve $P_y(t)$ of wafer stage WST in the scanning direction, respectively, from the point when deceleration after exposing the previous shot area has been completed in between shots in different rows, as the above shots A and B, with the horizontal axis showing the time.

Figure 8A:
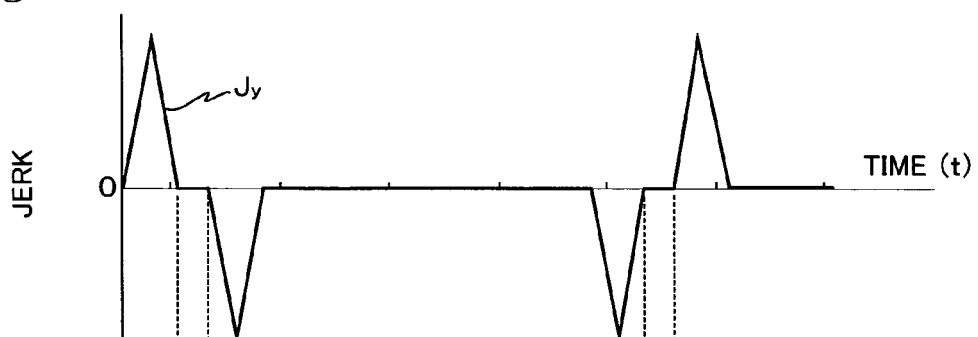
FIG. 8A is a view showing a jerk curve of a wafer stage during a second mode movement operation.
Figure 8B:
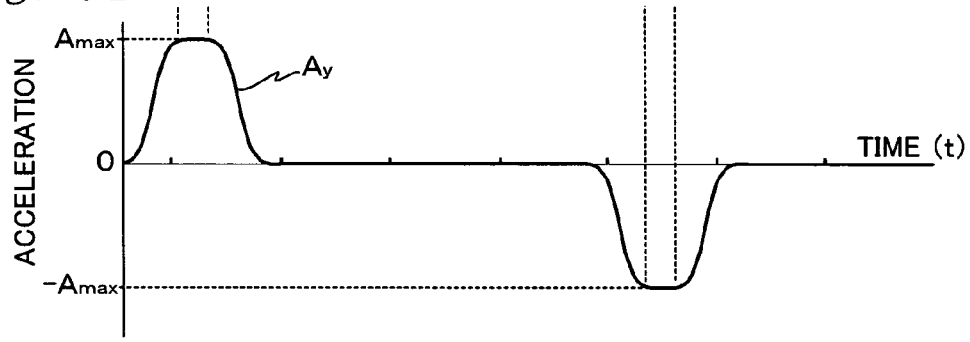
FIG. 8B is a view showing an acceleration curve of the wafer stage during the second mode movement operation.
Figure 8C:
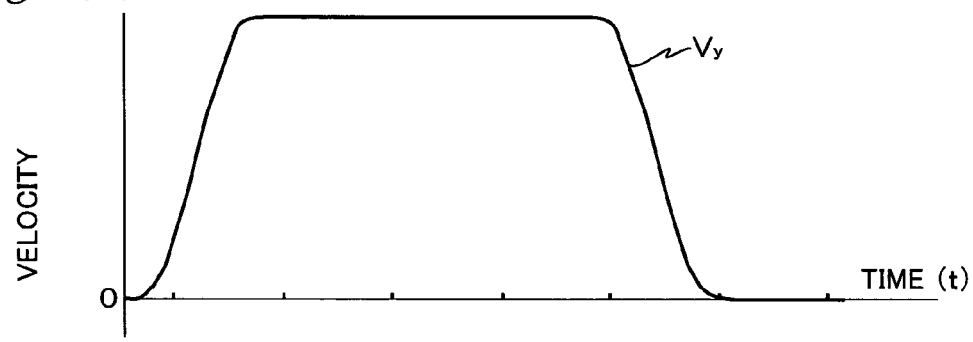
FIG. 8C is a view showing a velocity curve of the wafer stage during the second mode movement operation.
Figure 8D:
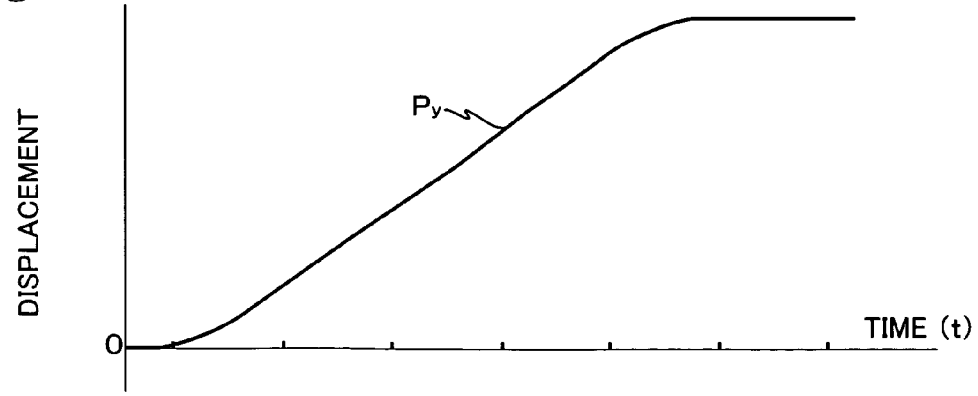
FIG. 8D is a view showing a displacement curve of the wafer stage during the second mode movement operation.
Figure 9A:
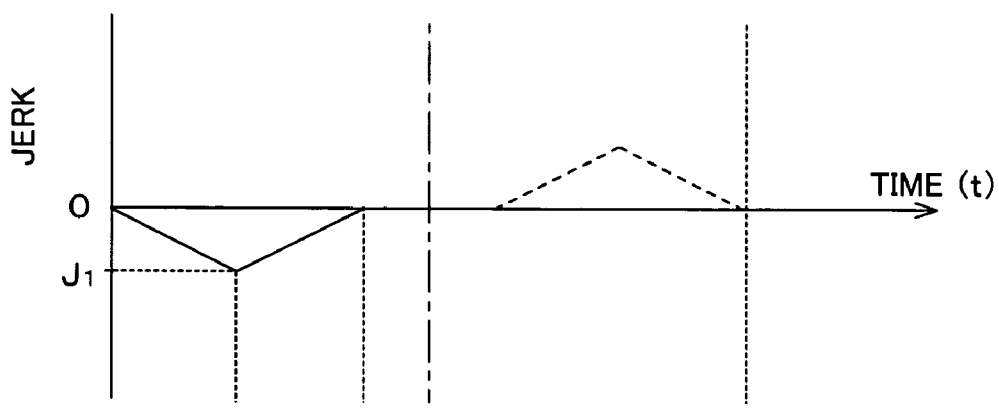
FIG. 9A is a view showing a jerk curve of a wafer stage in a scanning direction in a first scanning acceleration control method.
Figure 9B:
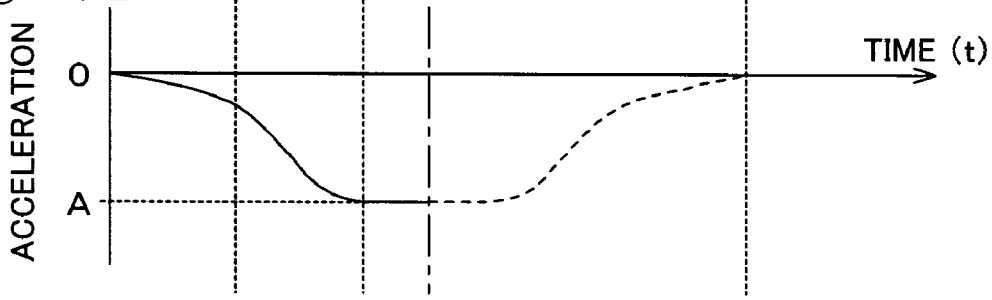
FIG. 9B is a view showing an acceleration curve of the wafer stage in a scanning direction.
Figure 9C:
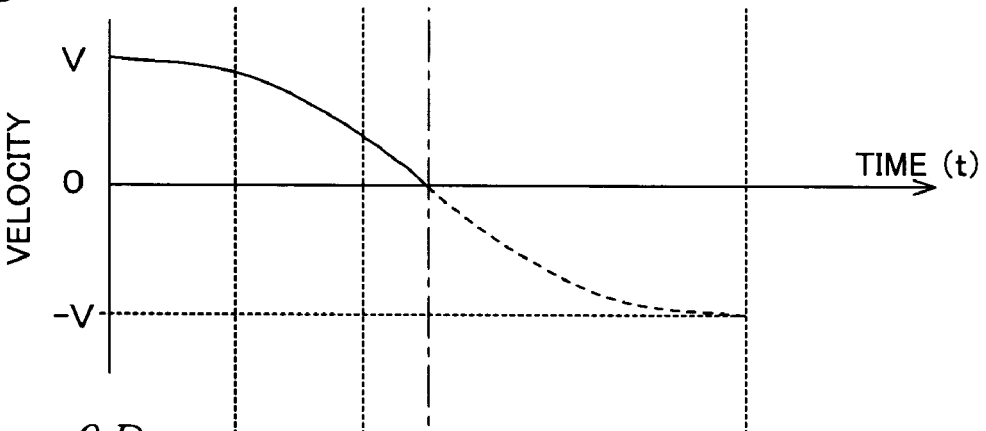
FIG. 9C is a view showing a velocity curve of the wafer stage in a scanning direction.
Figure 9D:
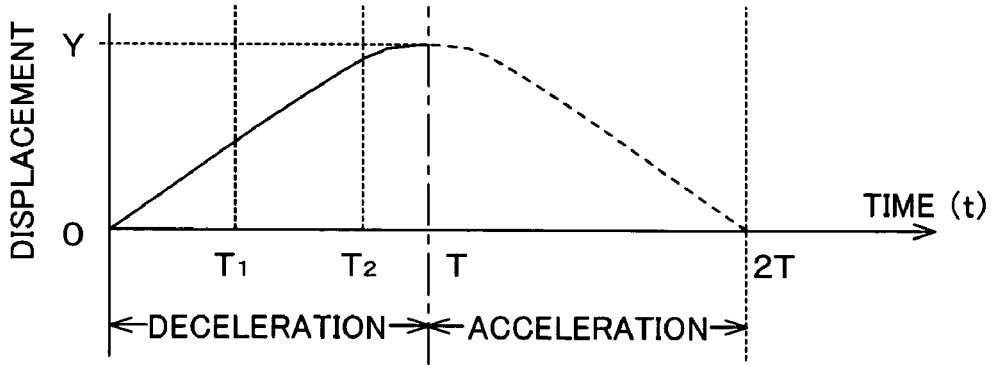
FIG. 9D is a view showing a displacement curve of the wafer stage in a scanning direction.

As is obvious from FIG. 8A, in the second move movement operation, as soon as the movement operation starts, a set of jerk curves containing reversed polarized symbols are formed that includes a jerk curve convex to the + side and a jerk curve convex to the − side, and an interval where jerk is zero, time $T_0$, is provided in between the two curves. A set of jerk curves containing reversed polarized symbols are also formed just before completing the movement, including a jerk curve convex to the − side and a jerk curve convex to the +side, and an interval where jerk is zero, time $T_0$, is provided in between the two curves. Therefore, the acceleration curve corresponding to the sets of the jerk curve is a curve having a trapezoidal shape as is shown in FIG. 8B, which shows that (the absolute value of) the maximum acceleration is suppressed, as is previously described. Such an operation can suppress the power necessary for acceleration during the movement operation of wafer stage WST between shots in different rows.

In this case, because the absolute value of the maximum acceleration $A_{max}$ is intentionally suppressed and time $T_0$ where the acceleration is constant is secured at two points, the above post-settling time was omitted so as to keep the time required for preliminary operation in the scanning direction from being extended more than necessary.

Omitting the post-settling time hardly has any adverse effect on the throughput. As is obvious from FIG. 4, even if the number of shots is 76, the above movement sequence between different rows is used only at nine points.

Incidentally, when wafer stage WST has moved to the deceleration end position after exposing shot A as is previously described, reticle stage RST can complete the movement to the scanning starting position. In this case, reticle stage can simply stay there until wafer WST begins acceleration before exposing shot B.

Although it is omitted in FIGS. 8A to 8D, after reticle stage RST stays at the scanning starting position, wafer stage WST begins acceleration in a similar manner described above referring to FIGS. 6A to 6B, and acceleration of reticle stage RST also begins in sync.

Referring back to FIG. 3, while synchronous control system is performing the above second mode movement operation, main controller 50 waits for both stages RST and WST to complete the acceleration in step 108, as is previously described. And, when the above second mode movement operation has been completed, the decision is step 108 is affirmed, and hereinafter the processes in step 108 and onward are repeatedly performed, until exposure of the first shot in the second row to the exposure of the last shot $S_M$ in the last row (the $N^{th}$ row) have been completed.

In the manner described above, the scanning exposure of a shot on wafer W and the stepping operation in between shots are repeatedly performed by complete alternate scan, and when the pattern of reticle R has been transferred onto shot $S_M$, which is the last shot on wafer W, the decision in step 126 is affirmed, and the series of processes in the routine is completed.

In the embodiment, scanning exposure is sequentially performed alternately, following the path shown in FIG. 4. In this case, since the number of rows to be exposed is an even number, exposure begins at shot $S_1$ in the lower left area and proceeds from left to right in the first row and then from right to left in the next row, due to alternate stepping. And when the exposure on shot $S_M$ in the upper left area has been completed, wafer stage WST moves to a predetermined wafer exchange position. Such operations are repeatedly performed in the scanning exposure, and when the above alternate scan is performed, the effective movement control of wafer stage WST in between shots described earlier is also performed, in between adjacent shots in the same row.

a. As is described in detail so far, in exposure apparatus 10 in the embodiment, after exposure is completed on a shot area on wafer W, main controller 50 sends configuration information on control parameters necessary for exposing the next shot area (refer to steps 120 and 128 in FIG. 3) to synchronous control system 80 that make up the stage control system, sometime before the stage control system (80, 33, and 78) begins deceleration of both stages RST and WST in the scanning direction for exposure of the next shot. Therefore, a control sequence for both stages performed by the stage control system (80, 33, and 78) can be employed that does not require stopping the operations of both stages RST and WST during the period after exposure is completed on a shot area on the wafer until the synchronous settling period of both stages RST and WST for exposure of the next shot begins. That is, the operation of both stages does not have to be suspended before acceleration for the stage control system to receive the configuration information on control parameters necessary to expose the next shot from the upper unit, and since the suspension time is not necessary, throughput can be improved. In this case, all necessary information is transmitted at the above timing, with the exception of information from reticle interferometer 30, laser interferometer system 76, and the focus leveling detection system that can be independently sampled at all times by synchronous control system 80. As a matter of course, due to the improvement in processing speed of synchronous control system 80, synchronous control system 80 can have a function to calculate necessary correction values based on information such as movable mirror bend. However, since the response speed necessary for synchronous is also increasing, the configuration information on parameters used for controlling the stages, such as calibration and initial setting configuration information, and user configuration information, are all preferably calculated in advance in main controller 50 (the upper unit) and the configuration information related to synchronous control made into a determinant converted to a state for ultimate high-speed processing, and then transmitted to synchronous control system 80, in order to achieve high-speed processing.

In exposure apparatus 10 in the embodiment, as is described above, the configuration information on control parameters necessary for exposing the next shot area is made to be sent to synchronous control system 80 after exposure is completed on a shot area on a wafer. However, if the arrangement of the hardware allows (for example, the processing speed of the synchronous control system is further enhanced) the above configuration information may be sent not after exposure of a shot area on the wafer is completed, but from while the exposure is being performed (the transmission of configuration information may begin during exposure). Furthermore, the present invention is not limited to this, and if the arrangement of the hardware allows as is described above, the transmission of the above configuration information may begin at any timing (for example, during synchronous control operation (during pre-settling) before exposure on the shot area is performed). When the information transmission begins during exposure or during the synchronous control operation as is described above, the arrangement is preferably employed so that the configuration information on control parameters necessary for exposing a plurality of shot areas from the next shot area onward is also sent.

b. In addition, in exposure apparatus 10 in the embodiment, the stage control system (80, 33, and 78) begins synchronous control of both stages RST and WST for exposure of the next shot, when decelerating both stages in the scanning direction after completing exposure of a shot area on wafer W. Therefore, synchronous settling of both stages is completed at a point earlier than when compared to, for example, the case when synchronous control begins after the deceleration of both stages is completed. Thus, the throughput can be improved due to the reduction in synchronous settling time.

c. In addition, in exposure apparatus 10 in the embodiment, the stage control system (80, 33, and 78) can complete the position setting of both stages RST and WST according to the configuration information before the synchronous settling period of both stages RST and WST prior to exposure of the next shot. Therefore, the settling time (synchronous settling time) of synchronous settling of both stages RST and WST performed prior to exposure can be reduced, which allows further improvement in throughput.

d. In addition, in exposure apparatus 10 in the embodiment, as is obvious from FIGS. 6A to 6D, the stage control system (80, 33, and 78) controls wafer stage WST (and reticle stage RST) in the scanning direction based on instruction values according to a jerk curve that is an inverse curve of polarized symbols, on preliminary operation where both stages RST and WST are accelerated after deceleration in the scanning direction in between shot areas in the same row in the non-scanning direction. That is, the acceleration curve of wafer stage WST in this case is a trapezoidal shape as is shown in FIG. 6B, therefore, the change in velocity becomes constant without any period where the velocity is zero as is shown in FIG. 6C, and alternate scan becomes possible, which makes it possible to reduce the time required for the above preliminary operation. Also, in this case, because the peak of the jerk curve (the maximum value of the absolute value of jerk, which is the temporal change rate of acceleration) can be suppressed as is shown in FIG. 6A, the ratio of the maximum acceleration to the average value of acceleration of wafer stage WST can be reduced, as well as suppress sudden change in acceleration and its frequency. Accordingly, throughput can be improved, and the power consumed by the drive system of wafer stage WST such as the linear motor can be suppressed.

e. In addition, in exposure apparatus 10 in the embodiment, according to instructions from main controller 50, the stage control system (80, 33, and 78) secures the post-settling period (uniform velocity overscan period) where both stages are moved in uniform velocity in the scanning direction after exposure of a shot area has been completed, so that the post-settling period is before the beginning of deceleration after exposure (refer to $T_4$ in FIG. 6C) when the movement operation between shot areas in the same row in the non-scanning direction perpendicular to the scanning direction is performed. Meanwhile, when the movement operation in different rows is performed, deceleration operation of both stages begins as soon as exposure of a shot area is completed (refer to FIG. 8B). Therefore, because there is no post-settling period during the movement operation in between different rows, throughput can be improved.

f. Furthermore, in exposure apparatus 10 in the embodiment, as is obvious from FIG. 6C, the stage control system (80, 33, and 78) controls both stages so that the preliminary operation performed after exposure of a shot area on wafer W is completed where both stages RST and WST are accelerated for exposure of the next shot after deceleration in the scanning direction and the movement operation in between shot areas in the non-scanning direction perpendicular to the scanning direction are simultaneously performed in parallel, and the movement operation of wafer stage WST in the non-scanning direction is completed before the synchronous settling period of both stages RST and WST prior to the exposure of the next shot area begins. Therefore, at least a part of the preliminary operation performed after a shot area on wafer W where both stages are accelerated for exposure of the next shot after deceleration in the scanning direction and the movement operation where wafer stage WST moves in between shot areas in the non-scanning direction can be overlapped, which allows an improvement in throughput compared with the case when acceleration operation of both stages in the scanning direction begins after the movement operation of the wafer stage in between shot areas in the non-scanning direction is completed. Also, in this case, the stage control system can concentrate on the synchronous settling of both stages during the synchronous settling period, therefore, the settling time can also be reduced.

In addition, when focusing on the stage device related to the embodiment, that is, wafer stage WST, its drive system, and its control system (80 and 78), the control system (80 and 78) concurrently performs the Y-axis direction (the first-axis direction) movement operation to accelerate wafer stage WST in the Y-axis direction after deceleration and the second-axis direction movement operation to move wafer stage WST in the X-axis direction (the second-axis direction) perpendicular to the Y-axis direction, thus wafer stage WST moves along a U-shaped or a V-shaped locus. During such movement, as is obvious from FIG. 6A, the Y-axis direction movement operation of wafer stage WST is controlled based on instruction values according to a jerk curve that is an inverse curve of polarized symbols. In this case, the acceleration curve of wafer stage WST is a trapezoidal shape as is shown in FIG. 6B, therefore, the change in velocity becomes constant without any period where the velocity is zero as is shown in FIG. 6C, which makes it possible to reduce the time required for the Y-axis direction movement operation. Also, in this case, because the peak of the jerk curve can be suppressed, the ratio of the maximum acceleration to the average value of acceleration of wafer stage WST can be reduced, as well as suppress sudden change in acceleration and its frequency. Accordingly, throughput can be improved, and the power consumed by wafer drive system 48 that drives wafer stage WST such as the linear motor can be suppressed. In this case, the stage control system controls the X-axis direction movement operation of the wafer stage, based on instruction values according to a jerk curve which is a quadrupoled jerk curve having at least two poles that are shaped differently (refer to FIG. 6A).

In the above embodiment, the case has been described where main controller 50 transmits configuration information (including configuration information on control parameters) of various types necessary for exposure of the next shot area, each time a shot area on wafer W is exposed. The present invention, however, is not limited to this, and in exposure apparatus 10 in the above embodiment, for example, instead of step 128 in FIG. 3, a processing step may be employed where main controller 50 transmits (delivers) the configuration information of various types necessary for exposure of all the shots in the next row in one command to synchronous control system 80, while the movement operation in between rows that has a relatively long interval of zero acceleration (movement in between rows for turning in peripheral shots) as is shown in FIG. 8B is being performed. In such a case, after exposure of the last shot area in an arbitrary row in the non-scanning direction on wafer W is completed, main controller 50 sends the configuration information of various types necessary for exposure of a plurality of shot areas in a different row to the stage control system (to be more precise, synchronous control system 80), while the stage control system (88, 33, and 78) performs movement control of both stages RST and WST to perform exposure of a first shot area in the different row.

Therefore, even when the time from completing exposure of a shot area on wafer W until the beginning of deceleration of both stages is short, and transmitting the configuration information on control parameters necessary for exposure of the next divided area in such a short time is difficult, a control sequence for both stages by the stage control system can be employed so that the operation of both stages is not suspended from the end of exposure to the synchronous settling time of both stages for exposure of the next shot area. Accordingly, because both stages do not have to be temporarily suspended before acceleration, the suspension time is no longer required, which can lead to an improvement in the throughput. Furthermore, in this case, the stage control system can start the synchronous control operation of both stages from the above deceleration in the scanning direction.

When main controller 50 transmits the configuration information of various types necessary for exposure of all the shots in the next row all in one command to synchronous control system 80 during the above movement operation in between rows (movement in between rows for turning in peripheral shots), all necessary information, with the exception of information from reticle interferometer 30, laser interferometer system 76, and the focus leveling detection system that can be independently sampled at all times by synchronous control system 80, is also preferably transmitted at the above timing, and the configuration information related to synchronous control is preferably made into a determinant converted to a state for ultimate high-speed processing, and then passed on to synchronous control system 80, in order to achieve high-speed processing. In addition, the stage control system is to preferably complete the position setting of both stages according to the configuration information before the synchronous settling time of both stages prior to exposure on each of the shot areas in the next row, for similar reasons as is previously described.

Other than the description so far, in exposure apparatus 10 in the above embodiment, when the memory of synchronous control system 80 has enough margin, main controller 50 may send all the configuration information on control parameters necessary to expose all the shot areas (for example, 76) on wafer W to synchronous control system 80 during the time after detection operation of arrangement information used for alignment with predetermined points in each shot area of the wafer such as the wafer alignment described earlier is completed until exposure of the first shot begins. In this case, the steps 120 and 128 referred to in FIG. 3 will not be necessary. In addition, in this case, the above transmittance processing of configuration information on control parameters will not be required during the exposure processing period after the beginning of exposure of the first shot. Therefore, the stage control system can employ a control sequence for both stages where the operation of both stages are not suspended from the beginning of exposure of the first shot on wafer W until exposure of the last shot has been completed, which can improve the throughput. Also, the stage control system is to preferably complete the position setting of both stages according to the configuration information before the synchronous settling time of both stages prior to exposure on each of the shot areas, for similar reasons as is previously described.

In the case of faster processing speed in synchronous control system 80, the information may be transmitted in parallel, while synchronous control system 80 is performing synchronous control operation of both stages. Accordingly, the timing to perform the transmittance of information between main controller 50 and synchronous control system 80 described so far may be selected and set, judging totally from the memory capacity of the synchronous control system, the high-speed processing capacity (processing speed), design simplicity of the synchronous control system, and the like.

In exposure apparatus 10 in the above embodiment, in addition to the above transmittance processing of the configuration information of control parameters that has been devised, various measures as is described in items b. through f. are devised at the same time, especially regarding control of both stage units. The present invention, however, is not limited to this. That is, the above devised items a., and b. through f. may be performed alone, or may be combined.

In the above embodiment, the acceleration of wafer W in the non-scanning direction begins during uniform velocity movement in the scanning direction, which is performed after scanning exposure of a shot has been completed. The present invention, however, is not limited to this, and the acceleration of wafer W in the non-scanning direction may begin during the deceleration of wafer W. In this case, before scanning exposure of the next shot, wafer W is accelerated along a direction crossing the scanning direction and the movement velocity in the scanning direction is set to a velocity according to the sensitivity characteristics of wafer W, which simplifies the control during exposure to maintaining the velocity and controlling the reticle in sync.

In the scanning exposure method based on a step-and-scan method that transfers the pattern of reticle R onto a plurality of shot areas $S_1$, $S_2$, ... and so forth on wafer W performed in exposure apparatus 10 in the above embodiment, wafer W is preferably moved without stopping on scanning exposure between any two shot areas on wafer W on which the pattern of reticle R is transferred by the reciprocal movement of reticle R, such as shots $S_1$ and $S_2$. This is because, in this case, since wafer W does not suspend its movement in between the scanning exposure of adjacent shot areas on which the pattern of reticle R is sequentially transferred, such as shots $S_1$ and $S_2$, the throughput further improves on this point. From this point, wafer W is more preferably moved so that the velocity component in at least one of the scanning direction and non-scanning direction of wafer W is not zero until the scanning exposure of the last shot area on wafer W on which the pattern of reticle R is to be transferred has been completed. In such a case, because the wafer does not consequently stop its movement while scanning exposure based on a step-and-scan method is being performed on all the plurality of shot areas, the throughput is improved to the utmost.

As it can be easily imagined from, for example, FIGS. 6A and 6B, during the movement in between shots, even when the scanning velocity and the acceleration time are fixed in the scanning direction of the wafer stage and reticle stage, when jerk internal ratio (ratio of time when jerk is not zero with respect to acceleration time (or deceleration time)) changes, the maximum momentary acceleration also changes accordingly.

Focusing on such points, the inventors of the present invention formulated the jerk, acceleration, velocity, and displacement curves of the stages in the scanning direction during the movement in between shots. Following is a description on this issue.

First of all, the case is described when the profile of deceleration and acceleration similar to that of the first mode movement operation in the above embodiment has a symmetric shape (hereinafter referred to as "the first scanning acceleration control method"). FIGS. 9A to 9D show a jerk curve, an acceleration curve, a velocity curve, and a displacement curve of a wafer stage in the scanning direction, respectively.

As input variables, scanning velocity V[m/s], acceleration time T[s], and jerk internal ratio R are specified.

However, instead of acceleration time T or jerk internal ratio R, maximum momentary acceleration A can also be specified.

In this case, the relation between A, V, T, and R can be given in equations (1) and (2) below.

$$T = -\frac{V}{\left(1 - \frac{R}{2}\right)A} \qquad (1)$$

$$R = 2 \cdot \left(1 - \frac{V}{AT}\right) \qquad (2)$$

The internal variables in this case are a first knee point time $T_1$, a second knee point time $T_2$, and a jerk maximum value (former) $J_1$, and can be expressed as in equations (3), (4), and (5), respectively.

$$T_1 = \frac{1}{2}RT \qquad (3)$$

$$T_2 = RT \qquad (4)$$

$$J_1 = -2 \cdot \frac{V}{\left(1 - \frac{1}{2}R\right)RT^2} \qquad (5)$$

In this case, from equation (4), jerk internal ratio R is $R = T_2/T$.

In this case, jerk, acceleration, velocity, and displacement in each interval are as follows:

The First Interval ($0 \leq t \leq T_1$)

$$Jerk(t) = 2 \cdot \frac{J_1}{RT} t \tag{6}$$

$$Acc(t) = \frac{J_1}{RT} t^2 \tag{7}$$

$$Vel(t) = \frac{1}{3} \cdot \frac{J_1}{RT} t^3 + V \tag{8}$$

$$Pos(t) = \frac{1}{12} \cdot \frac{J_1}{RT} t^4 + Vt \tag{9}$$

The Second Interval ($T_1 \leq t \leq T_2$)

$$Jerk(t) = -2 \cdot \frac{J_1}{RT} t + 2 J_1 \tag{10}$$

$$Acc(t) = -\frac{J_1}{RT}(t - RT)^2 + \frac{1}{2} J_1 RT \tag{11}$$

$$Vel(t) = -\frac{1}{3} \cdot \frac{J_1}{RT}(t - RT)^3 + \frac{1}{2} J_1 RT \left(t - \frac{1}{2} RT\right) + V \tag{12}$$

$$Pos(t) = -\frac{1}{12} \cdot \frac{J_1}{RT}(t - RT)^4 + \frac{1}{4} J_1 RT \left(t - \frac{1}{2} RT\right)^2 + Vt + \frac{1}{96} J_1 R^3 T^3 \tag{13}$$

The Third Interval ($T_2 \leq t \leq T$)

$$Jerk(t) = 0 \tag{14}$$

$$Acc(t) = \frac{1}{2} J_1 RT \tag{15}$$

$$Vel(t) = \frac{1}{2} J_1 RT \left(t - \frac{1}{2} RT\right) + V \tag{16}$$

$$Pos(t) = \frac{1}{4} J_1 RT \left(t - \frac{1}{2} RT\right)^2 + Vt + \frac{1}{96} J_1 R^3 T^3 \tag{17}$$

The Fourth Interval ($T \leq t \leq 2T$)

$$Jerk(t) = -Jerk(2T-t) \tag{18}$$

$$Acc(t) = Acc(2T-t) \tag{19}$$

$$Vel(t) = -Vel(2T-t) \tag{20}$$

$$Pos(t) = Pos(2T-t) \tag{21}$$

According to the first scanning acceleration control method, since there is no scan axis suspension time from the end of deceleration to the beginning of acceleration as is previously described, throughput can be improved, and also the maximum momentary acceleration can be kept under two times the average acceleration, which allows downsizing in the actuators and amps, and the degree of freedom in design can be improved. Also, in this case, on the reticle stage side, in addition to such points, the positional shift of the reticle can be effectively controlled.

Next, the case is described when the profile of deceleration and acceleration has an asymmetric shape (hereinafter referred to as "the second scanning acceleration control method"). FIGS. 10A to 10D show a jerk curve, an acceleration curve, a velocity curve, and a displacement curve of a wafer stage in the scanning direction, respectively.

In this case, as input variables, scanning velocity V[m/s], deceleration time $T_D$S], acceleration time $T_A$[S], deceleration jerk internal ratio $R_D$, and acceleration jerk internal ratio $R_A$ are specified.

However, instead of deceleration time $T_D$, acceleration time $T_A$, or jerk internal ratios $R_D$, and $R_A$, maximum momentary acceleration A can also be specified.

In this case, the relation between A, V, $T_A$, $R_A$, and $R_D$ can be given in equations (22), (23), and (24) below.

$$T_D = -\frac{V}{\left(1 - \frac{R_D}{2}\right)A} \tag{22}$$

$$T_A = -\frac{V}{\left(1 - \frac{R_A}{2}\right)A} \tag{23}$$

$$R_A = 2 \cdot \left(1 - \frac{V}{A T_A}\right) \tag{24}$$

Following are the internal variables in this case, respectively shown in equations (25) through (38) below: deceleration jerk internal ratio $R_D$, a deceleration stroke $L_D$[m], an acceleration stroke $L_A$[m], an uniform velocity time $T_0$[s], a first knee point time $T_1$, a second knee point time $T_2$, a deceleration ending acceleration starting time $T_3$, a fourth knee point time $T_4$, a fifth knee point time $T_5$, an acceleration ending time T', an elapse time $t_s$[s] from the beginning of deceleration, a remaining time $t_R$[s] until the end of acceleration, a jerk maximum value (on deceleration) $J_1$[m/s$^3$], and a jerk maximum value (on acceleration) $J_2$[m/s$^3$].

$$R_D = 2 - \frac{T_A}{T_D}(2 - R_A) \tag{25}$$

$$L_D = \frac{1}{2} V T_D \left(1 + \frac{1}{2} R_D\right) - \frac{1}{48} \cdot \frac{V T_D R^3}{\left(1 - \frac{1}{2} R_D\right)} \tag{26}$$

$$L_A = \frac{1}{2} V T_A \left(1 + \frac{1}{2} R_A\right) - \frac{1}{48} \cdot \frac{V T_A R^3}{\left(1 - \frac{1}{2} R_A\right)} \tag{27}$$

$$T_0 = \frac{L_A - L_D}{V} \tag{28}$$

$$T_1 = \frac{1}{2} R_D T_D + T_0 \tag{29}$$

$$T_2 = R_D T_D + T_0 \tag{30}$$

$$T_3 = T_0 + T_D \tag{31}$$

$$T_4 = T_3 + (1 - R_A) T_A \tag{32}$$

$$T_5 = T_3 + \left(1 - \frac{1}{2} R_A\right) T_A \tag{33}$$

$$T' = T_0 + T_D + T_A \tag{34}$$

$$t_S = t - T_0 \tag{35}$$

$$t_R = T' - t \tag{36}$$

$$J_1 = -2 \cdot \frac{V}{\left(1 - \frac{1}{2} R_D\right) R_D T_D^2} \tag{37}$$

-continued $$J_2 = 2 \cdot \frac{V}{\left(1 - \frac{1}{2}R_A\right)R_A T_A^2} \quad (38)$$

In this case, deceleration jerk internal ratio $R_D$ is $R_D=(T_2-T_0)/(T_3-T_0)$, and acceleration jerk internal ratio $R_A$ is $R_A=(T'-T_4)/(T'-T_3)$.

In this case, jerk, acceleration, velocity, and displacement in each interval are as follows:

The First Interval ($0 \leq t \leq T$)

$$\text{Jerk}(t)=0 \quad (39)$$

$$\text{Acc}(t)=0 \quad (40)$$

$$\text{Vel}(t)=V \quad (41)$$

$$\text{Pos}(t)=Vt \quad (42)$$

The Second Interval ($T_0 \leq t \leq T_1$)

$$\text{Jerk}(t) = 2 \cdot \frac{J_1}{R_D T_D} t_S \quad (43)$$

$$\text{Acc}(t) = \frac{J_1}{R_D T_D} t_S^2 \quad (44)$$

$$\text{Vel}(t) = \frac{1}{3} \cdot \frac{J_1}{R_D T_D} t_S^3 + V \quad (45)$$

$$\text{Pos}(t) = \frac{1}{12} \cdot \frac{J_1}{R_D T_D} t_S^4 + Vt \quad (46)$$

The Third Interval ($T_1 \leq t \leq T_2$)

$$\text{Jerk}(t) = -2 \cdot \frac{J_1}{R_D T_D} t_S + 2J_1 \quad (47)$$

$$\text{Acc}(t) = -\frac{J_1}{R_D T_D}(t_S - R_D T_D)^2 + \frac{1}{2}J_1 R_D T_D \quad (48)$$

$$\text{Vel}(t) = -\frac{1}{3} \cdot \frac{J_1}{R_D T_D}(t_S - R_D T_D)^3 + \frac{1}{2}J_1 R_D T_D\left(t_S - \frac{1}{2}R_D T_D\right) + V \quad (49)$$

$$\text{Pos}(t) = -\frac{1}{12} \cdot \frac{J_1}{R_D T_D}(t_S - R_D T_D)^4 + \frac{1}{4}J_1 R_D T_D\left(t_S - \frac{1}{2}R_D T_D\right)^2 + Vt + \frac{1}{96}J_1 R_D^3 T_D^3 \quad (50)$$

The Fourth Interval ($T_2 \leq t \leq T_3$)

$$\text{Jerk}(t) = 0 \quad (51)$$

$$\text{Acc}(t) = \frac{1}{2}J_1 R_D T_D \quad (52)$$

$$\text{Vel}(t) = \frac{1}{2}J_1 R_D T_D\left(t_S - \frac{1}{2}R_D T_D\right) + V \quad (53)$$

$$\text{Pos}(t) = \frac{1}{4}J_1 R_D T_D\left(t_S - \frac{1}{2}R_D T_D\right)^2 + Vt + \frac{1}{96}J_1 R_D^3 T_D^3 \quad (54)$$

The Fifth Interval ($T_3 \leq t \leq T_4$)

$$\text{Jerk}(t) = 0 \quad (55)$$

$$\text{Acc}(t) = -\frac{1}{2}J_2 R_A T_A \quad (56)$$

$$\text{Vel}(t) = \frac{1}{2}J_2 R_A T_A\left(t_R - \frac{1}{2}R_A T_A\right) - V \quad (57)$$

$$\text{Pos}(t) = \frac{1}{4}J_2 R_A T_A\left(t_R - \frac{1}{2}R_A T_A\right) + Vt_R - \frac{1}{96}J_2 R_A^3 T_A^3 \quad (58)$$

The Sixth Interval ($T_4 \leq t \leq T_5$)

$$\text{Jerk}(t) = -2 \cdot \frac{J_2}{R_A T_A} t_S + 2J_2 \quad (59)$$

$$\text{Acc}(t) = \frac{J_2}{R_A T_A}(t_R - R_A T_A)^2 - \frac{1}{2}J_2 R_A T_A \quad (60)$$

$$\text{Vel}(t) = \frac{1}{3} \cdot \frac{J_2}{R_A T_A}(t_R - R_A T_A)^3 + \frac{1}{2}J_2 R_A T_A\left(t_R - \frac{1}{2}R_A T_A\right) - V \quad (61)$$

$$\text{Pos}(t) = \frac{1}{12} \cdot \frac{J_2}{R_A T_A}(t_R - R_A T_A)^4 - \frac{1}{4}J_2 R_A T_A\left(t_R - \frac{1}{2}R_A T_A\right)^2 + Vt_R - \frac{1}{96}J_2 R_A^3 T_A^3 \quad (62)$$

The Seventh Interval ($T_5 \leq t \leq T'(=T_6)$)

$$\text{Jerk}(t) = 2 \cdot \frac{J_2}{R_A T_A} t_R \quad (63)$$

$$\text{Acc}(t) = -\frac{J_2}{R_A T_A} t_R^2 \quad (64)$$

$$\text{Vel}(t) = \frac{1}{3} \cdot \frac{J_2}{R_A T_A} t_R^3 - V \quad (65)$$

$$\text{Pos}(t) = -\frac{1}{12} \cdot \frac{J_2}{R_A T_A} t_R^4 + Vt_R \quad (66)$$

Figure 10A:
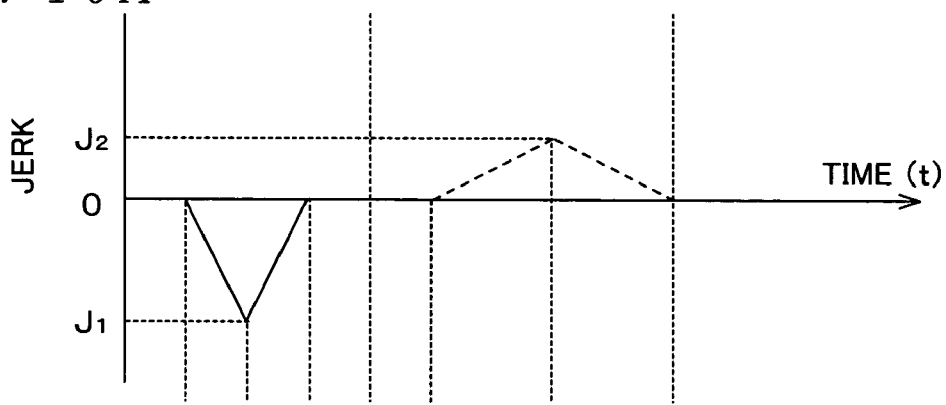
FIG. 10A is a view showing a jerk curve of a wafer stage in a scanning direction in a second scanning acceleration control method.
Figure 10B:
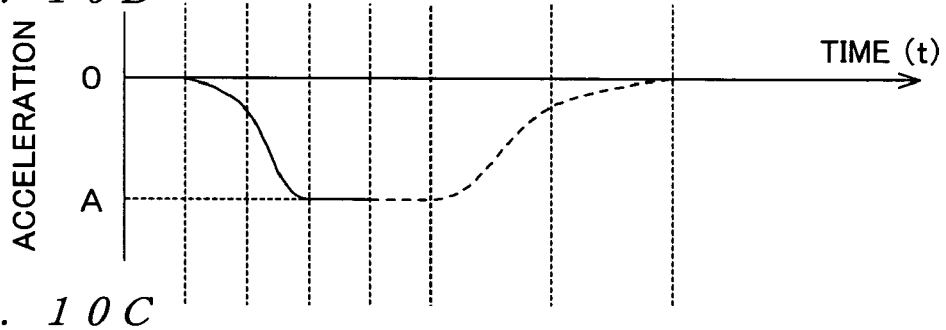
FIG. 10B is a view showing an acceleration curve of the wafer stage in a scanning direction.
Figure 10C:
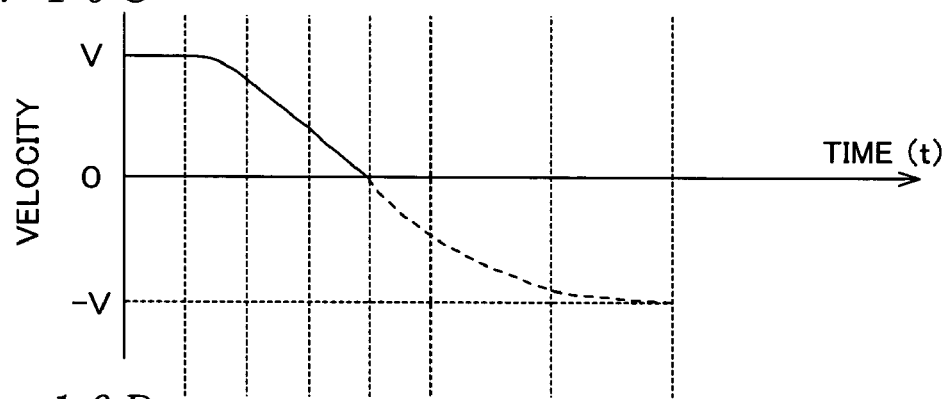
FIG. 10C is a view showing a velocity curve of the wafer stage in a scanning direction.
Figure 10D:
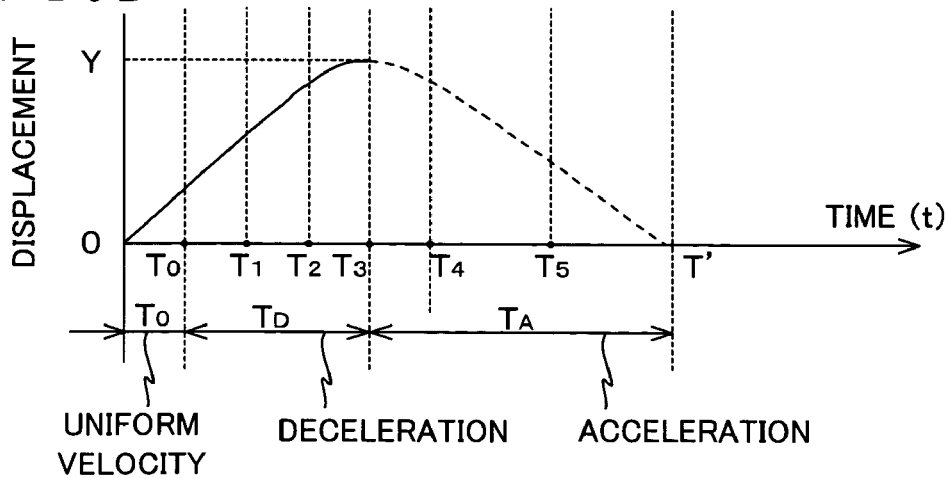
FIG. 10D is a view showing a displacement curve of the wafer stage in a scanning direction.

In the second scanning acceleration control method, which is formulized as is shown above, the acceleration curve Acc(t) is in a trapezoidal shape that has a mountain as is shown in FIG. 10B, and the jerk curve is an inverse curve of polarized symbols as is shown in FIG. 10A, likewise the first scanning acceleration control method previously described. However, the profile of deceleration and acceleration is asymmetric. That is, the shape of the jerk curve in the deceleration range and the acceleration range is different. In this case, in the deceleration range, deceleration is performed in a large jerk with consideration of throughput, whereas in the acceleration range before exposure, the jerk is kept small in consideration of reducing the following synchronous settling period. However, in order to prevent a difference from occurring in the strokes (corresponding to displacement) in the deceleration range and the acceleration range due to the different jerks, that is, in order to make the scanning starting position coincide with the scanning ending position on alternate scanning, uniform velocity overscan time $T_O$ performed before starting deceleration is set longish to make adjustments. With such an arrangement, the acceleration ending position of both stages can be made to coincide with a predetermined target position, and the control delay at the acceleration ending position and the synchronous error of both stages due to control delay can be suppressed, which makes it possible to reduce the synchronous settling time before exposure.

Accordingly, in exposure apparatus 10 in the first embodiment previously described, the second scanning acceleration method may be applied to the scanning direction control of the wafer stage WST and reticle stage RST during the first mode movement operation. When the second scanning acceleration method is applied, the maximum value of the jerk before exposure is suppressed, therefore, the synchronous accuracy between the reticle stage and the wafer stage improves, and throughput can be improved due to the reduction in synchronous settling time. Furthermore, the uniform velocity overscan time can be set longish, which allows sufficient time for main controller 50 to transmit configuration information of various types to synchronous control system 80. This means that more information can be transmitted compared to the first embodiment, and based on the information, a more accurate synchronous control of the reticle and the wafer can be performed.

When employing the first scanning acceleration control method or the second first scanning acceleration control method, in both cases, the stage control system can control the wafer stage based on instruction values according to a quadrupoled jerk curve during the preliminary operation in between divided areas in different rows in the non-scanning direction. In this case, the quadrupoled jerk curve has at least two poles that are shaped differently.

In addition, in the various methods described so far of controlling both stages, the stage control system can perform the movement operation in between shot areas to move the wafer stage in the non-scanning direction, based on instruction values according to a quadrupoled jerk curve having at least two poles that are shaped differently, in parallel with the preliminary operation of both stages in between the shot areas.

Meanwhile, mainly from the viewpoint of improving the throughput on double exposure, the inventor of the present invention (Nishi) has made proposals on an exposure apparatus that comprises two wafer stages (substrate stages) on which exposure operation is being performed on one of the stages while on the other stage other operations such as wafer exchange or wafer alignment is being performed in parallel (refer to Japanese Patent Application Laid-open Nos. 10-163097 and 10-163098 and the corresponding U.S. Pat. Nos. 6,400,441 and 6,341,007). When the exposure apparatus described in the above publications and the corresponding U.S. Patents is used not in double exposure but in a normal exposure, the throughput will obviously improve further than when double exposure is performed. In addition, when the scanning exposure method described in the above first embodiment is employed in the exposure apparatus described in the above publications and the corresponding U.S. Patents, the throughput can be further improved in both normal exposure and double exposure. The disclosures of each of the above U.S. Patents are fully incorporated herein by reference.

The configuration information transmitted to units such as synchronous control system 80 from an upper unit such as main controller 50, can include information related to error control of each mechanism portion during stage movement, as is previously described. The following second embodiment has as its object to positively and effectively use information, such as the above information related error control.

Second Embodiment

Next, a second embodiment related to the present invention is described, referring to FIGS. 11 to 15.

Figure 11:
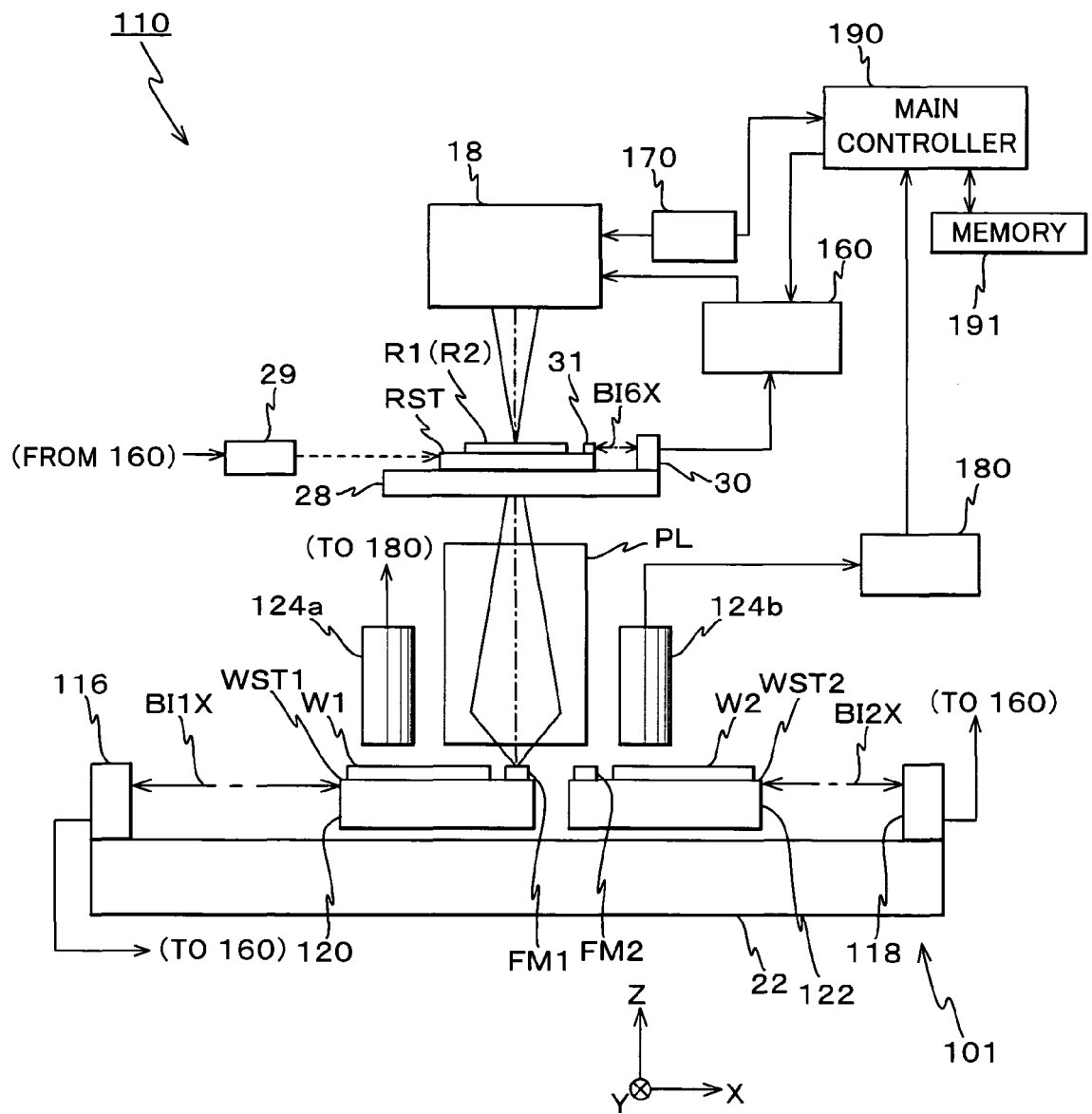
FIG. 11 is a view showing an entire structure of an exposure apparatus in a second embodiment.

FIG. 11 shows an entire configuration of an exposure apparatus 110 related to the second embodiment. Parts that are the same or equivalent to those described in the first embodiment are designated with the same reference numerals, and the description thereabout is briefly made or is entirely omitted. Exposure apparatus 110 is a scanning exposure type projection exposure apparatus based on the so-called step-and-scan method.

Exposure apparatus 110 comprises the following parts: a stage device 101 comprising two wafer stages WST1 and WST2 that serve as an object stage holding wafers W1 and W2 as objects, respectively, and independently move in a two-dimensional direction; a projection optical system PL arranged above stage device 101; a reticle drive mechanism which drives a reticle R1 (or R2) serving as a mask above projection optical system PL mainly in a predetermined scanning direction, in this case, a Y-axis direction (a direction perpendicular to the page surface in FIG. 11); an illumination optical system 18 which illuminates reticle R1 (or reticle R2) from above; a control system for these parts, and the like.

Stage device 101 comprises the following parts: a supporting bed 22 that make up a frame portion (not shown); wafer stages WST1 and WST2, disposed on supporting bed 22 and are movable within an XY plane; and an interferometer system for measuring the position of wafer stages WST1 and WST2.

Wafer stages WST1 and WST2 are each supported by levitation via a clearance of around several μm to the upper surface of supporting bed 22 by gas hydrostatic pressure bearings (not shown) provided on the bottom surface of the wafer stages. Wafer stages WST1 and WST2 are driven independently and freely in an XY two-dimensional plane by a wafer stage drive system including actuators such as an X linear motor and a Y linear motor, or a planar motor. The wafer stage drive system operates under the control of a stage controller 160 shown in FIG. 11.

On wafer stages WST1 and WST2, wafers W1 and W2 are fixed, respectively, by electrostatic chucking or vacuum chucking via a wafer holder (not shown). The wafer holder is driven finely in a Z-axis direction perpendicular to the XY plane and in the direction of inclination with respect to the XY plane by a leveling drive mechanism (not shown), which is similar to leveling mechanism 58 described earlier in the description. In addition, on the upper surface of wafer stages WST1 and WST2, fiducial mark plates FM1 and FM2 on which various types of fiducial marks are formed are arranged at almost the same height as wafers W1 and W2, respectively. These fiducial mark plates FM1 and FM2 are used, for example, when detecting the reference position of each wafer stage.

Figure 12:
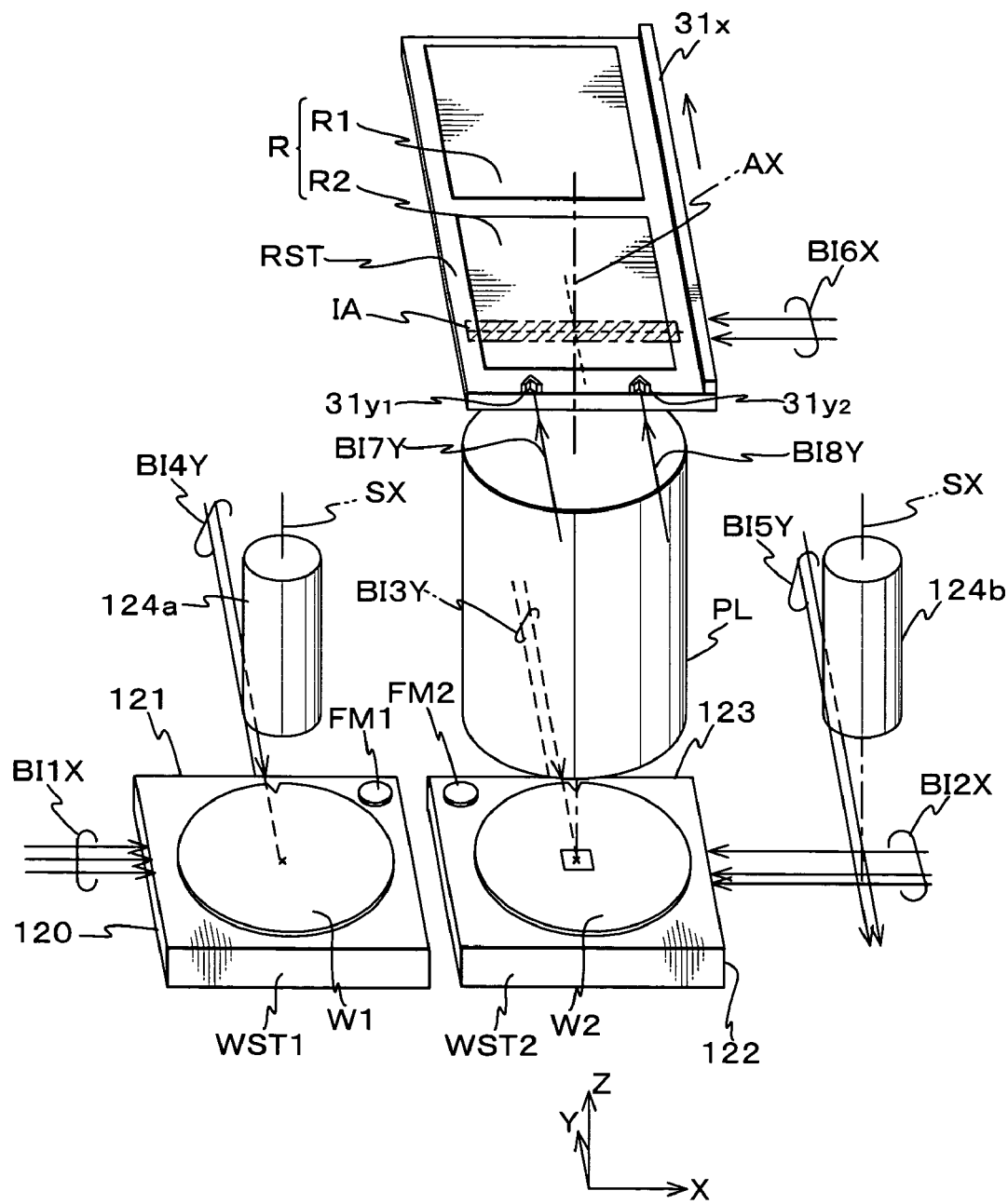
FIG. 12 is a perspective view showing a positional relation between two wafer stages, a reticle stage, a projection optical system, and an alignment detection system.

In addition, as is shown in FIG. 12, a surface 120 on one end of the X-axis direction (the left side surface in FIG. 11) and a surface 121 on one end of the Y-axis direction (the surface located in depth of the page surface in FIG. 11) of wafer stage WST1 are polished into a reflection surface.

Likewise, in wafer stage WST2, a surface 122 on the other end of the X-axis direction (the right side surface in FIG. 11) and a surface 123 on one end of the Y-axis direction are polished into a reflection surface. On these reflection surfaces, interferometer beams of each length measuring axis (such as BI1X, BI2X) that structures an interferometer system (to be described later) are incident, and the beams reflected off the surfaces are received by each interferometer to measure the displacement of each reflection surface from their reference position (normally, a fixed mirror is disposed on the side surface or the projection optical system or the alignment detection system as a reference surface), and based on the results the two dimensional position for both wafer stages WST1 and WST2 is measured. The structure of the length measuring axis of the interferometer system will be described later in the description.

As is shown in FIG. 11, on both sides of projection optical system PL in the X-axis direction, alignment detection systems 124a and 124b based on the off-axis method that have the same functions are arranged spaced equally apart from the optical axis center (coincides with the projection center of the reticle pattern image) of projection optical system PL. The alignment systems 124a and 124b have three types of alignment sensors; the LSA (Laser Step Alignment) system, the FIA (Filed Image Alignment) system, and the LIA (Laser Interferometric Alignment) system, and the position of the fiducial marks on the fiducial mark plate and the alignment marks on the wafer can be measured in the XY two-dimensional direction.

The LSA system is a most commonly used sensor that measures a mark position by using the diffracted and scattered light generated from irradiating a laser beam on the mark, and is widely used in process wafers from the past. The FIA system is a sensor that measures a mark position by image processing a mark image, which is obtained from irradiating the mark with a broadband (broad bandwidth) light such as a halogen lamp, and is used effectively on aluminum layers or asymmetric marks on the wafer surface. Also, the LIA system is a sensor that detects positional information on a mark from a phase of two diffraction lights made to interfere by irradiating laser beams of a slightly different frequency from two directions on a diffraction grating mark, and is used effectively on small steps or uneven surfaces on the wafer.

In the second embodiment, these three types of alignment sensors are appropriately used to suit their purposes, in order to perform operations such as the so-called search alignment where the rough position of the wafer is measured by detecting the position of a linear mark at three points on a wafer or the fine alignment where the accurate position of each shot area on the wafer is measured.

In this case, alignment detection system 124a is used to measure the position of the alignment marks on wafer W1 held on wafer stage WST1 and the fiducial marks formed on fiducial mark plate FM1. Also, alignment detection system 124b is used to measure the position of the alignment marks on wafer W2 held on wafer stage WST2 and the fiducial marks formed on fiducial mark plate FM2.

The information from each alignment sensor that structures the alignment detection systems 124a and 124b is converted into digital signals (A/D conversion) by an alignment controller 180, and the waveform signals are processed to detect the mark position. The results are sent to a main controller 190, which gives instructions to stage controller 160 on, for example, synchronous position correction on exposure.

In addition, although it is omitted in the drawings, in each of the projection optical system PL, and alignment detection systems 124a and 124b, an auto-focus/auto-leveling (AF/AL) measurement mechanism to find the focusing point like the one disclosed in the above Japanese Patent Application Laid-open No. 10-163098 and the corresponding U.S. Pat. Nos. 6,400,441 and 6,341,007 is provided.

Next, the reticle drive mechanism will be described, referring to FIGS. 11 and 12.

The reticle drive mechanism comprises the following parts: a reticle stage RST that can move on reticle base supporting bed 28 in the XY two-dimensional direction holding reticles R1 and R2; a drive system 29 made up of linear motors or the like (not shown) that drive reticle stage RST; and a reticle laser interferometer 30 which measures the position of reticle stage RST via a movable mirror 31 fixed on reticle stage RST.

More particularly, as is shown in FIG. 12, two reticles R1 and R2 can be placed in series on reticle stage RST in the scanning direction (the Y-axis direction). Such reticle stage RST is supported by levitation on reticle base supporting bed 28 via a gas hydrostatic pressure bearing or the like (not shown), and can be finely driven in the X-axis direction, finely rotated in the θz direction, and scanned in the Y-axis direction by drive system 29. Incidentally, drive system 29 is a mechanism that uses a linear motor as its drive source, however, for the sake of convenience in the drawing and the description, it is shown simply as a block in FIG. 11. In this case, for example, when double exposure is performed, reticles R1 and R2 on reticle stage RST are selectively used, and both reticles can be synchronously scanned with the wafer side.

On reticle stage RST, on the edge portion on the other side of the X-axis direction (+X side), a planar parallel movable mirror 31x made of the same material as reticle stage RST (such as ceramics) is provided extending in the Y-axis direction, and a surface of planar parallel movable mirror 31x on the other side of the X-axis direction is polished into a reflection surface. Interferometer beams from an interferometer (not shown) indicated as length measuring axis BI6X are irradiated on the reflection surface of movable mirror 31x, and the interferometer receives the light reflected off the reflection surface and measures the relative displacement to the reference surface, in order to measure the position of reticle stage RST. The interferometer having length measuring axis BI6X as its axis, actually has two interferometer optical axes, with which independent measurement can be performed, and the position of the reticle stage in the X-axis direction and the yawing amount can be measured. The measurement values of the interferometer having length measuring axis BI6X as its axis are used for controlling the rotation of reticle stage RST in a direction to cancel the relative rotation (rotational error) between the reticle and the wafer and to perform synchronous control in the X-axis direction, based on the yawing information and the X position information of wafer stages WST1 and WST2 from interferometers 116 and 118 on the wafer side that have length measuring axes BI1X and BI2X.

Meanwhile, on the other end of the Y-axis direction (the end close to the page surface in FIG. 11, the Y-axis direction being the scanning direction of reticle stage RST), a pair of corner cube mirrors $31y_1$ and $31y_2$ is arranged. And, from a pair of double-path interferometers, interferometer beams that are indicated as length measuring axes BI7Y and BI8Y in FIG. 12 are irradiated on the corner cube mirrors $31y_1$ and $31y_2$ and are returned to a reflection surface (not shown) on reticle base supporting bed 28 by corner cube mirrors $31y_1$ and $31y_2$. The beams reflected off the reflection surface then retrace their paths and are received by the double-path interferometers, and the relative displacement of corner cube mirrors $31y_1$ and $31y_2$ from their reference positions (reference position on the reflection surface of the reticle base supporting bed 28) is measured. Then, the measurement values of the double-path interferometers are supplied to stage controller 160 shown in FIG. 11, and based on the average value the position of reticle stage RST in the Y-axis direction is measured. The information on the position in the Y-axis direction is used for calculating the positional relation between reticle stage RST and wafer stage WST1 (or WST2) based on the measurement values of the interferometer on the wafer side having the length measuring axis BI3Y, and for synchronous control of the reticle and the wafer in the scanning direction (the Y-axis direction) on scanning exposure based on the above calculation.

As is described, in the second embodiment, a total of three interferometers, that is, the interferometer indicated as length measuring axis BI6X, and the pair of double-path interferometers indicated as length measuring axes BI7Y and BI8Y, make up a reticle laser interferometer 30, which is shown in FIG. 11.

Next, the interferometer system for controlling the position of wafer stages WST1 and WST2 will be described, referring to FIGS. 11 to 13.

As is shown in the drawings, along the X-axis that passes through the projection center of projection optical system PL and the detection center of the alignment detection systems 124*a* and 124*b*, on one end of the X-axis direction on a surface of wafer stage WST1, an interferometer beam from interferometer 116 in FIG. 11 indicated as length measuring beam BI1X is irradiated. Similarly, along the X-axis on a surface on the other end of the X-axis direction, an interferometer beam from interferometer 118 in FIG. 11 indicated as length measuring beam BI2X is irradiated. Then, by receiving the beams that are reflected off the above surfaces, interferometers 116 and 118 measure the relative displacement of each reflection surface from their reference position, so as to measure the position of wafer stages WST1 and WST2 in the X-axis direction.

As is shown in FIG. 12, interferometers 116 and 118 are a three-axis interferometer; each having three optical axes, and besides the measurement in the X-axis direction of wafer stages WST1 and WST2, tilt (rolling ($\theta y$ rotation)) measurement and yawing ($\theta z$ rotation) measurement are possible. In this case, the leveling drive mechanism (not shown), which finely drives wafer stages WST1 and WST2 in the Z-axis direction and drives inclination, is actually located below the reflection surfaces (120 to 123), therefore the drive amount when the inclination of wafer stage is controlled can be monitored by the interferometers 116 and 118.

The interferometer beams of length measuring axes BI1X and BI2X are each made to irradiate wafer stages WST1 and WST2 at all times in the entire movement range of wafer stages WST1 and WST2. Accordingly, regarding the X-axis direction, the position of wafer stages WST1 and WST2 is controlled based on the measurement values of length measuring axes BI1X and BI2X, on both exposure using projection optical system PL and while alignment detection systems 124*a* and 124*b* are being used.

Figure 13:
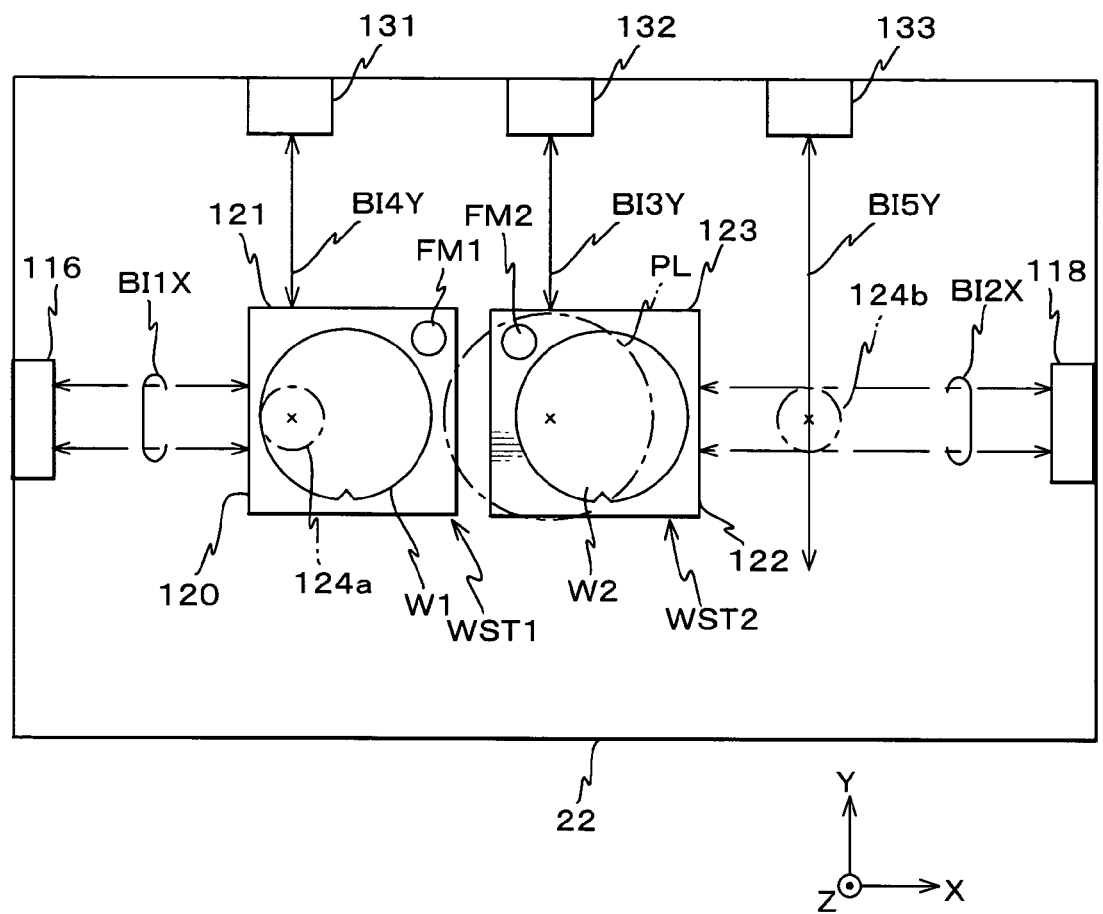
FIG. 13 is a schematic planar view showing a neighboring area of a supporting bed in the exposure apparatus in FIG. 11.

In addition, as is shown in FIGS. 12 and 13, an interferometer 132 that has a length measuring axis BI3Y, which intersects the X-axis at a right angle at the projection center (the optical axis AX) of projection optical system PL, and interferometers 131 and 133 that have length measuring axes BI4Y and BI5Y, respectively, intersecting the X-axis at a right angle at the detection center (optical axis SX) of alignment detection systems 124*a* and 124*b*, are provided.

In the embodiment, when measuring the position of wafer stages WST1 and WST2 in the Y-axis direction while exposure using projection optical system PL is being performed, the measurement values of interferometer 132 that has length measuring axis BI3Y passing through the projection center of projection optical system PL, that is optical axis AX, are used. And, when measuring the position of wafer stage WST1 in the Y-axis direction while alignment detection system 124*a* is being used, the measurement values of interferometer 131 that has length measuring axis BI4Y passing through the detection center of alignment detection system 124*a*, that is optical axis SX, are used. Also, when measuring the position of wafer stage WST2 in the Y-axis direction while alignment detection system 124*b* is being used, the measurement values of interferometer 133 that has length measuring axis BI5Y passing through the detection center of alignment detection system 124*b*, that is optical axis SX, are used.

Accordingly, depending on the use conditions, the length measuring axis of the interferometers in the Y-axis direction no longer irradiates the reflection surfaces of wafer stages WST1 and WST2, however, since at least one length measuring axis, that is, length measuring axes BI1X and BI2X do not fall outside the reflection surface of wafer stages WST1 and WST2, respectively, the interferometers of the Y side can be reset at an appropriate position when the optical axis of the interferometer to be used return to the reflection surface.

Interferometers 132, 131, and 135 used in the above Y measurement having length measuring axes BI3Y, BI4Y, and BI5Y are each a dual-axis interferometer having two length measuring axes, and besides the measurement of wafer stages WST1 and WST2 in the Y-axis direction, tilt (pitching ($\theta x$ rotation) can be measured. In the embodiment, the five interferometers, 116, 118, 131, 132, and 133 make up the interferometer system, which controls the two-dimensional coordinate position of wafer stages WST1 and WST2.

Furthermore, in main controller 190 shown in FIG. 11, a memory 191 is provided in which conditional expressions (such as interfering conditions) for controlling the movement of wafer stages WST1 and WST2 are stored.

In addition, in the second embodiment, as it will be described later on, while one of the wafer stages WST1 or WST2 is performing the exposure sequence, the other stage is performing sequences such as wafer exchange or wafer alignment. And, in order to keep both stages from interfering, stage controller 160 controls the movement of wafer stages WST1 and WST2 according to instructions from main controller 190 that are based on the output values of each interferometer.

The stage control system is structured with main controller 190 playing the main role and controlling the overall operation of the entire apparatus, and parts such as a dose controller 170 and stage controller 160 that operate under the control of main controller 190.

The operation on exposure of exposure apparatus 110 in the embodiment will now be described, focusing on the operation of each of the above parts making up the control system.

First of all, according to instructions from main controller 190, reticle R1 (or R2) and wafer W1 (or W2), that is, reticle stage RST and wafer stage WST1 (or WST2) begin to be synchronously scanned by stage controller 160 (scanning control). Stage controller 160 performs such synchronous scanning by controlling reticle drive portion 29 and the drive system of the wafer stage, while monitoring the measurement values of length measuring axis BI3Y and length measuring axis BI1X or BI2X of the interferometer system and those of length measuring axes BI7Y and BI8Y and length measuring axis BI6X of reticle laser interferometer 30.

And, when both stages reach the point of uniform velocity control within a predetermined permissible error, dose controller 170 makes light source 11 start pulse emission. With this operation, the illumination light from illumination optical system 18 irradiates the rectangular shaped illumination area IA (refer to FIG. 12) of reticle R1 (or R2) whose lower surface is chromium evaporated and patterned, and the image of the pattern in illumination area IA is reduced to 1/40 (or 185) by projection optical system PL and projected on wafer W1 (or W2) whose surface is coated with a photoresist, forming a reduced image (a partially inverted image) on the wafer. As is also obvious from FIG. 12, the slit width of illumination area IA is narrow compared to the pattern area on reticle R1 (or R2), and by synchronously scanning reticle R1 (or R2) and wafer W1 (or W2) as is described above, the images on the entire pattern surface are sequentially formed on the shot areas on the wafer.

At the same time as the above pulse emission, dose controller 170 drives vibration mirror 18D and continues such control in order to reduce variation in interference fringes generated in the two fly-eye lens system until the pattern area on reticle R1 (or R2) completely passes illumination area IA (refer to FIG. 12), that is, until the images on the entire pattern surface are formed in the shot areas on the wafer.

In addition, during the above scanning exposure, drive system 43 controls the drive of movable blind 18M in sync with the scanning of reticle R1 (or R2) and wafer W1 (or W2) so that the illumination light does not leak outside the light shielded area on reticle R1 (or R2) in the shot edge portion. Such synchronous operations are performed under the control of stage controller 160.

During the above scanning exposure, as is disclosed in the Japanese Patent Application Laid-open No. 10-163098 referred to earlier and the corresponding U.S. Pat. Nos. 6,400,441 and 6,341,007, main controller 190 or dose controller 170 performs a complete calculation on the variable amount of irradiation energy and oscillation frequency, and changes the irradiation energy and oscillation frequency by controlling the attenuation system provided in light source 11, as well as controls the shutter and vibration mirror, so that the total dose corresponds to the resist sensitivity.

Furthermore, in exposure apparatus 110 in the embodiment, a first carriage system in which wafer exchange is performed between wafer stage WST1 and a second carriage system in which wafer exchange is performed between wafer stage WST2 are provided.

Figure 14:
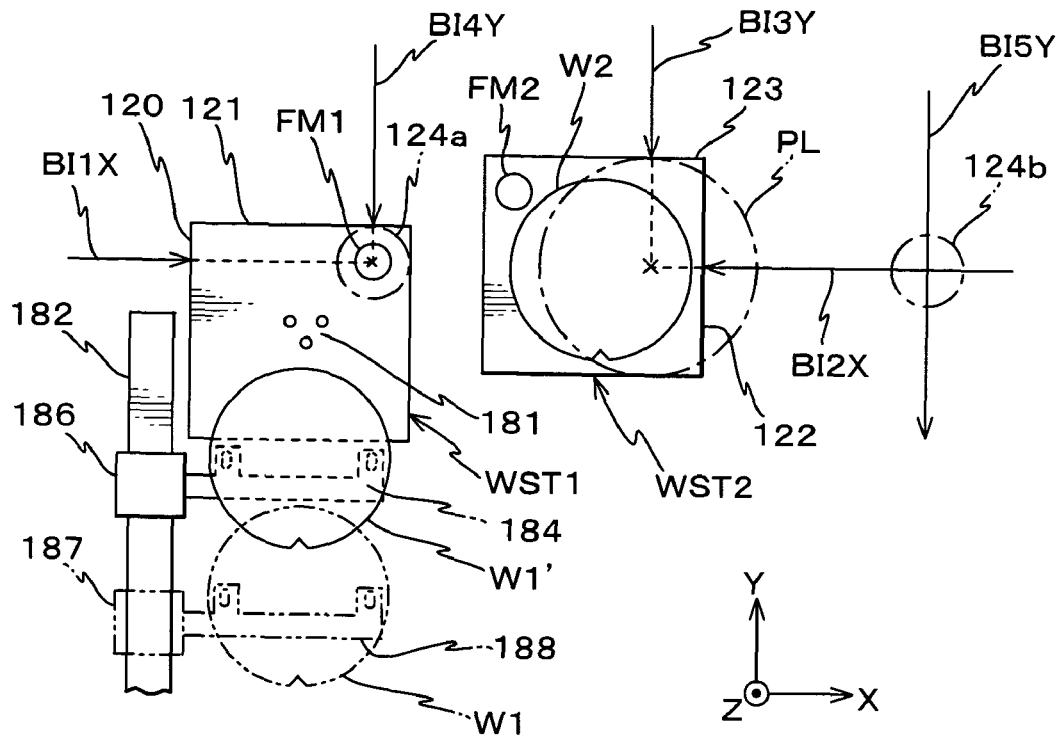
FIG. 14 is a planar view showing a state in which wafer exchange, alignment sequence, and exposure sequence are performed using two wafer stages.

As is shown in FIG. 14, the first carriage system performs wafer exchange with wafer stage WST1 at a wafer loading position on the left side in the manner described later in the description. The first carriage system is made up of a first wafer loader and a first center-up 181; the first wafer loader including parts such as a first loading guide 182 extending in the Y-axis direction, a first slider 186 and a second slider 187 that move along loading guide 182, a first unload arm 184 attached to the first slider 186, a first load arm 188 attached to the second slider 187, and the first center-up 181 consisting of three vertical moving members provided on wafer stage WST1.

Wafer exchange operation of the first carriage system will now be briefly described.

The case of wafer exchange will be described when a wafer W1' on wafer stage WST1 at the loading position on the left side and wafer W1 carried by the first wafer loader are exchanged.

First, main controller 190 turns off a switch (not shown) of the vacuum of the wafer holder (also not shown) on wafer stage WST1, and releases the suction of wafer W1'.

Next, main controller 190 drives center-up 181 upward by a predetermined amount via a center up drive system (not shown). With this operation, wafer W1' is driven upward to a predetermined position. In this state, main controller 190 instructs a wafer loader controller (not shown) to move the first unload arm 184. And, with this operation, the wafer loader controller controls the drive of the first slider 186 so that the first unload arm 184 moves along loading guide 182 until it is above wafer stage WST1 and is positioned below wafer W1'.

In this state, main controller 190 drives center-up 181 downward to a predetermined position. While the center-up is moving downward, wafer W1' is delivered to the first unload arm 184, therefore, main controller 190 instructs the wafer loader controller to start the vacuuming operation of the first unload arm 184. In this manner, the wafer W1' is held by suction by the first unload arm 184.

Next, main controller 190 instructs the wafer loader controller to withdraw the first unload arm 184 and to start moving the first load arm 188. With this operation, the first unload arm 184 starts to move in the −Y direction in FIG. 14 integrally with the first slider 186, and at the same time the wafer loader controller moves the second slider 187 integrally with the first load arm 188 holding wafer W1 in the +Y direction. Then, when the first load arm 188 comes to a position above wafer stage WST1, the wafer loader controller stops the movement of the second slider and releases the vacuuming operation of the first load arm 188.

In this state, main controller 190 drives center-up 181 upward, and wafer W1 is driven upward from below by center-up 181. Then, main controller 190 instructs the wafer loader controller to withdraw the load arm. With this operation, the wafer loader controller begins to withdraw the second slider 187 integrally with the first load arm 188 in the −Y direction. At the same timing as the wafer loader controller begins to withdraw the first load arm 188, main controller 190 begins to drive center-up 181 downward to mount wafer W1 on the wafer holder (not shown) on wafer stage WST1, and turns on the vacuum operation of the wafer holder. Thus, the series of sequences for wafer exchange is completed.

Figure 15:
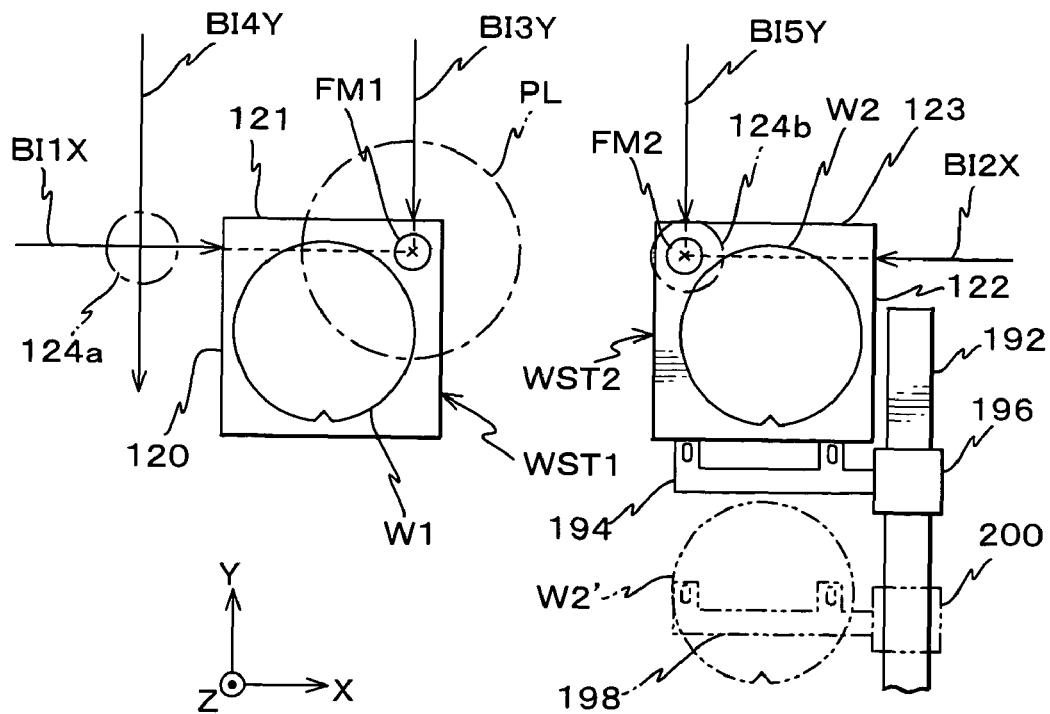
FIG. 15 is a view showing a state in which the alignment sequence and exposure sequence in FIG. 14 are switched.

Similarly, as is shown in FIG. 15, the second carriage system performs wafer exchange with wafer stage WST2 at a wafer loading position on the right side in a similar manner as is described above. The second carriage system is made up of a second wafer loader and a second center-up (not shown); the second wafer loader including parts such as a second loading guide 192 extending in the Y-axis direction, a third slider 196 and a fourth slider 200 that move along loading guide 182, a second unload arm 194 attached to the third slider 196, a second load arm 198 attached to the fourth slider 200, and the second center-up (not shown) provided on wafer stage WST2.

Next, an operation of wafer stages WST1 and WST2 performed in parallel will be described, based on FIGS. 14 and 15.

FIG. 14 shows a planar view of a state where wafer exchange is being performed between wafer stage WST1 and the first carriage system at the loading position on the left side, while the exposure operation on wafer W2 on wafer stage WST2 is being performed via projection optical system PL. In this case, on wafer stage WST1, following the wafer exchange, the alignment operation is performed in the manner described below. In FIG. 14, position control of wafer stage WST2 during the exposure operation is performed based on the measurement values of length measuring axes BI2X and BI3Y of the interferometer system, whereas position control of wafer stage WST1 during the wafer exchange and alignment operation is performed based on the measurement values of length measuring axes BI1X and BI4Y of the interferometer system.

At the loading position on the left side in FIG. 14, fiducial marks on fiducial mark plate FM1 on wafer stage WST1 can be positioned directly below alignment detection system 124a. Therefore, main controller 190 resets interferometer 131 length measuring axis BI4Y of the interferometer system prior to measuring the fiducial marks on fiducial mark plate FM1 with alignment detection system 124a.

Following the wafer exchange and the reset of interferometer 131, search alignment is performed. Search alignment, which is performed after wafer exchange, refers to pre-alignment performed over on wafer stage WST1, because the positional error is still large when performing pre-alignment only while wafer W1 is being carried. To be more specific, the position of three search alignment marks (not shown) formed on wafer W1 mounted on stage WST1 is measured using sensors such as the LSA system of alignment detection system 124a, and based the measurement results the position of wafer W1 in the X, Y, and θ direction is aligned. On search alignment, main controller 190 controls the operation of each part.

After search alignment is completed, wafer alignment based on the EGA method (fine alignment), in which the arrangement coordinates of each shot area on wafer W1 are obtained, is performed. To be more specific, alignment mark positions of predetermined sample shots on wafer W1 are measured with sensors such as the FIA system of alignment detection system 124a while wafer stage WST1 is being sequentially moved based on a designed shot arrangement data (alignment mark position data), while the position of wafer stage WST1 is being controlled by the interferometer system (length measuring axes BI1X and BI4Y), and based on the measurement results and the designed coordinate data of the shot arrangements, by statistical computing using the least squares method, the whole shot arrangement data is calculated. On EGA, main controller 190 controls the operation of each part, and main controller also performs the above calculation. The calculation results are preferably transformed into a coordinate system that uses the fiducial reference mark positions of fiducial mark plate FM1 as a reference.

In the embodiment, when alignment detection system 124a is performing measurement, the position of the alignment marks can be measured while the same auto-focus/auto-leveling as on exposure is being executed by the AF/AL mechanism performing measurement and control. This can prevent offset (error) caused by the attitude of the stage from occurring between alignment and exposure.

While the above wafer exchange and alignment operation is being performed on wafer WST1 side, on wafer WST2 side, double exposure is continuously performed based on the step-and-scan method while using the two reticles R1 and R2 changing the exposure conditions.

To be more specific, in the manner similar to that of the wafer W1 side described earlier, fine alignment based on the EGA method is performed in advance, and based on the shot arrangement data (using fiducial marks on fiducial mark plate FM2 as a reference) of the shots on wafer W2 obtained from the fine alignment, movement (stepping) operation in between shots of wafer W2 to the adjacent shot is sequentially performed, and the scanning exposure described earlier is performed sequentially on each shot area on wafer W2. When the above movement (stepping) operation in between shots is performed, the movement of wafer stage WST2 is controlled in a similar manner as is described in the first embodiment. In addition, also in the second embodiment, the configuration information (including the configuration information of control parameters) of various types necessary for synchronous control of the reticle stage and the wafer stage on exposing the shot areas on the wafer is transmitted from main controller 190 to stage controller 160 per each shot area, during the uniform velocity overscan period performed after exposure is completed on each shot area, or per each row during the movement operation in between different rows, as is described in the first embodiment. In this case, as well, all necessary information, with the exception of information from reticle interferometer 30, the laser interferometer system, and the AF/AL measurement mechanism that can be independently sampled at all times by stage controller 160, is to be transmitted from main controller 190 at the above timing, and the configuration information related to synchronous control is preferably made into a determinant converted to a state for ultimate high-speed processing, and then passed on to stage controller 160, in order to achieve high-speed processing. In addition, the stage control system 160 is to preferably complete the position setting of both stages according to the configuration information before the synchronous settling time of both stages prior to exposure on each of the shot areas, in order to reduce the synchronous settling time and to improve the throughput.

Such exposure is performed continuously on all the shot areas on wafer W2 in the manner described above, after the reticle is exchanged. To be more concrete on the exposure sequence of double exposure, for example, after scanning exposure is sequentially performed on each shot area on wafer W1 using reticle R2, reticle stage RST is moved by a predetermined amount in the scanning direction so as to position reticle R1 at the exposure position, and then scanning exposure is performed, in a reverse order to the above exposure. In this case, the exposure conditions (AF/AL, dose) and transmittance differ between reticle R2 and reticle R1, therefore their conditions need to be measured during reticle alignment, and the conditions need to be changed based on the results.

On double exposure of wafer W2, main controller 190 also controls the operation of each part.

When the exposure sequence and the wafer exchange/alignment sequence described above is performed in parallel on the two wafer stages WST1 and WST2 shown in FIG. 14, the wafer stage which completes its operation first moves into a waiting state. Then, when both stages complete their operations, wafer stages WST1 and WST2 are moved to positions shown in FIG. 15. Then, wafer W2 on wafer stage WST2 that has completed the exposure sequence is exchanged at the loading position on the right side, and wafer W1 on wafer stage WST1 that has completed the alignment sequence proceeds to the exposure sequence performed below projection optical system PL.

At the loading position on the right side shown in FIG. 15, likewise the loading position on the left side, the fiducial marks on fiducial mark plate FM2 are made to be positioned below alignment detection system 124b, and the wafer exchange and alignment sequence are performed. As a matter of course, the reset operation of the interferometer having length measuring axis BI5Y of the interferometer system is performed prior to the measurement of the fiducial marks on fiducial mark plate FM2 with alignment detection system 124b.

The reset operation of the interferometer performed by main controller 190 during the above series of parallel processing operations is the same as the details described in, the above Japanese Patent Application Laid-open No. 10-163098 and the corresponding U.S. Pat. Nos. 6,400,441 and 6,341,007.

As is described so far, in exposure apparatus 110 in the second embodiment, during the movement operation of wafer stages WST1 and WST2 in between shots performed in parallel with the movement operation of reticle stage RST in the scanning direction for performing exposure on each wafer, the movement of wafer stages WST1 and WST2 are controlled in a similar manner as is described in the first embodiment, therefore, the movement time of wafer stages WST1 and WST2 in between shots can be reduced, and double exposure with high throughput can be achieved. This is because, as is disclosed in, for example, the Japanese Patent Application Laid-open No. 10-163098 and the corresponding U.S. Pat. Nos. 6,400,441 and 6,341,007, in an exposure apparatus that comprises a double wafer stage when for example, each processing time is expressed as T1 (wafer exchange time), T2 (search alignment time), T3 (fine alignment time), and T4 (exposure time per exposure), and double exposure is performed with T1, T2, and T3 with T4 being processed in parallel on an 8 inch wafer, the exposure time is longer, which makes it a constraining condition when determining the overall throughput. In the second embodiment, however, because the movement time of wafer stages WST1 and WST2 in between shots is reduced, the exposure time T4 can be shortened.

In the second embodiment, when performing double exposure using a plurality of reticles R1 and R2, high resolution and DOF (depth of focus) can be improved. In addition, in the second embodiment, because exposure operation on one stage and the alignment/wafer exchange operation on the other stage are performed in parallel at the same time, the throughput can be greatly improved, which produces an improvement effect on high resolution and DOF, without reducing the throughput.

As a matter of course, in exposure apparatus 110 in the second embodiment, when normal exposure is performed instead of a double exposure, other than the same effects that can be obtained as is described in the first embodiment, due to the simultaneous parallel processing on the two wafer stages, the throughput can be further improved.

In the second embodiment, when parallel processing of different operations using two wafer stages WST1 and WST2 is performed at the same time, the operation performed on one stage may affect (disturb) the operation of the other stage. In such a case, a timing adjustment of the operation performed on the two stages WST1 and WST2 is preferably performed, like the adjustment disclosed in the above Japanese Patent Application Laid-open No. 10-163098, described referring to FIGS. 11 to 13 in the disclosure. For example, the acceleration/deceleration timing between the two wafer stages can be adjusted so that when for example, scanning exposure is performed on a wafer on one stage, then alignment measurement operation is performed on the other stage. In such a case, operations that do not affect (or have only a small influence on) the other stage are performed in parallel on both stages.

Although the description below may seem out of sequence, in exposure apparatus 110 in the second embodiment, a devisal described below is made in order to prevent collision between wafer stages WST1 and WST2.

That is, when control information per row or per wafer is transmitted from main controller 190 to stage controller 160, the information transmitted includes information related to errors of each mechanism on stage movement (information for error detection, or for countermeasures for such errors) or for example, estimated position coordinates of both stages. Therefore, during the above parallel processing operation, when some kind of an error occurs in the wafer stage on which alignment is being performed so that it stops within the moving range of the other wafer stage on which exposure is being performed, stage controller 160 can bring the other stage to an emergency stop when the distance between both stages falls within a predetermined distance so as to prevent collision between both stages.

In the above second embodiment, the case has been described where the stage device related to the present invention is applied to an apparatus that performs exposure of a wafer using the double exposure method, however, the present invention can also be applied to stitching, which is a similar technique. In this case, while exposure is being performed twice on one wafer stage side using two reticles, on the other stage that can be moved independently, wafer exchange and wafer alignment are performed in parallel, which results in a higher throughput than the stitching with a typical exposure apparatus.

However, the scope of application of the stage device related to the present invention is not limited to this, and the present invention can also be suitably applied to an exposure using a single exposure method.

In addition, in the above second embodiment, the case has been described where alignment and wafer exchange operations, and exposure operation are performed in parallel, however, the present invention is not limited to this, and for example, sequences such as base line check (BCHK) and calibration performed each time the wafer is exchanged may also be similarly performed in parallel with the exposure operation.

In each of the above embodiments, the case has been described where ultraviolet light that has a wavelength exceeding 100 nm, or to be more specific, a KrF excimer laser beam, an ArF excimer laser beam, or an $F_2$ laser beam (wavelength: 157 nm), is used as the exposure illumination light. The present invention, however, is not limited to this, and for example, a far ultraviolet (DUV) light such as a g-line or an i-line that belongs to the same far ultraviolet region as the KrF excimer laser can also be used. And, a harmonic wave of a YAG laser may also be used.

Furthermore, a harmonic wave may be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Incidentally, as a single-wavelength oscillation laser, for example, an ytteribium-doped fiber laser can be used.

In the exposure apparatus in each of the above embodiments, not only can the light having a wavelength exceeding 100 nm be used as the exposure illumination light, but also as a matter of course, light that has a wavelength less than 100 nm may be used. For example, in recent years, in order to exposure a pattern less than 70 nm, an EUV exposure apparatus that uses an SOR or a plasma laser as a light source to generate EUV (Extreme Ultraviolet) light in the soft X-ray region (for example, wavelength range of 5 to 15 nm), an all reflection reduction optical system designed under such wavelength (for example, 13.5 nm), and a reflection type mask is being developed. In this apparatus, a structure may be employed in which scanning exposure is performed by synchronously scanning a mask and a wafer using an arc illumination, therefore, this apparatus is also within the scope of application of the present invention.

In addition, the present invention can also be suitably applied to an exposure apparatus that uses charged particle beams such as electron beams or ion beams. For example, as an electron beam exposure apparatus, an exposure apparatus based on a mask projection method can be used. In such an apparatus, for example a circuit pattern is fragmented into a large number of isolated sub-fields around 250 nm squares on the mask, and while an electron beam is sequentially shifted in a first direction on the mask, the wafer is also relatively moved with respect to the electron optical system, which reduces and projects the fragmented pattern, in sync with the mask moving in a second direction perpendicular with the first direction. And by such operations, the reduced images of the fragmented patterns are pieced together on the wafer so as to form a synthetic pattern.

In each of the above embodiments, the case has been described where the present invention is applied to a reduction projection exposure apparatus (a scanning stepper) based on a step-and-scan method. The present invention, however, can be suitably applied also to, for example, a mirror projection aligner, or an exposure apparatus based on a proximity method (for example, a scanning type X-ray exposure apparatus that has a mask and a wafer relatively moving integrally with respect to an arc-shaped illumination area on which an X-ray is irradiated).

In addition, the projection optical system used is not limited to a reduction system, and an equal magnification system, or a magnification system (for example, an exposure apparatus for manufacturing liquid crystal displays or the like) may be used. Furthermore, the projection system may be a refraction system, a reflection system, or a catadioptric system. The glass material and coating material that can be used for the optical elements (especially the refraction elements) depend on the wavelength of the exposure illumination light, and also the maximum diameter that can be produced differs depending on the glass material. Therefore, the selection of whether to use a refraction system, a reflection system, or a catadioptric system will naturally be made by taking into account the exposure wavelength determined from the specification of the exposure apparatus and the wavelength width (spectral line half width), the field size and the numerical aperture of the projection optical system, and the like.

In general, when the exposure wavelength is around 190 nm or more, synthetic quartz and fluorite can be used as the glass material, therefore, in this case, not only can the reflection system and the catadioptric system be used, but the refraction system can also be used without much difficulty. In addition, when vacuum ultraviolet light having a wavelength of around 200 nm or under is used, the refraction system may be used depending on the narrowbanded wavelength width, however, when the wavelength is around 190 nm or under, because fluorite is the only suitable glass material and narrowbanding the wavelength becomes difficult, employing the reflection system or the catadioptric system is advantageous. Furthermore, when EUV light is used, a reflection system consisting of a plurality of (for example, around three to six) reflection elements only is employed. In the case of an electron beam exposure apparatus, an electron optical system is used made up of an electron lens and a deflector. In addition, when light in the vacuum ultraviolet region is used as the exposure illumination light, the optical path is to be filled with gases that reduce the attenuation (for example, inert gas such as nitrogen or helium) of the exposure illumination light, or the optical path is to be in vacuum, whereas, when EUV light or an electron beam is used, the optical path is to be in vacuum.

Furthermore, the present invention may be widely applied to an exposure apparatus for manufacturing crystal displays used to transfer crystal display device patterns onto a square-shaped glass plate, and an exposure apparatus for manufacturing display devices such as a plasma display or an organic EL display, a thin film magnetic head, a pick-up device (such as a CCD), a micromachine, a DNA chip, or the like, and moreover, to an exposure apparatus used for manufacturing masks and reticles. In addition, the present invention can also be suitably applied to an exposure apparatus used not only for manufacturing semiconductor devices such as a microdevice, but also to an exposure apparatus which transfers a circuit pattern onto a glass substrate or a silicon wafer when manufacturing reticles and masks that are used in an optical exposure apparatus, an EUV exposure apparatus, an X-ray exposure apparatus based on a proximity method, and an electron beam exposure apparatus, or the like. Normally, in an exposure apparatus that uses DUV (deep ultraviolet) light or VUV (vacuum ultraviolet) light uses a transmittance type reticle, and as the reticle substrate, materials such as silica glass, fluorine-doped silica glass, fluorite, or crystal are used. In addition, in an EUV exposure apparatus, a reflection type mask is used, whereas in an X-ray exposure apparatus based on a proximity method or in an electron beam exposure apparatus based on a mask projection method, a transmittance type mask (stencil mask and a membrane mask) is used, and as the mask substrate, silicon wafer or the like is used.

In addition, the stage device related to the present invention is applied not only to a lithographic apparatus that include the above mentioned exposure apparatus used in the manufacturing process of microdevices such as semiconductor devices, but also can be suitably applied to a laser repair system, or an inspection system. Furthermore, the present invention can be applied to equipment other than the various types of equipment used in the manufacturing process of microdevices.

<<Device Manufacturing Method>>

Details on the device manufacturing method when using the exposure apparatus described in each of the above embodiment in a lithographic process are described next.

Figure 16:
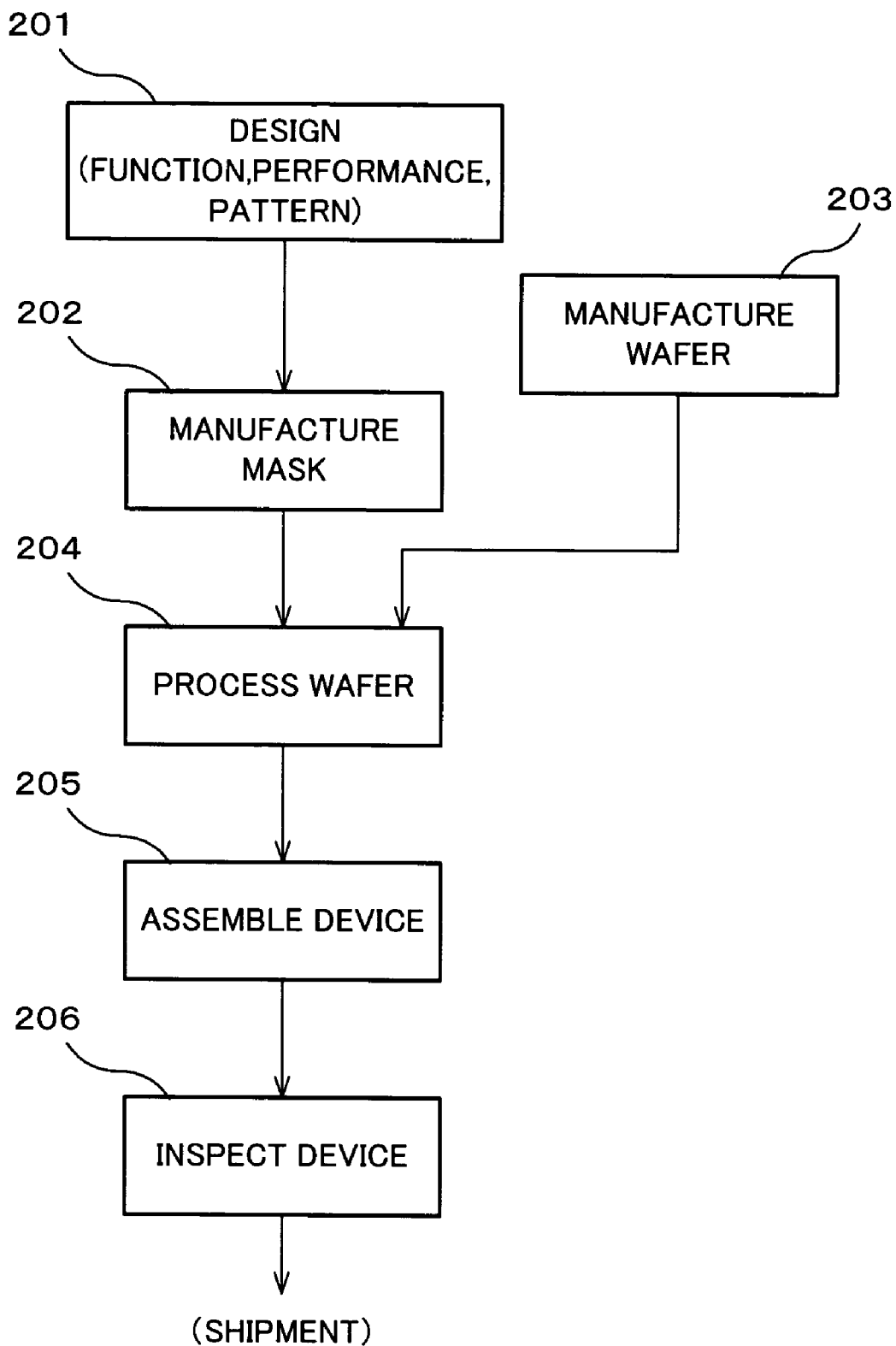
FIG. 16 ; is a flow chart for explaining an embodiment of a device manufacturing method according to the present invention.

FIG. 16 is a flow chart showing an example of manufacturing a device (a semiconductor chip such as an IC or an LSI, a liquid crystal panel, a CCD, a thin magnetic head, a micromachine, or the like). As shown in FIG. 16, in step 201 (design step), function/performance is designed for a device (e.g., circuit design for a semiconductor device) and a pattern to implement the function is designed. In step 202 (mask manufacturing step), a mask on which the designed circuit pattern is formed is manufactured, whereas, in step 203 (wafer manufacturing step), a wafer is manufacturing by using a silicon material or the like.

In step 204 (wafer processing step), an actual circuit and the like is formed on the wafer by lithography or the like using the mask and wafer prepared in steps 201 to 203, as will be described later. Next, in step 205 (device assembly step) a device is assembled using the wafer processed in step 204. The step 205 includes processes such as dicing, bonding, and packaging (chip encapsulation), as necessary.

Finally, in step 206 (inspection step), tests on operation, durability, and the like are performed on the device processed in step 205. After these steps, the device is completed and shipped out.

Figure 17:
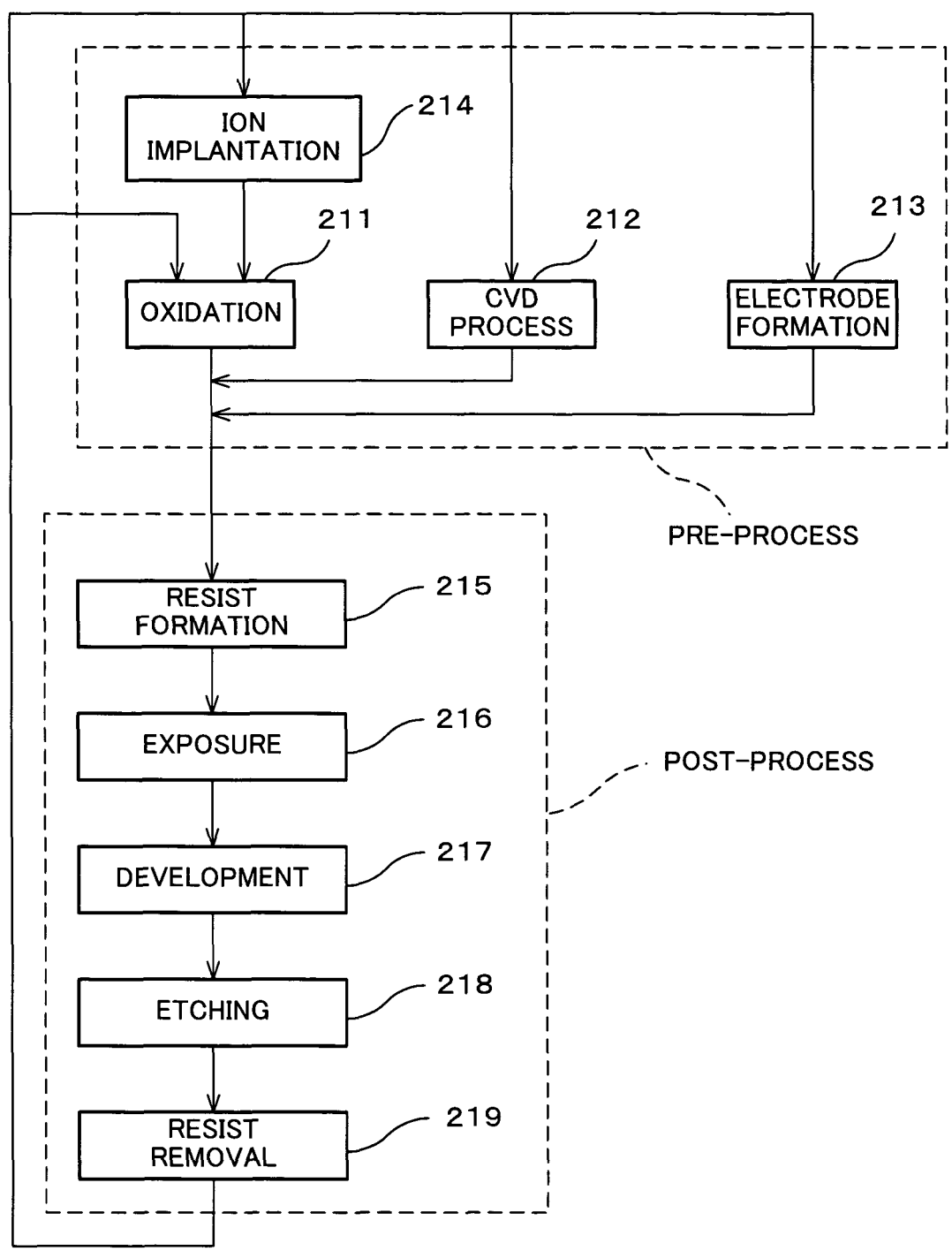
FIG. 17 is a flow chart for showing a process in step 204 in FIG. 16.

FIG. 17 is a flow chart showing a detailed example of step 204 described above in manufacturing the semiconductor device. Referring to FIG. 17, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above make up a pre-process for the respective steps in the wafer process, and are selectively executed depending on the processing required in the respective steps.

When the above pre-process is completed in the respective steps in the wafer process, a post-process is executed in the following manner. In this post-process, first, in step 215 (resist formation step), the wafer is coated with a photosensitive agent. Next, in step 216 (exposure step), the circuit pattern on the mask is transferred onto the wafer by the exposure apparatus and the exposure method described above. And, in step 217 (development step), the wafer that has been exposed is developed. Then, in step 218 (etching step), an exposed member of an area other than the area where the resist remains is removed by etching. Finally, in step 219 (resist removing step), when etching is completed, the resist that is no longer necessary is removed.

By repeatedly performing these pre-process and post-process steps, multiple circuit patterns are formed on the wafer.

When using the device manufacturing method described so far in the embodiments, since the exposure apparatus described in each of the above embodiments are used in the exposure process (step 216), the pattern of the reticle can be transferred onto each shot area on the wafer with high throughput. As a consequence, the productivity (including yield) of high integration devices can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that sequentially transfers a pattern of a mask onto a plurality of divided areas on an object by synchronously moving said mask and said object in a predetermined scanning direction, said exposure apparatus comprising:
a mask stage that holds said mask and is movable in at least said scanning direction;
an object stage that holds said object and is movable in a two-dimensional plane; and
a stage control system that controls both said mask and said object stages, said stage control system controlling both stages based on instruction values according to a jerk curve, which is an inverse curve of polarized symbols, when a preliminary operation where said both stages are accelerated after deceleration in said scanning direction is performed in between divided areas in the same row in a non-scanning direction perpendicular to said scanning direction, the jerk curve including an interval where jerk is zero provided in between a jerk curve convex to a plus side and a jerk curve convex to a minus side.

2. The exposure apparatus of claim 1 wherein said jerk curve is an inverse curve of polarized symbols having different shapes.

3. The exposure apparatus of claim 2 wherein said stage control system sets a post-settling period where said both stages are moved in uniform velocity in said scanning direction after exposure is completed on a divided area until said deceleration begins, longer than a synchronous settling period of said both stages prior to exposure, and also sets a peak of said jerk curve after completing exposure of a divided area larger than a peak of said jerk curve prior to exposure.

4. The exposure apparatus of claim 1 wherein said jerk curve is an inverse curve of polarized symbols having the same shape.

5. The exposure apparatus of claim 1 wherein
said stage control system controls said object stage based on instruction values according to a jerk curve, which is a quadrupoled jerk curve, when a movement operation of said both stages in said scanning direction is performed in between divided areas of different rows in said non-scanning direction.

6. The exposure apparatus of claim 5 wherein said quadrupoled jerk curve has at least two poles that are shaped differently.

7. The exposure apparatus of claim 1 wherein
said stage control system performs a movement operation in between divided areas where said object stage is moved in said non-scanning direction based on instruction values according to a jerk curve, which is a quadrupoled jerk having at least two poles that are shaped differently, in parallel with said preliminary operation of said both stages in said scanning direction in between said divided areas.

8. The exposure apparatus of claim 1 wherein
said stage control system controls said both stages so that after exposure of a divided area on said object is completed, a preliminary operation where both stages are accelerated in said scanning direction after deceleration and a movement operation in between divided areas where said object stage is moved in a non-scanning direction perpendicular to said scanning direction are simultaneously performed in parallel for exposure on the next divided area, and said movement operation of said object stage in said non-scanning direction is completed before a synchronous settling period of said both stages prior to exposure on said next divided area.

9. A device manufacturing method including a lithographic process, wherein in said lithographic process exposure is performed using said exposure apparatus of claim 1.

10. An exposure apparatus that sequentially transfers a pattern of a mask onto a plurality of divided areas on an object by synchronously moving said mask and said object in a predetermined scanning direction, said exposure apparatus comprising:
a mask stage that holds said mask and is movable in at least said scanning direction;
two object stages that each hold said object and are movable independently in a two-dimensional plane; and a stage control system that controls said mask stage and said object stages when a predetermined operation is performed on one object stage of said object stages and exposure is performed in parallel on a plurality of divided areas on an object held on the other object stage, said stage control system controlling said mask stage and said other object stage based on instruction values according to a jerk curve, which is an inverse curve of polarized symbols, when a preliminary operation where said mask stage and said other object stage are accelerated after deceleration in said scanning direction is performed in between divided areas in the same row in a non-scanning direction perpendicular to said scanning direction, the jerk curve including an interval where jerk is zero provided in between a jerk curve convex to a plus side and a jerk curve convex to a minus side.

11. The exposure apparatus of claim 10 wherein said stage control system controls said other object stage based on instruction values according to a jerk curve, which is a quadrupoled jerk curve, when a movement operation of said mask stage and said other object stage in said scanning direction is performed in between divided areas of different rows in said non-scanning direction.

12. The exposure apparatus of claim 10 wherein said stage control system performs a movement operation in between divided areas where said other object stage is moved in said non-scanning direction based on instruction values according to a jerk curve, which is quadrupoled jerk having at least two poles that are shaped differently, in parallel with said preliminary operation of said mask stage and said other object stage in said scanning direction in between said divided areas.

13. The exposure apparatus of claim 10, further comprising:
a mark detection system that detects marks formed on said object, whereby
said predetermined process includes a mark detection process of detecting marks formed on an object mounted on said one object stage with said mark detection system.

14. A device manufacturing method including a lithographic process, wherein in said lithographic process exposure is performed using said exposure apparatus of claim 10.

* * * * *